(12) United States Patent
Gross et al.

(10) Patent No.: US 6,553,334 B2
(45) Date of Patent: Apr. 22, 2003

(54) SYSTEM FOR SURVEILLANCE OF SPECTRAL SIGNALS

(75) Inventors: Kenneth C. Gross, Bolingbrook, IL (US); Stephan Wegerich, Glendale Heights, IL (US); Cynthia Criss-Puszkiewicz, Reno, NV (US); Alan D. Wilks, Mount Prospect, IL (US)

(73) Assignee: Arch Development Corp., Chicago, IL (US)

( * ) Notice: Subject to any disclaimer, the term of this patent is extended or adjusted under 35 U.S.C. 154(b) by 0 days.

(21) Appl. No.: 09/858,786

(22) Filed: May 16, 2001

(65) Prior Publication Data

US 2002/0042692 A1 Apr. 11, 2002

Related U.S. Application Data

(63) Continuation of application No. 08/970,873, filed on Nov. 14, 1997, now Pat. No. 6,240,372.

(51) Int. Cl.[7] ................................................ G06F 7/00
(52) U.S. Cl. ........................ 702/183; 702/76; 702/126; 702/179
(58) Field of Search ................................. 702/179–185, 702/71, 113, 116, 75–77, 124, 126, 189, 190, 198, 60–62, 155, FOR 103, FOR 104, FOR 107, FOR 108, FOR 135, FOR 111–FOR 114, FOR 134, FOR 139, FOR 145, FOR 168, FOR 170, FOR 171; 324/76.19, 76.21, 76.22; 706/914, 915, 906, 907, 904, 912; 340/506, 514, 516, 517, 524, 525, 540, 286.01, 825.36; 700/51, 79, 80, 83, 286–290; 376/215–217

(56) References Cited

U.S. PATENT DOCUMENTS

| | | | | | |
|---|---|---|---|---|---|
| 5,323,337 | A | * | 6/1994 | Wilson et al. | 702/77 |
| 5,410,492 | A | * | 4/1995 | Gross et al. | 376/215 |
| 5,774,379 | A | * | 6/1998 | Gross et al. | 702/71 |
| 5,790,413 | A | * | 8/1998 | Bartusiak et al. | 702/77 |
| 5,999,894 | A | * | 12/1999 | Mederer et al. | 702/182 |

* cited by examiner

Primary Examiner—Hal Wachsman
(74) Attorney, Agent, or Firm—Michael D. Rechtin; Foley & Lardner

(57) ABSTRACT

A method and system for monitoring at least one of a system, a process and a data source. A method and system have been developed for carrying out surveillance, testing and modification of an ongoing process or other source of data, such as a spectroscopic examination. A signal from the system under surveillance is collected and compared with a reference signal, a frequency domain transformation carried out for the system signal and reference signal, a frequency domain difference function established. The process is then repeated until a full range of data is accumulated over the time domain and a Sequential Probability Ratio Test methodology applied to determine a three-dimensional surface plot characteristic of the operating state of the system under surveillance.

12 Claims, 60 Drawing Sheets

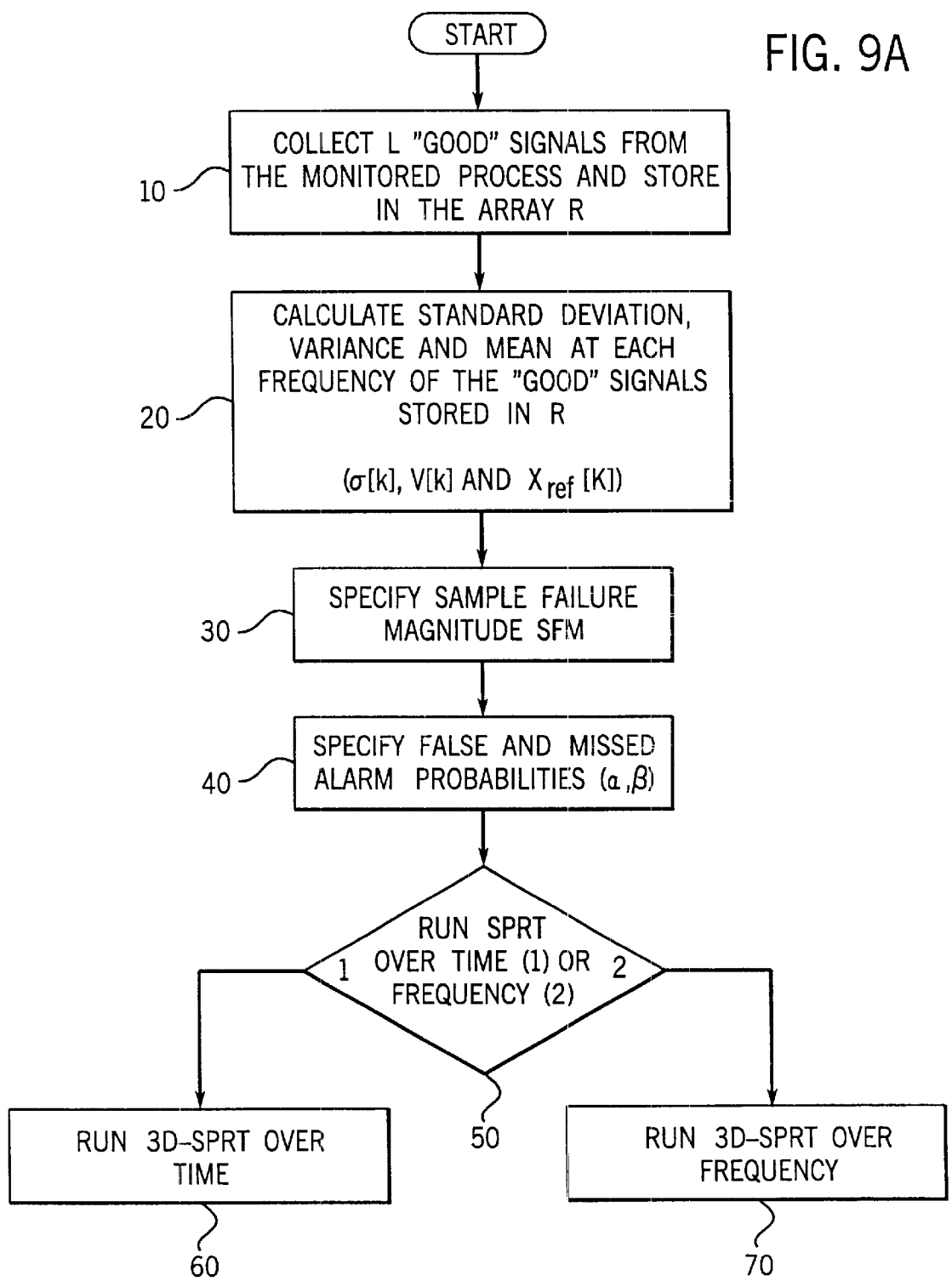

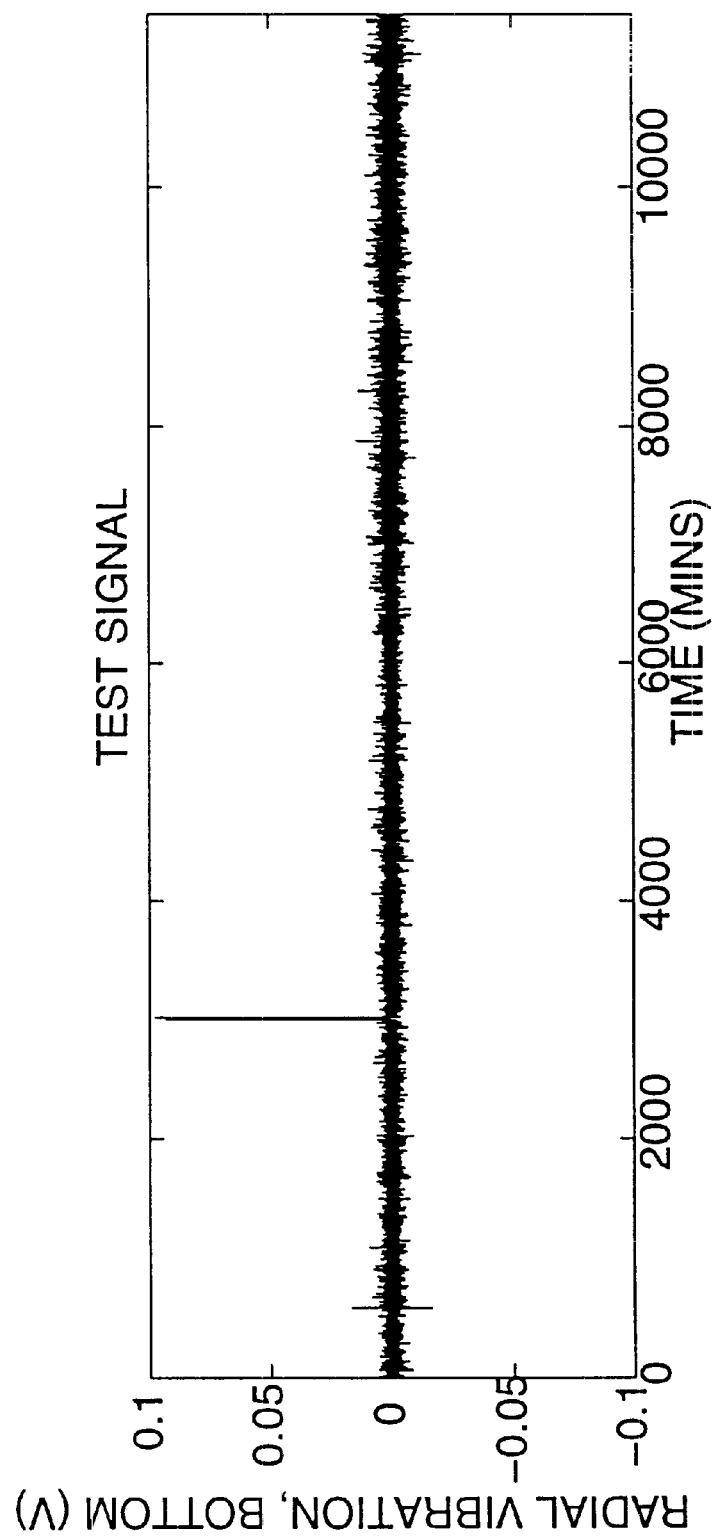

SYSTEM FOR SURVEILLANCE OF SPECTRAL SIGNALS

This is a continuation application to U.S. Ser. No. 08/970,873 filed Nov. 14, 1997 (now U.S. Pat. No. 6,240,372).

The U.S. Government has rights in this invention pursuant to Contract W-31-109-ENG-38 between the U.S. Department of Energy and the University of Chicago.

The present invention is concerned generally with a system and method for monitoring processes and systems producing any type of spectra as well as ones having signals with periodic components. More particularly, the invention is concerned with a system and method for combining a sensitive probabilistic methodology operating in the time domain with an analysis of signals in a parametric space to provide a three-dimensional surface plot enabling sensitive monitoring for onset of subtle disturbances in signal spectra. Such a process and system permits analysis of deviations from normal operation or identification of a particular classification or trend of signal behavior.

BACKGROUND OF THE INVENTION

Conventional parameter-surveillance schemes are sensitive only to gross changes in the mean value of a process, or to large steps or spikes that exceed some threshold limit check. These conventional methods suffer from either large numbers of false alarms (if thresholds are set too close to normal operating levels) or a large number of missed (or delayed) alarms (if the thresholds are set too expansively). Moreover, most conventional methods cannot perceive the onset of a process disturbance or sensor deviation which gives rise to a signal below the threshold level for an alarm condition.

In other prior art surveillance systems, the periodic components of signals from equipment or processes are monitored using Fourier analysis (most commonly as implemented in the Fast Fourier Transform, or "FFT"). The FFT produces a power spectral density ("PSD") function for a signal that exhibits peaks at frequencies associated with periodic phenomena. By watching the amplitude of these peaks, or by watching for changes in the frequencies associated with these peaks, it is possible in many cases to infer diagnostic information related to the health of the system being monitored. Some drawbacks of these conventional systems that are based on examination of PSDs include: (1) most conventional systems rely on a human to examine the PSD spectra to look for changes in the abscissa or ordinate of peaks of interest; and (2) if one tries to automate the surveillance of PSD information by assigning thresholds for the amplitudes of various peaks of interest, then one encounters the conventional problem of false and missed alarms. That is, if one sets the thresholds at low values, it is possible to trip alarms from minor idiosyncrasies in the signals that may have no safety or operational significance whatsoever. If one tries to avoid this problem by setting the thresholds further apart, then the degradation in the equipment or process can be much worse.

In another conventional monitoring method, the Sequential Probability Ratio Test ("SPRT") has found wide application as a signal validation tool in the nuclear reactor industry. Two features of the SPRT technique make it attractive for parameter surveillance and fault detection: (1) early annunciation of the onset of a disturbance in noisy process variable, and (2) the SPRT technique has user-specifiable false-alarm and missed-alarm probabilities. One important drawback of the SPRT technique that has limited its adaptation to a broader range of applications is the fact that its mathematical formalism is founded upon an assumption that the signals it is monitoring are purely Gaussian, independent (white noise) random variables.

It is therefore an object of the invention to provide an improved apparatus and method for monitoring the condition of a system characterized by periodic signals and/or a source of data for the signals.

It is also an object of the invention to provide a novel apparatus and method for continuous evaluation and interactive modification of a system.

It is a further object of the invention to provide an improved system and method for identifying a deviation from normalcy of a system generating substantially periodic signals.

It is an additional object of the invention to provide a novel system and method for characterizing the class of signal behavior.

It is yet another object of the invention to provide an improved system and method which combines a probabilistic analysis of periodic signals in time space with frequency spectra to produce a three-dimensional characteristic plot enabling sensitive analysis of the signals.

It is a further object of the invention to provide a novel apparatus and method which analyzes periodic signals using a sequential probability ratio test and Fourier transformed spectra (or other types of spectra) to produce a three-dimensional surface indicative of the state of the underlying system producing the signals.

It is yet an additional object of the invention to provide an improved apparatus and method which combines time domain and frequency domain analysis of periodic signals to produce a three-dimensional classification surface characteristic of the operating state of a system.

It is also an additional object of the invention to provide a novel apparatus and method for combining probabilistic analysis of periodic signals with frequency domain analysis of signals to identify deviations from a desired behavior of a system or of the sensors sensing the signals or other source providing the signals.

It is in addition another object of the invention to provide an improved apparatus and method for processing periodic signal databases using a combined time and frequency domain analysis.

It is also a further object of the invention to provide a novel apparatus and method for removing statistically certain noise signals from a periodic signal after combining time domain information with a frequency domain transformation of the information to enable sensitive signal analysis.

It is yet another object of the invention to provide an improved apparatus and method to operate on a substantially periodic signal (or other different types of spectra) to remove unwanted serial correlation noise after combining reduced time data with frequency domain data (or spectral data with frequency data) to enhance sensitivity to deviations from desired behavior or to classify or establish a trend of the underlying system.

It is still another object of the invention to provide a novel apparatus and method for applying a pattern recognition methodology to a power spectral density ("PSD") function incrementally taken over a plurality of time windows to yield a three-dimensional surface function characteristic of the operating state of a system or the source of signals from the system.

Other objects, features and advantages of the present invention will be readily apparent form the following description of the preferred embodiments thereof, taken in conjunction with the accompanying drawings described below.

BRIEF DESCRIPTION OF THE DRAWINGS

FIGS. 9A and 9B illustrate a functional block flow diagram of a combined probabilistic time domain analysis and frequency domain analysis;

FIG. 21A illustrates a test signal of FIG. 16A with an imposed impulse disturbance.

DETAILED DESCRIPTION OF PREFERRED EMBODIMENTS

Figure 9B:
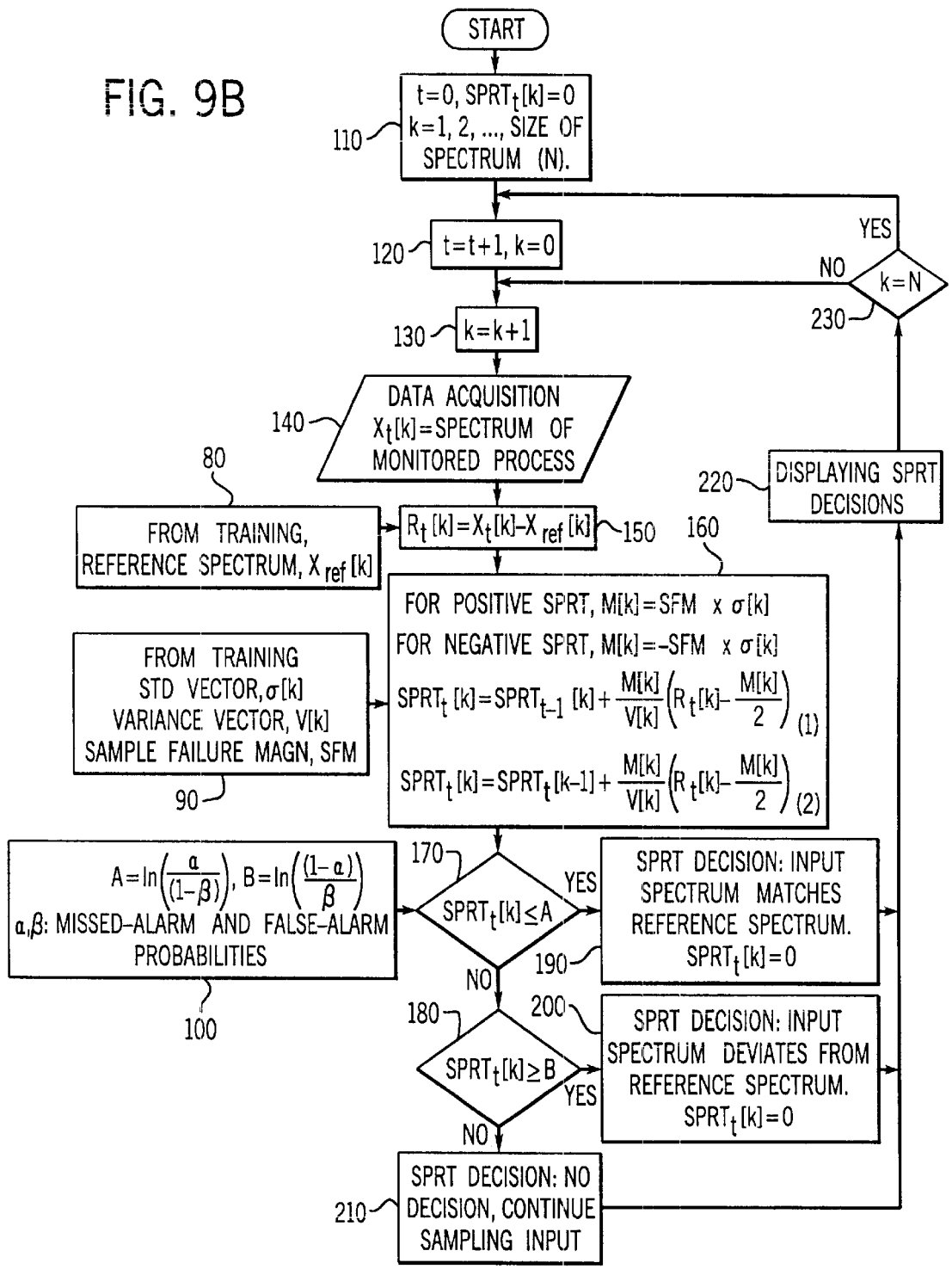

A system and method of the invention are illustrated in the figures with a detailed flow diagram of preferred embodiments shown in FIGS. 9A and 9B. In a preferred form of the invention, a time domain spectrum of signals is being analyzed, or validating an already existing data stream, which can be processed by a probabilistic methodology and then combined with a frequency domain transformation, such as by Fourier transformation, to generate a three-dimensional surface plot characteristic of the operating state of an underlying system or of a source of signals.

In a most preferred embodiment, the probabilistic method utilized to the sequential probability ratio test (SPRT) which in this invention can operate either in the time domain or the frequency domain. This methodology is set forth in great detail hereinafter. The SPRT methodology is applied to a power spectral density (PSD) function (or to the real and imaginary parts of the complex Fourier transform) created by performing a frequency domain transform (preferably a Fourier transform) of a time varying signal being monitored or analyzed. Therefore, SPRT is applied at incremental times (or frequencies) to the incoming signals to generate a three-dimensional SPRT surface plot having variable variance level as a function of frequency and time. In one method of the invention in FIGS 9A and 9B the procedure can be sequentially repeated at different time intervals creating a sequence of Fourier transform spectra. This procedure is set forth in detail in FIGS. 9A and 9B.

In FIG. 9A is illustrated the initialization or setup stage of a system and method of the invention. When the system is started initially in step 10, the matrix R is constructed with R containing L "good" signals (or spectra) from the system (signals or data source) which is being monitored. Here L should be a number that would result in a good statistical measure of the variability of what would be considered a "good" signal (or spectrum). In the next step 20 the standard deviation, variance and mean vectors are calculated using the data stored in R. These parameters are all calculated for each frequency sampled in the good signals. So if each signal had N samples, then the standard deviation, variance and mean would all be vectors of length N containing different values for each of the N discrete frequencies. It is also not necessary to have signals that are dependent on frequency only. Frequency is only used as a preferred embodiment and virtually any other related parameter can be used.

The sample failure magnitude (SFM) and false and missed alarm probabilities ($\alpha$, $\beta$) shown in steps 30 and 40 in FIG. 9A are specified by the user of the system. The last step 50 in the setup procedure is for the user to choose to run the SPRT over frequency or over time. If the user selects to apply the SPRT in the time direction, equation 1 of FIG. 9B is used in step 160. If the user elects to apply the SPRT method in the frequency direction, equation 2 of FIG. 9B is used in step 160. After the last step of FIG. 9A is completed, the steps in FIG. 9B are followed when running the SPRT to monitor a process or source of data.

The first step 110 in FIG. 9B taken when running the SPRT system is to initialize to zero the SPRT index along with the time (t) and frequency (k) counters. Next, in step 140 the signal or spectrum sample $X_t[k]$ at the current values of t and k is extracted. In step 80 the mean signal $X_{ref}[k]$ at frequency number k is then subtracted in step 150 from the sample value to produce the residual signal $R_t[k]$ at the current time and frequency.

The statistical parameters found in the SPRT setup phase of step 90 are used to calculate the failure magnitude M[k] at each frequency. The SPRT index is then calculated in step 160 using equation 1 or 2 of FIG. 9B depending on the choice made in step 50 of FIG. 9A.

The SPRT thresholds set from step 100 are now used in steps 170 and 180 to determine if the SPRT index has made a decision at the current values of t and k. If the SPRT index has not made a decision then steps 170 and 180 will both output "no" decisions and will lead to step 210 which tells the SPRT system that there is no decision and that the sampling should continue. If the SPRT index crosses threshold A, then step 170 will output "yes" and will lead to step 190 which tells the SPRT system that the input signal matches the reference (or mean) spectrum at the current time and frequency counter values. If the SPRT index crosses threshold B, then step 180 will output "yes" and will lead to step 200 which tells the SPRT system that the input signal deviates from the reference (or mean) spectrum at the current time and frequency counter values. In either case in step 190 or 200, the SPRT index is reset to zero since a decision has been made.

The results of the SPRT calculations are finally displayed in step 220 for the current values of t and k. If the current value of the frequency counter is equal to N in step 230, the length of the input signal, then the time counter t is incremented, and the value for the frequency counter k is reset to zero in step 120. If the current value of k is not equal to N, then t is kept the same and k is incremented in step 130. Then the process repeats in step 140 until there are no signals left to analyze.

Figure 10A:
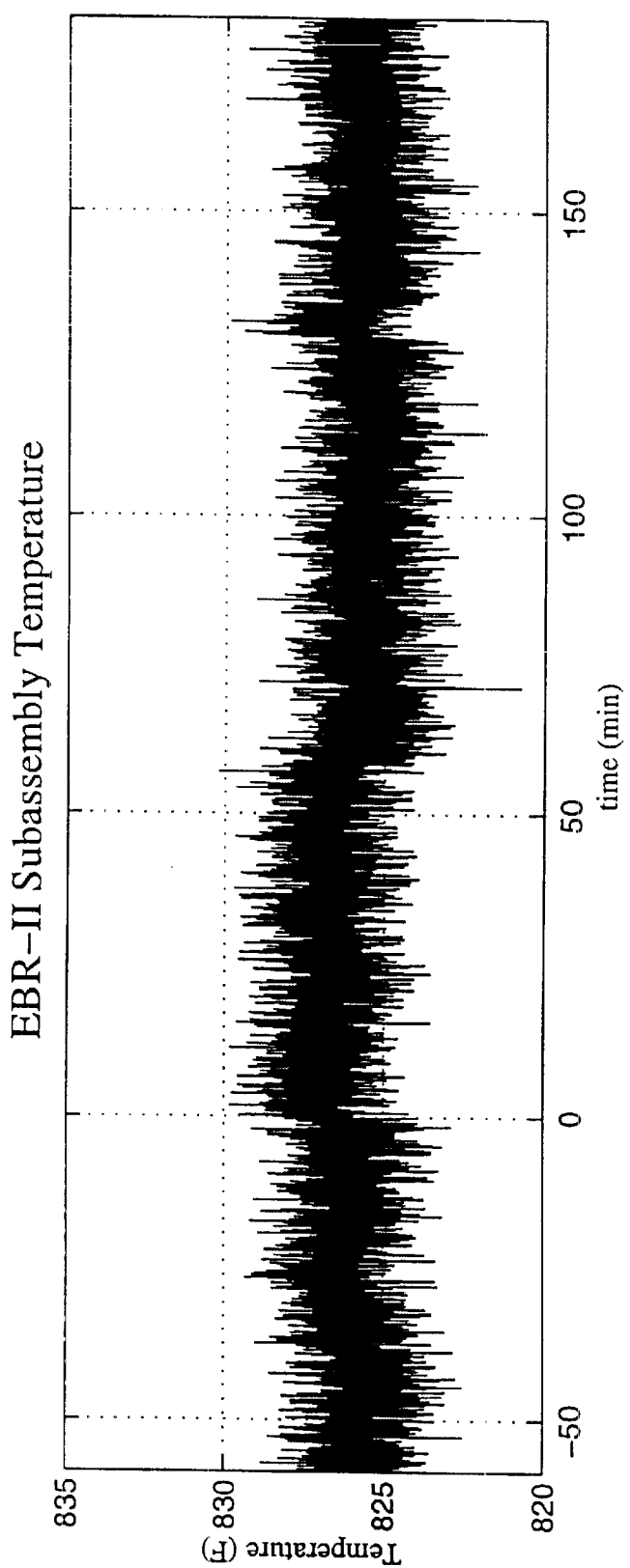
FIG. 10A illustrates an EBR-II subassembly temperature versus time for imposition of a 1.0 degree pulse onto the base temperature signal.
Figure 10B:
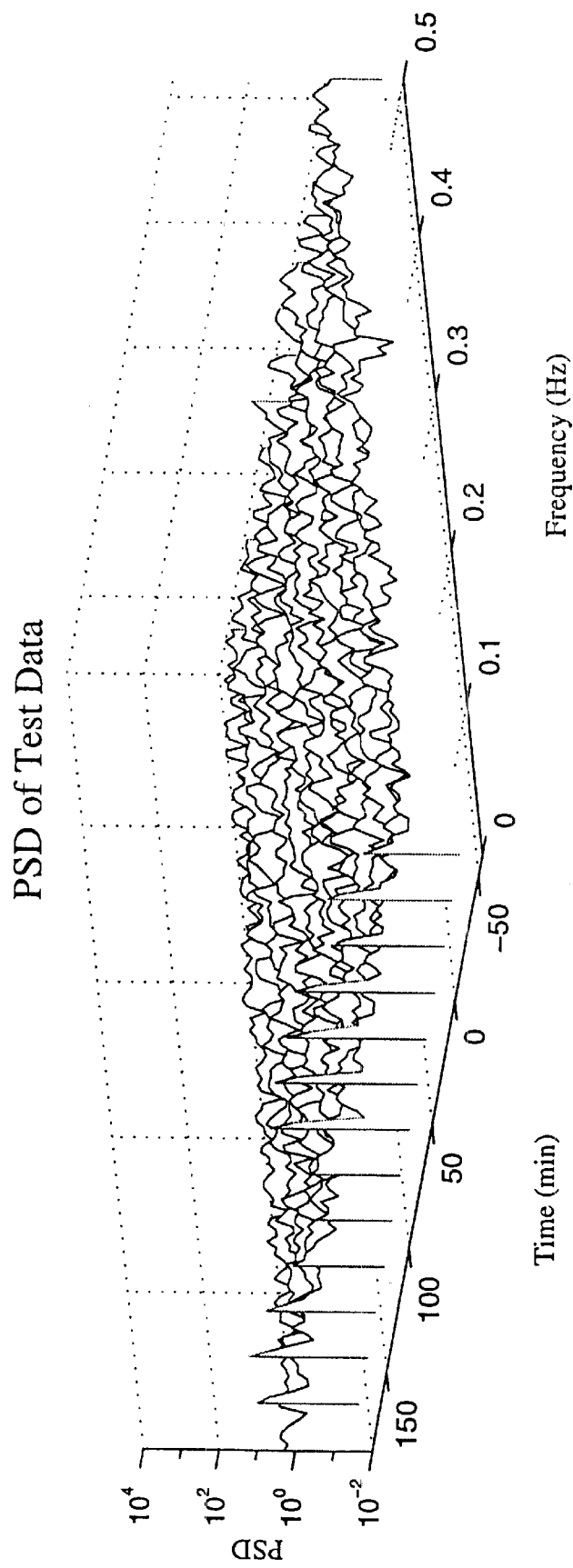
FIG. 10B illustrates a three-dimensional plot of moving-window power spectral density (PSD) analysis applied to the data of FIG. 10A.
Figure 10C:
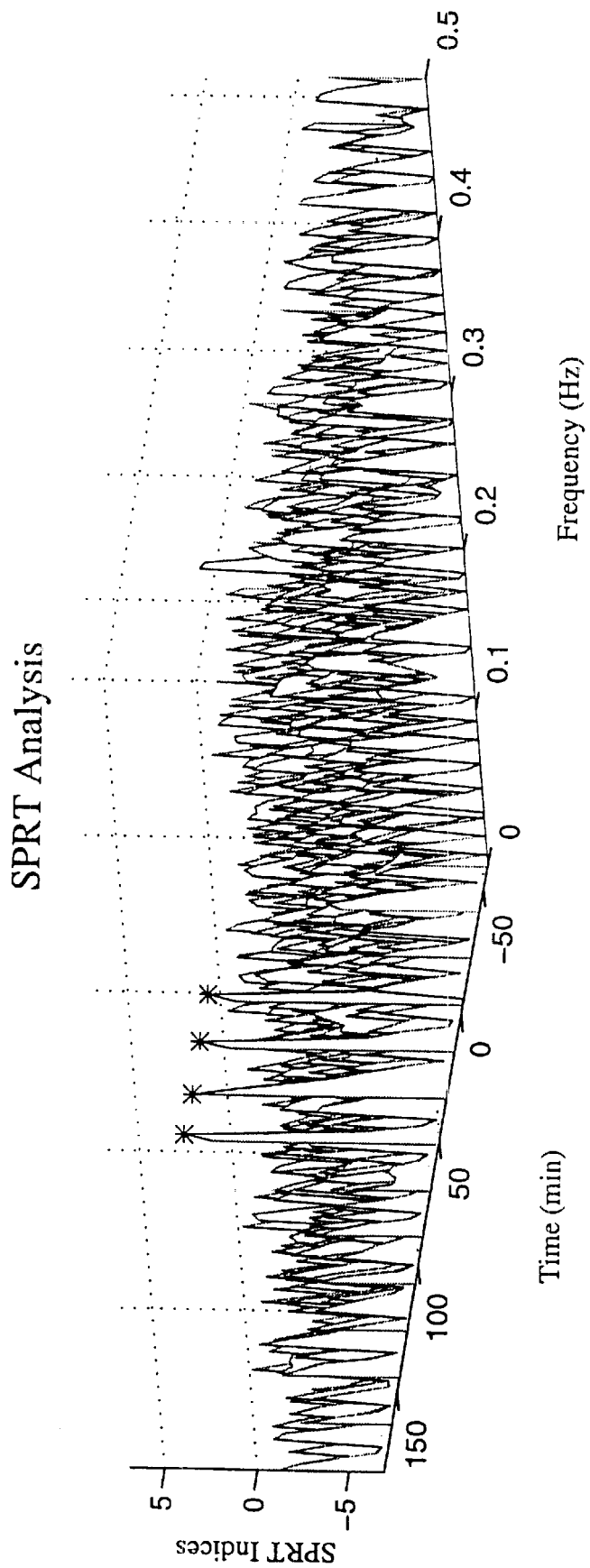
FIG. 10C illustrates a three-dimensional combined probabilistic SPRT time domain analysis and PSD frequency domain analysis for the data of FIG. 10A.

The nature of this invention can be further illustrated by referring to FIGS. 10A–26C, inclusively. In FIG. 10A is shown a subassembly temperature signal from the EBR-II nuclear reactor. These temperature signals have a 1.0° F. imposed temperature pulse, starting at time zero and lasting for a time period of approximately 58 minutes and amounting to 3500 data points. Thus, for time data points from 0 to 3500 and time points above 7000 there is no perturbation imposed. This data is then analyzed for each incremental time by performing a Fourier transform to the frequency domain. An accumulated plurality of one-second increments over 240 minutes is displayed as a PSD plot in FIG. 10B. As shown in the flow diagram of FIGS. 9A and 9B and the PSD reference signal is subtracted from each of the PSD spectra for each time window and yields a two-dimensional surface of residuals. This array of residual data can then be fed into a SPRT module which generated the three-dimensional surface in time-frequency space. This spatial surface, as noted in FIG. 10 C., can provide very sensitive indicators of deviations from normalcy of the signals being analyzed.

Figure 11A:
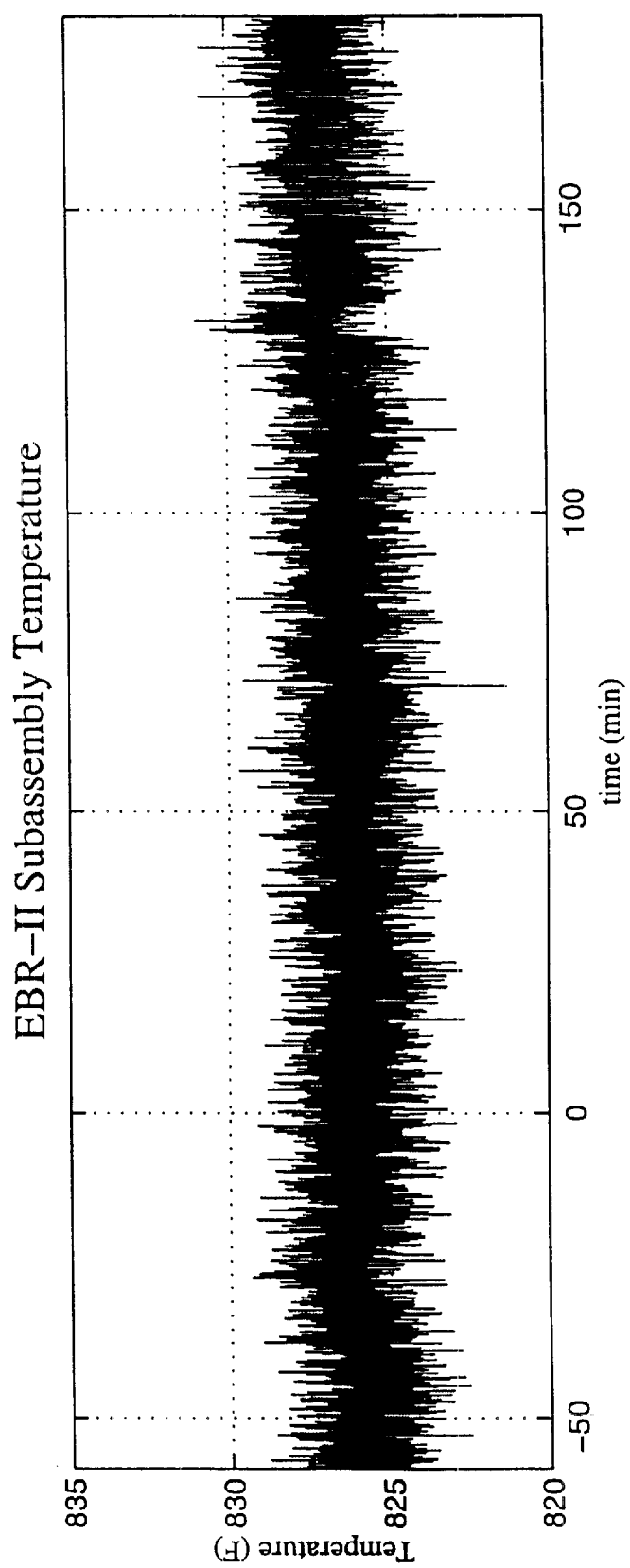
FIG. 11A illustrates an EBR-II subassembly temperature versus time for imposition of a linear drift from 0.1 to 1.5 degree pulse onto the base temperature signal.
Figure 11B:
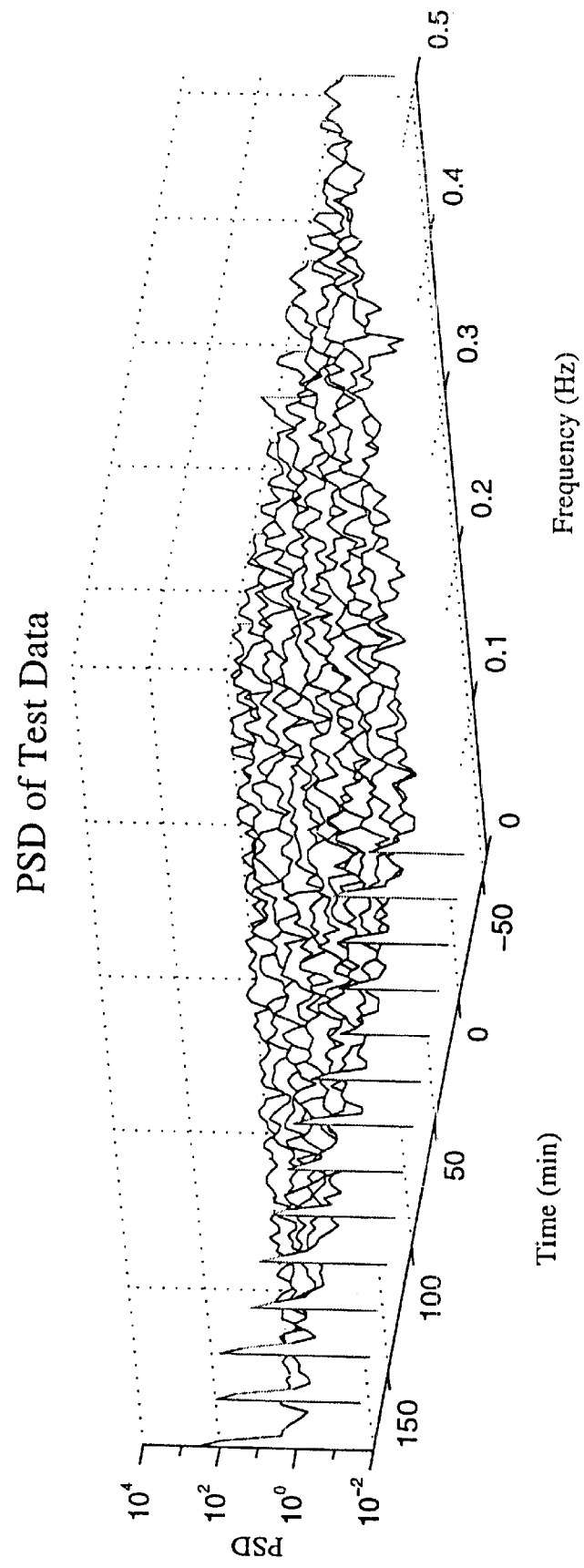
FIG. 11B illustrates a three-dimensional plot of moving-window power spectral density (PSD) analysis applied to the data of FIG. 11A.
Figure 11C:
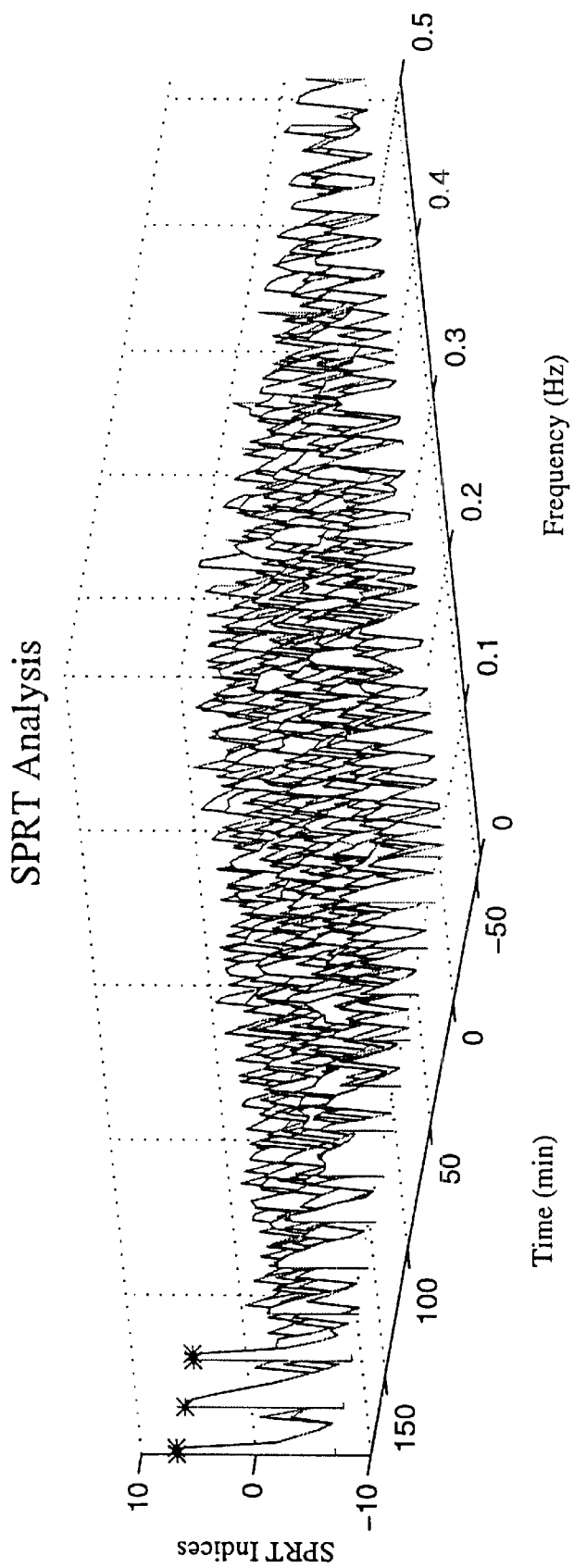
FIG. 11C illustrates a three-dimensional combined probabilistic SPRT time domain analysis and PSD frequency domain analysis for the data of FIG. 11A.

FIGS. 11A–C show another example of imposing a 1.5° F. linear drift to simulate a linear decalibration bias in a sensor. At time t-0, a drift is imposed having a starting value of 0° F., running linearly throughout 10900 time data points with an ending value of 1.5° F. For data points from 0 to 3500 (−60 minutes to 0 minutes) there is no perturbation and the linear drift begins at 3501 (0 minutes) and continues to point 14400 (about 180 minutes). Again, the methodology illustrates with great sensitivity the creation of an alarm or deviation condition.

Figure 12A:
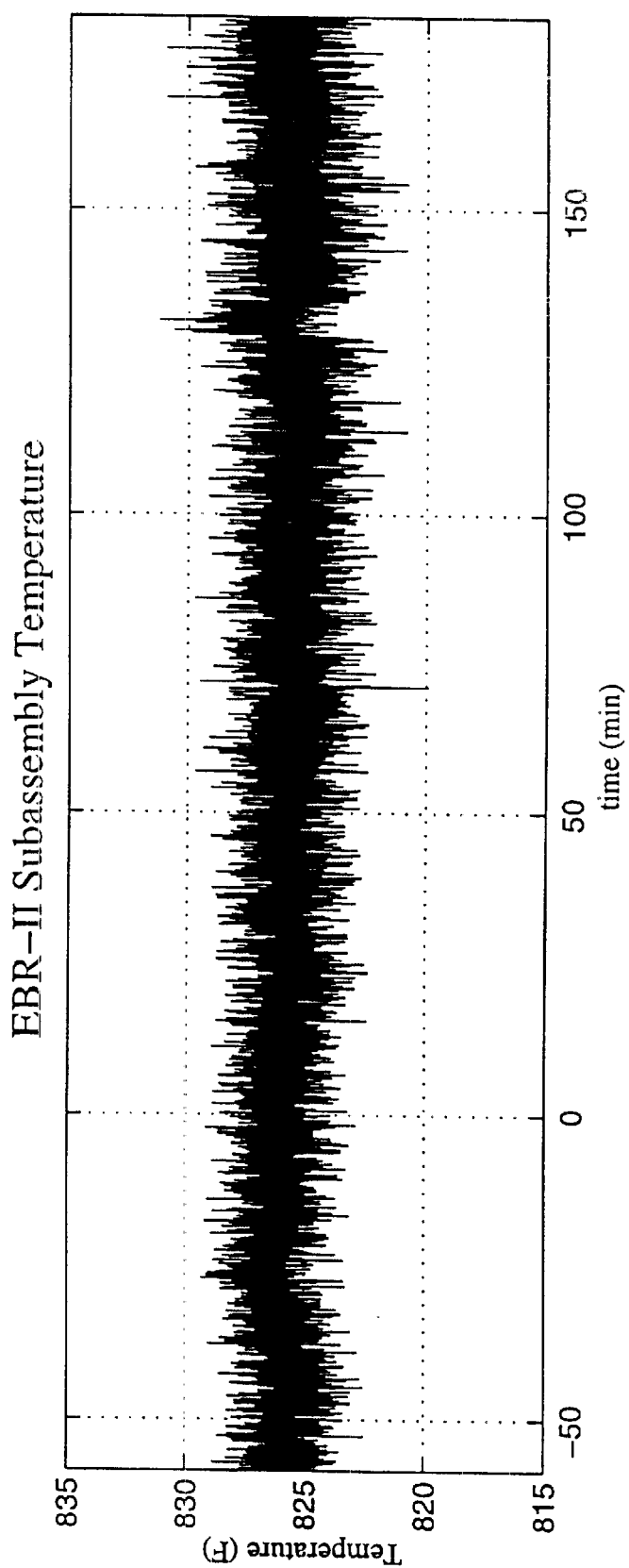
FIG. 12A illustrates an EBR-II subassembly temperature versus time for imposition of a linear increase in gain applied to the base temperature signal.
Figure 12B:
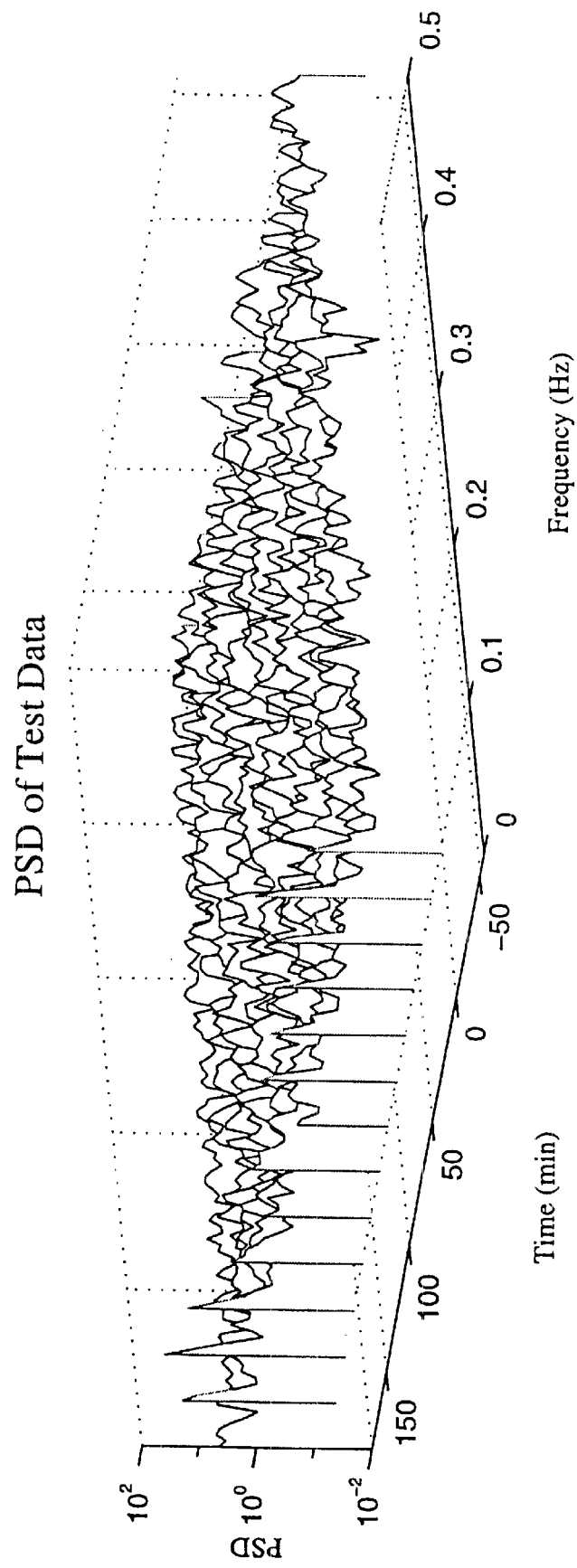
FIG. 12B illustrates a three-dimensional plot of moving-window power spectral density (PSD) analysis applied to the data of FIG. 12A.
Figure 12C:
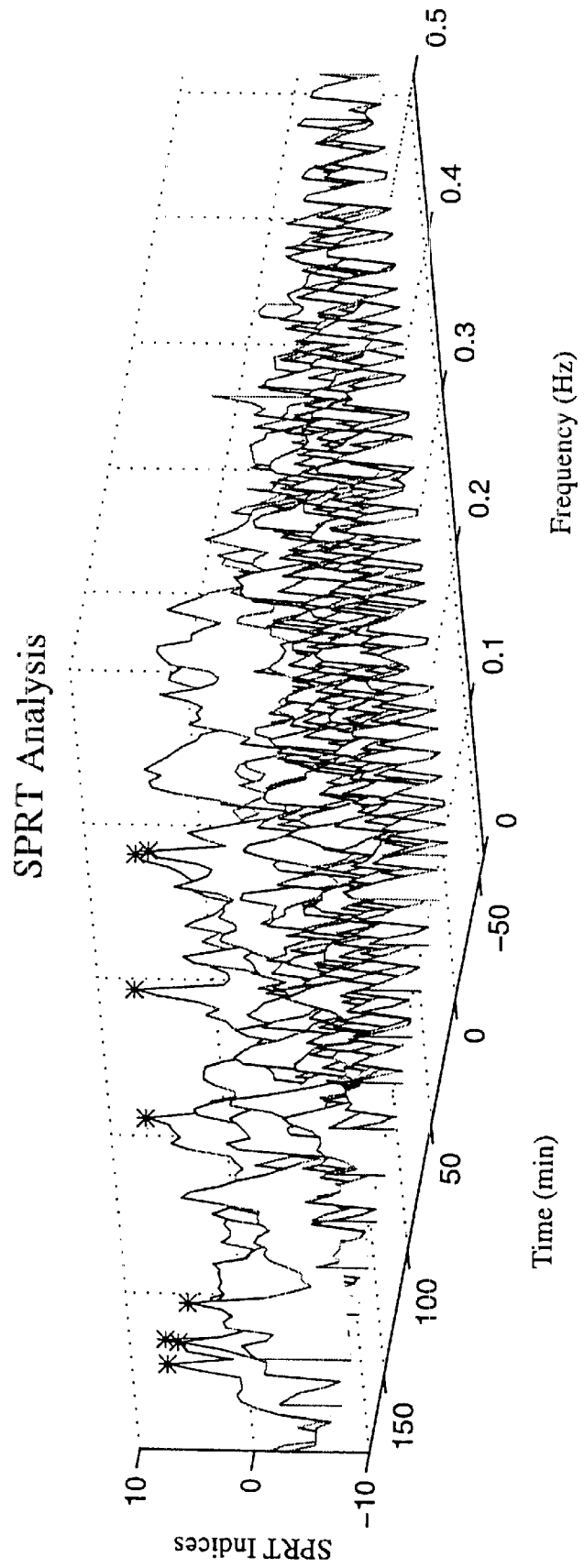
FIG. 12C illustrates a three-dimensional combined probabilistic SPRT time domain analysis and PSD frequency domain analysis for the data of FIG. 12A.

In FIG. 12A a linear increase in gain is applied with no change in the mean value of the signal and is typically a very difficult trouble state to detect. At time zero a gain change is imposed having a starting value of 1.0 and increases exponentially through the end of the data set consisting of 14,400 test points (10 days) with n=i−3501 and the disturbance being =5(i), m is the sum of x(i), the test signal, from i=3500 to 14,400, all divided by 10,900. The s(i) is [x(i)−m] exp $\{0.375 n/10,900\}$+m for i≧3501 and x(i) for i≦3500. In FIG. 12B is shown the PSD of the signal of FIG. 12A and FIG. 12C illustrates the resulting three-dimensional SPRT surface, readily identifying trouble states.

Figure 13A:
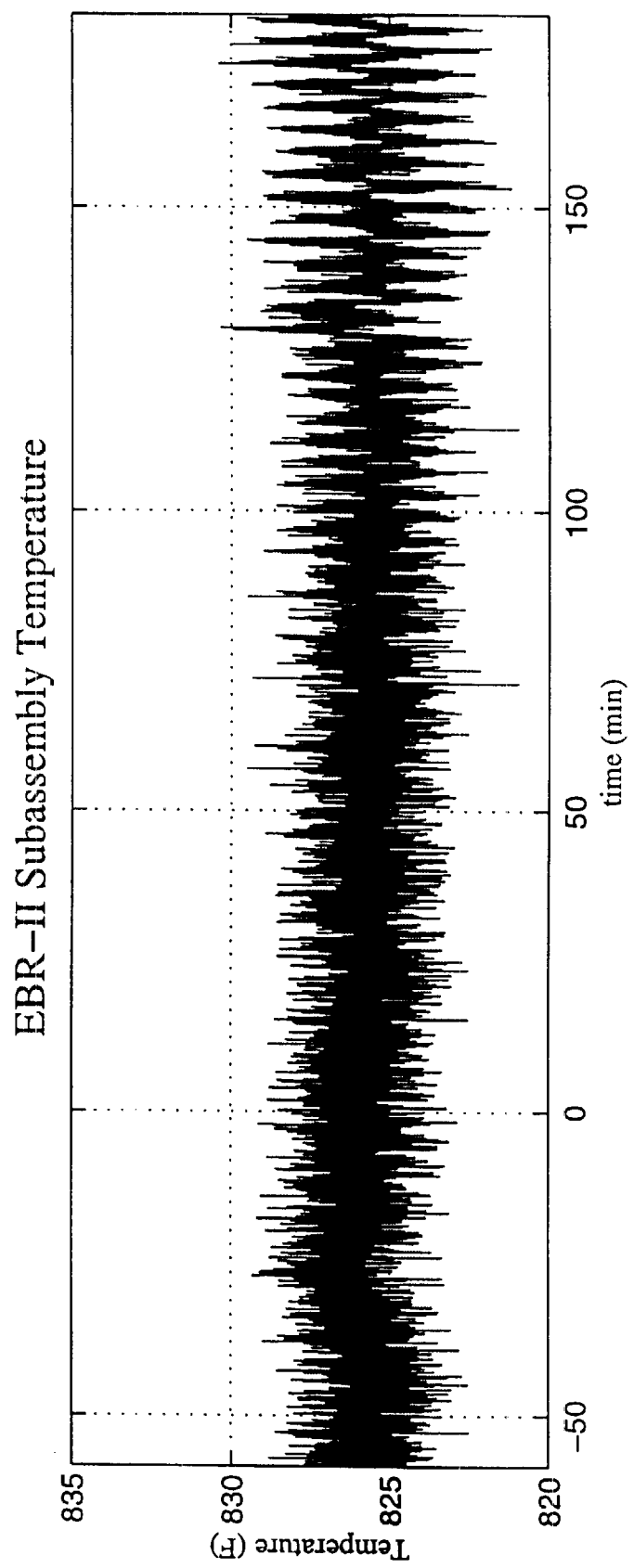
FIG. 13A illustrates an EBR-II subassembly temperature versus time for imposition of an unstable sinusoidal interference applied to the base temperature signal.
Figure 13B:
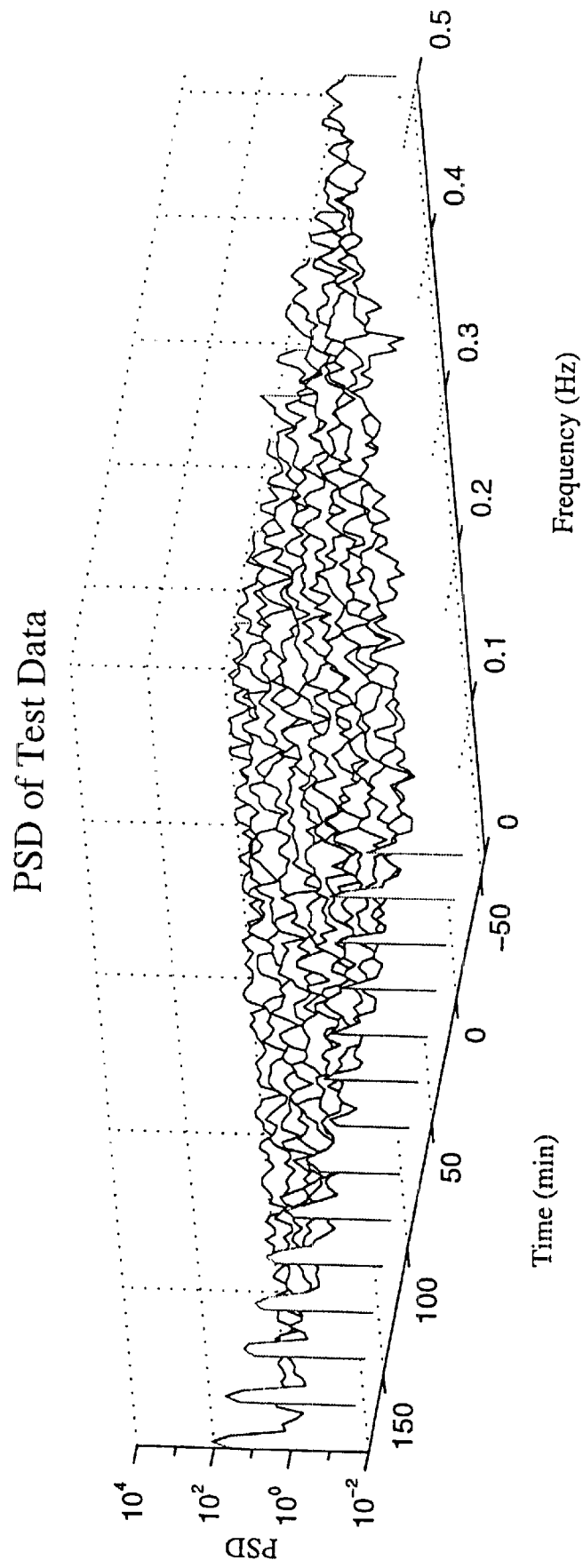
FIG. 13B illustrates a three-dimensional plot of moving-window power spectral density (PSD) analysis applied to the data of FIG. 13A.
Figure 13C:
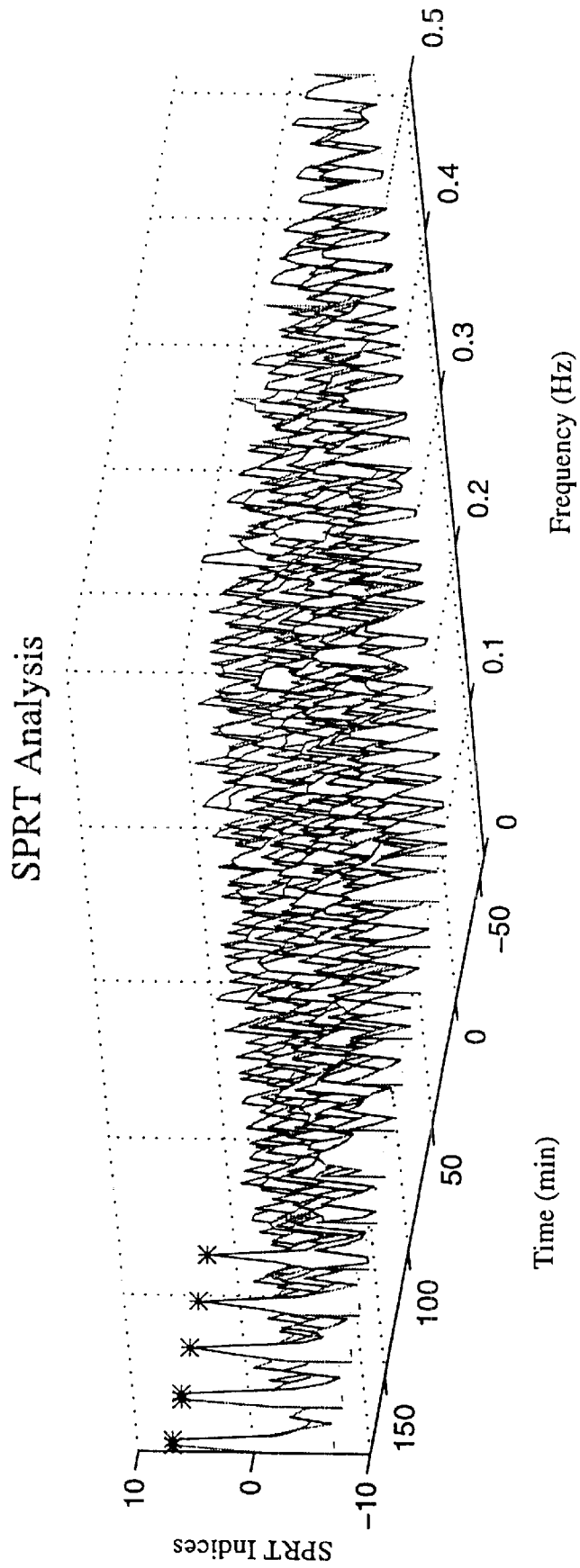
FIG. 13C illustrates a three-dimensional combined probabilistic SPRT time domain analysis and PSD frequency domain analysis for the data of FIG. 13A.

In FIG. 13A an unstable sinusoidal interference is imposed on the base subassembly temperature date of FIG. 10A. The sinusoidal interference has a maximum frequency of about 0.01 Hz. At time zero the sinusoid is introduced and grows exponentially throughout 10,900 data points with no perturbation for the first 3500 data points. The PSD function of FIG. 13B is operated on by the SPRT methodology resulting in the three-dimensional surface function in FIG. 13C which enables identification of the interference in the signal indicated by the marked alarm points.

Figure 14A:
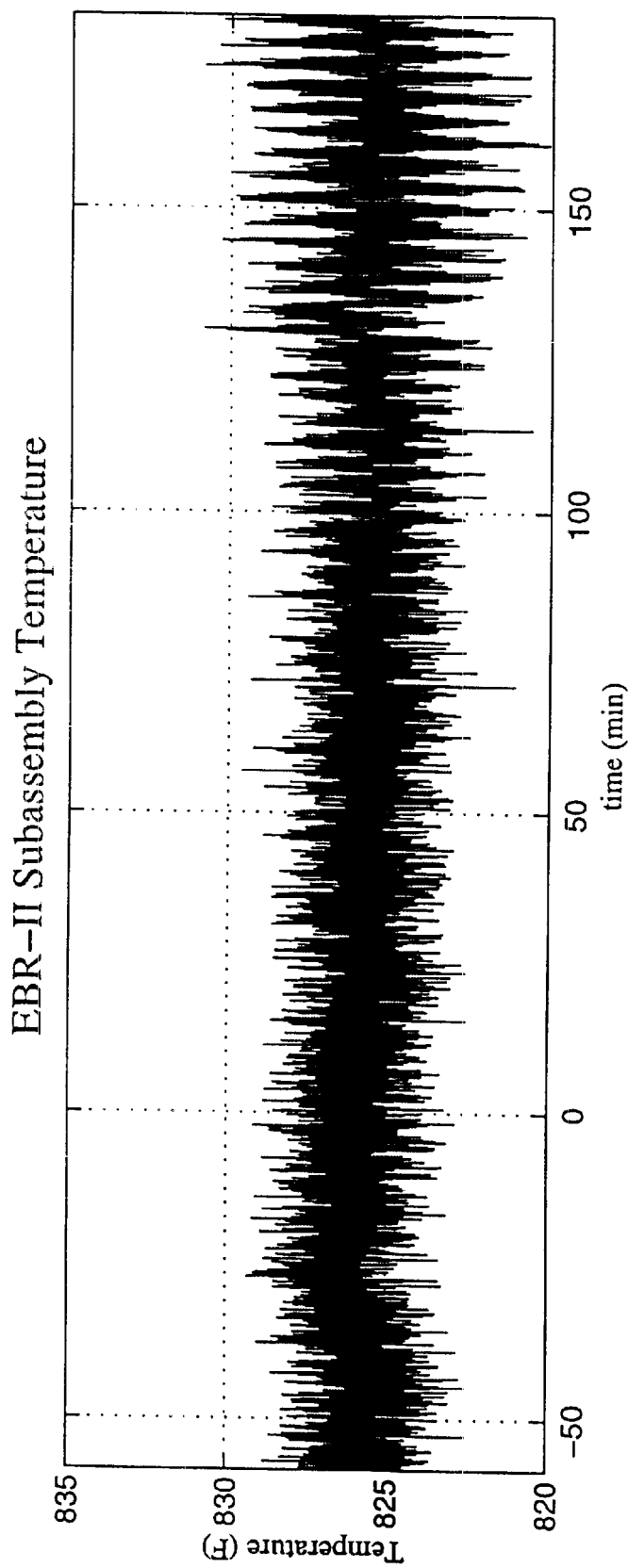
FIG. 14A illustrates an EBR-II subassembly temperature versus time for imposition of a multiple sinusoidal interference applied to the base temperature signal.

In FIG. 14A a multiple sinusoidal interference is imposed on the base subassembly temperature data of FIG. 10A. The interference contains three unstable sinusoid interferences, each being a distinctive frequency and each having a maximum frequency of 0.01 Hz, 0.287 Hz and 0.4997 Hz, respectively. At time zero, the three sinusoids are introduced and grow exponentially over the range of 3501 to 14,400 data points. Thus for the first 3500 data points, the data is the test signal without perturbation followed by 10,900 data points having the values of x(i), the test signal, plus 5(i) is:

$$5(i)=(a)\{\sin(2\pi n(2725/10900))+\sin(2\pi n(5449/10,900))\}+z$$

where z is the unstable signal and a=exp(−5+(5.25/10900) (n)).

Figure 14B:
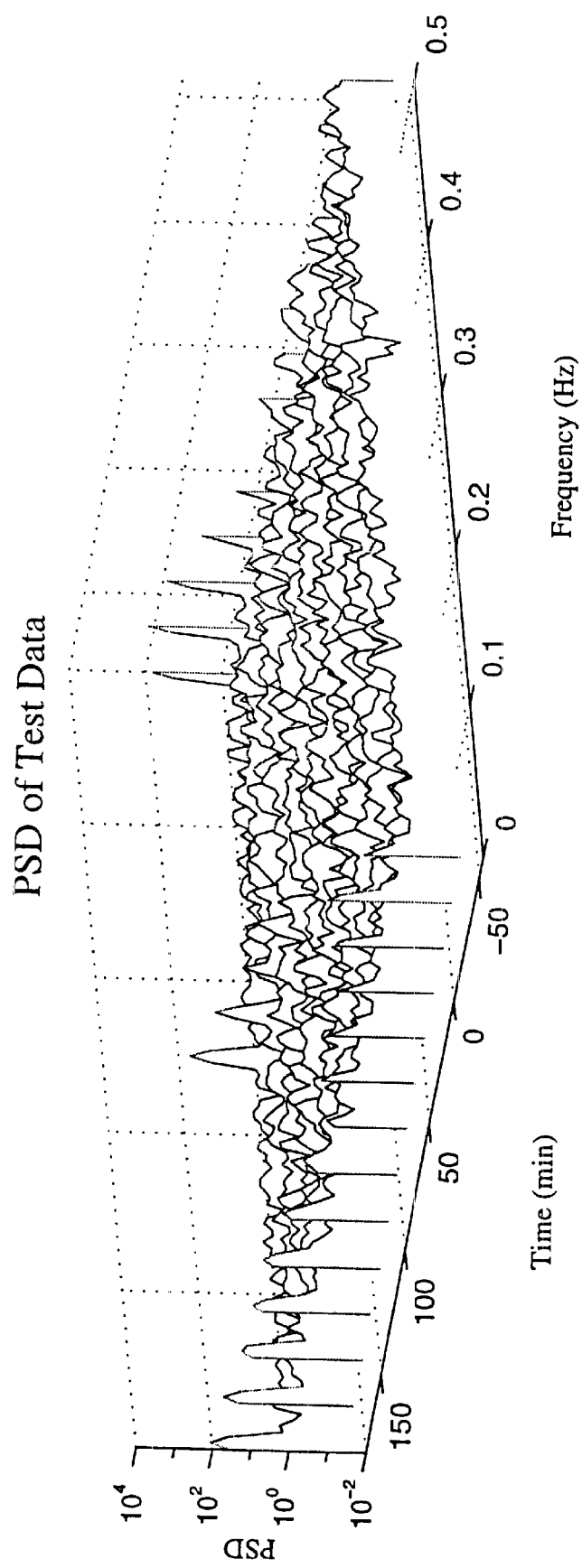
FIG. 14B illustrates a three-dimensional plot of moving-window power spectral density (PSD) analysis applied to the data of FIG. 14A.
Figure 14C:
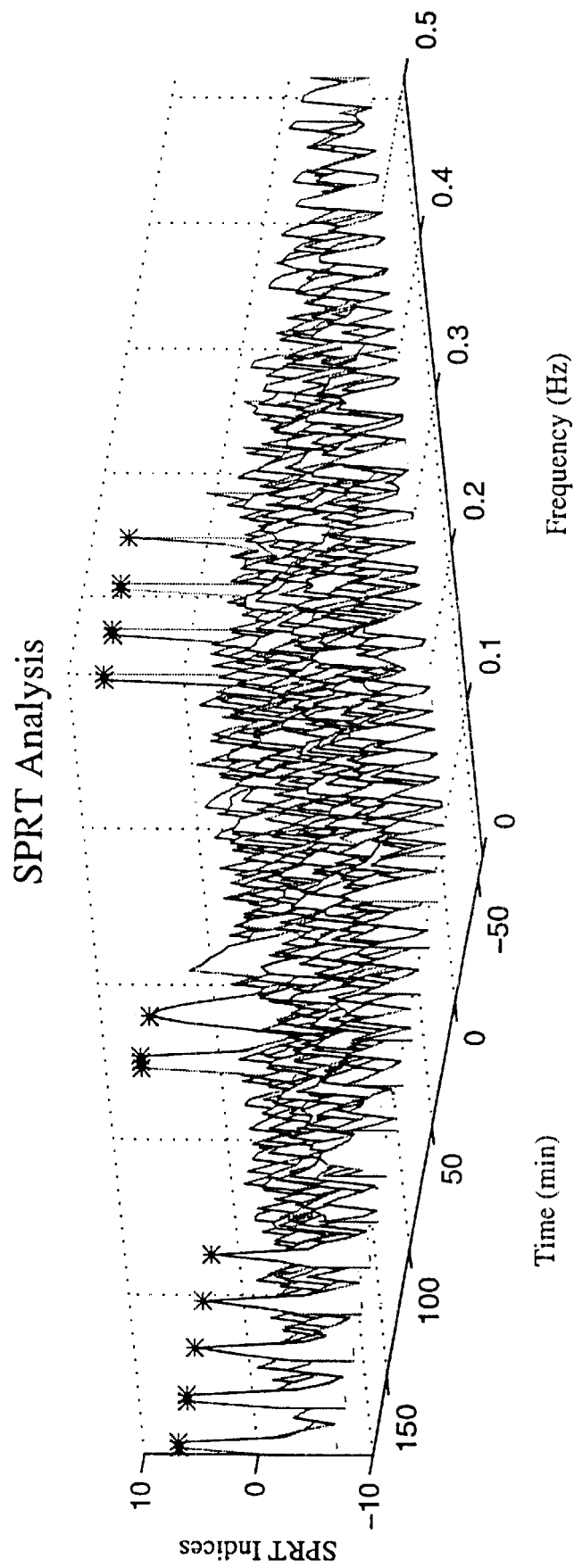
FIG. 14C illustrates a three-dimensional combined probabilistic SPRT time domain analysis and PSD frequency domain analysis for the data of FIG. 14A.

In FIG. 14B is shown the PSD function resulting from FIG. 14A; and upon applying SPRT thereto, the three-dimensional SPRT surface of FIG. 14C illustrates distinctive alarm states as marked on the surface.

Figure 15A:
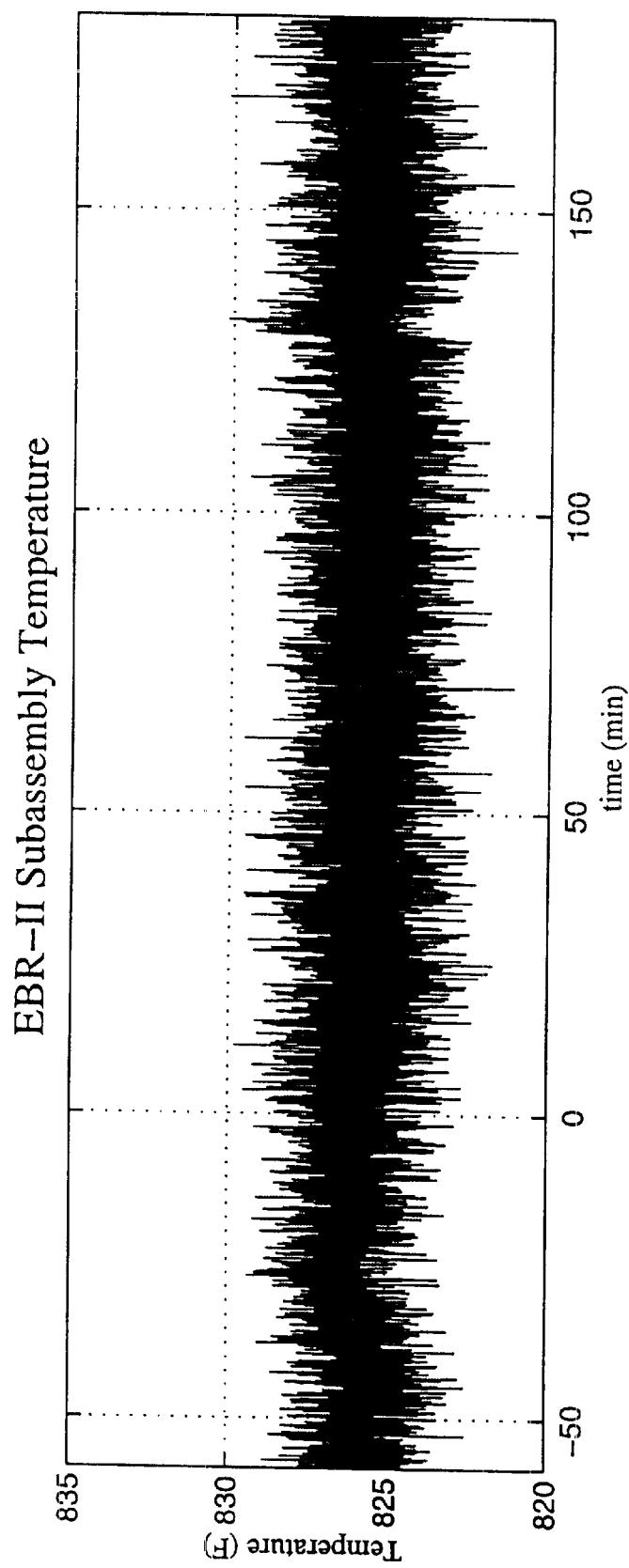
FIG. 15A illustrates an EBR-II subassembly temperature versus time for imposition of a linearly degrading time constant applied to the base temperature signal.
Figure 15B:
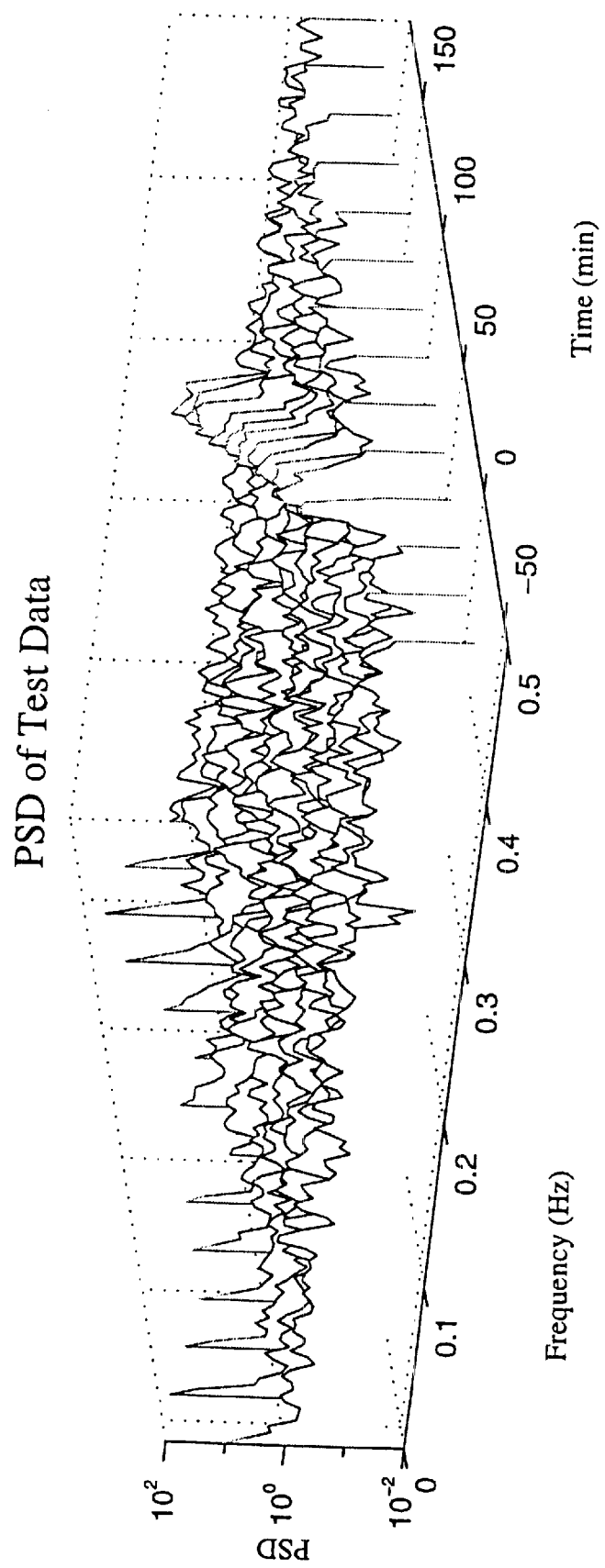
FIG. 15B illustrates a three-dimensional plot of moving-window power spectral density (PSD) analysis applied to the data of FIG. 15A.
Figure 15C:
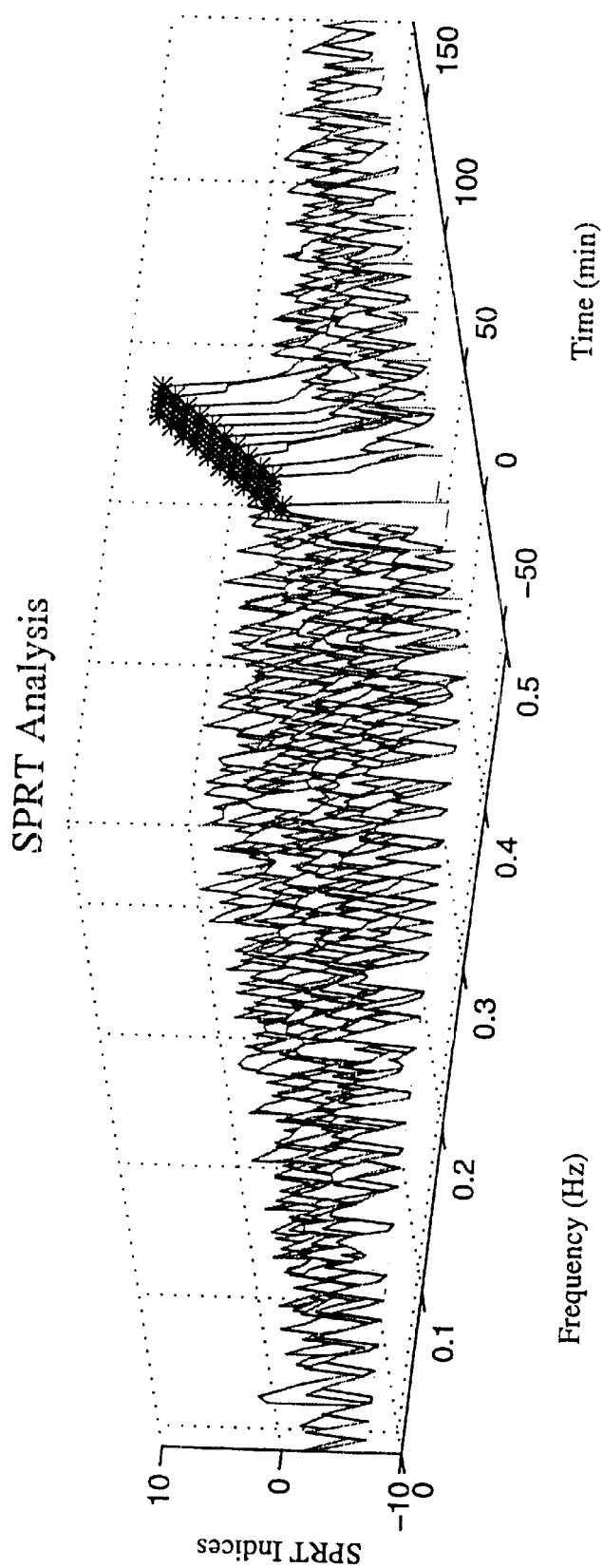
FIG. 15C illustrates a three-dimensional combined probabilistic SPRT time domain analysis and PSD frequency domain analysis for the data of FIG. 15A.

In FIG. 15A a linear degrading time constant function is applied to the base subassembly temperature data of FIG. 10A. The interference contains a linearly degrading time constant starting at the designated time zero and continuing for the remaining 10,900 data points. Such a mode of deviation is typical of a number of physical, chemical, biological, manufacturing, business and financial systems; and is very difficult to detect using conventional methodologies. Specific examples are failure of Venturi flowmeters in the power industry and failure of oxygen sensors in the petroleum industry. The parameters of this linear degradation are as follows: x(i) is the test, desired state, signal, t=((−1.5/10,900) times n+1.5), with n=i−3501, where i is the data point number, f(t)=a frequency modulated signal which is a function of time, t, with a carrier frequency of 0.25 Hz and a sampling frequency of 1.0 Hz. The disturbance can be characterized by x(i)+s(i), where s(i)=0 for i≦3500 and is f(t) for i≧3501. In FIG. 15B is shown the PSD function resulting from FIG. 15A; and upon applying SPRT thereto, the three-dimensional SPRT surface of FIG. 15C illustrates distinctive alarm states, while diminishing spurious data which appeared in the PSD spectra.

In another preferred form of the invention, the Fourier transform of the PSD function was separated into its real and imaginary parts. The SPRT methodology was then applied separately to these real and imaginary parts of the Fourier transform over time. One noted advantage of this was that the separate real and imaginary parts of the Fourier transform were determined to follow Gaussian distributions (even when the time domain signals are non-Gaussian), as opposed to the combined Fourier transform not necessarily doing so. By separating the transformed data into real and imaginary parts, spurious non-Gaussian anomalies could be avoided (when present). In addition, such a method of separation also provides information about the phase of the disturbance present in the signal. The data having an even signal (a signal that is conjugate symmetric and real, i.e., X(n)=X(−n)) disturbance would result in SPRT alarms present only in the real SPRT alarm domain while an odd disturbance (X(n)=−X(−n)) would result in SPRT alarms present only in the imaginary SPRT alarm plane. Disturbances with both even and odd portions would show different densities of SPRT alarm domains in both the real and imaginary planes depending on the degree of evenness or oddness within the disturbances. Such distinctions can therefore be utilized to characterize the nature of a disturbance, trends in disturbances and phase of disturbances over time. Separation into real and imaginary domains has therefore resulted in reduction of false alarms in analysis of signals. Applications of this methodology of separating the PSD function into real and imaginary components can be illustrated by reference to FIGS. 16A–26C, inclusively. In FIGS. 16A–18C, inclusively is shown a comparison made with an analysis with the real and imaginary components left combined (FIG. 16A–C as compared to separation into real and imaginary components (FIGS. 17A–C and 18A–C, respectively).

Figure 16A:
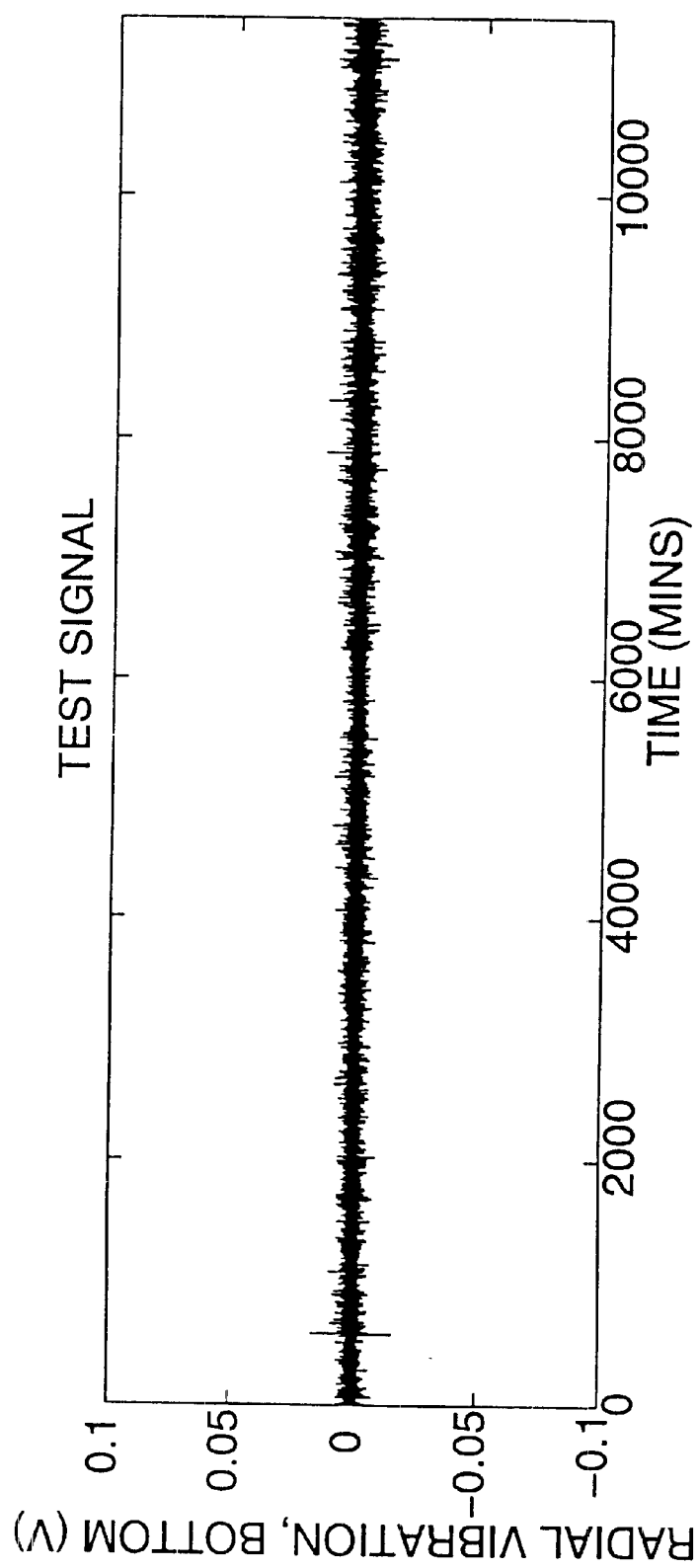
FIG. 16A illustrates a normal, undisturbed EBR-II accelerometer signal taken over time.
Figure 16B:
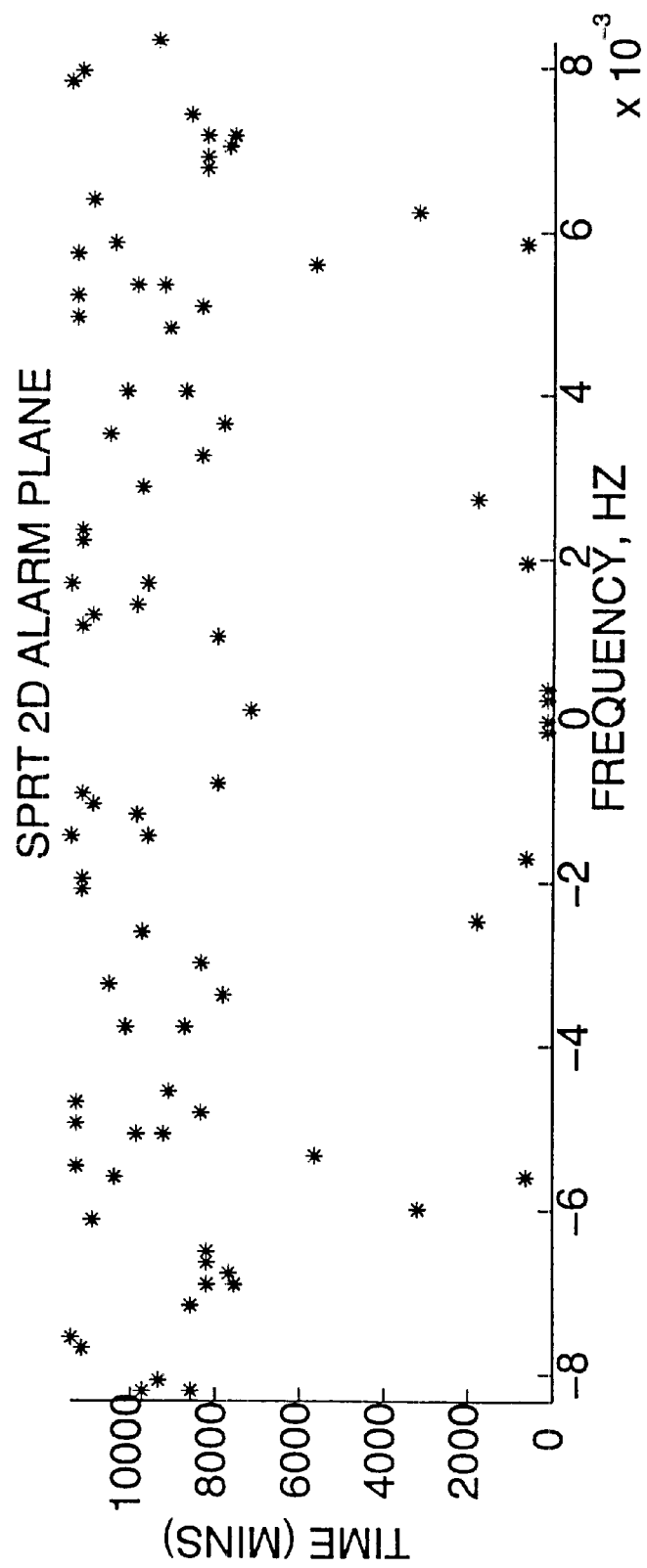
FIG. 16B is a two-dimensional (time versus frequency) SPRT alarm plane spectrum.

Analysis of normal, desired signal data is shown in FIG. 16A which shows a normal, undisturbed EBR-fl accelerometer signal taken over time. In FIG. 16B is a two-dimensional SPRT plot alter analysis of then data of FIG. 16A in accordance with the SPRT procedure described hereinafter and is an alarm plane cross-section thorough the three-dimensional plot of FIG. 16C. This methodology enables the user to quickly observe any fault trends.

Figure 16C:
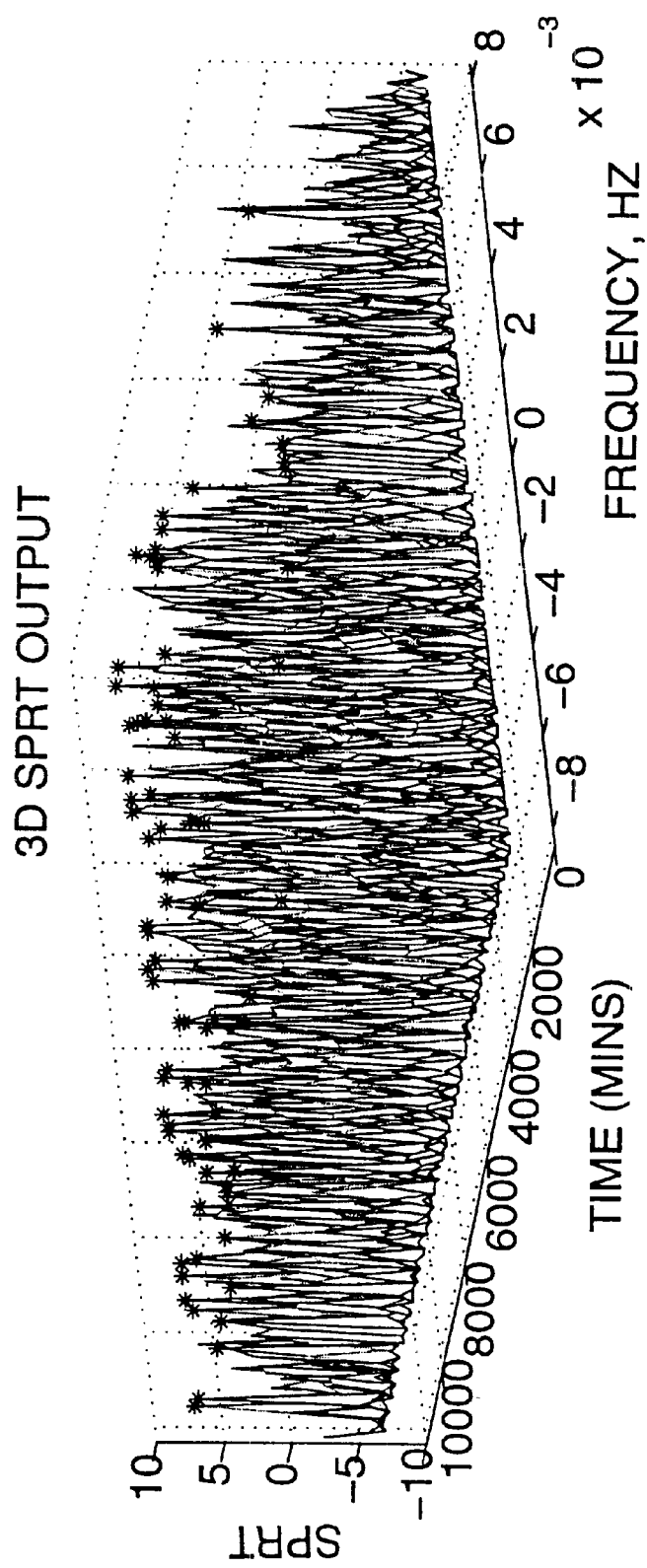
FIG. 16C illustrates a three-dimensional combined probabilistic SPRT time domain and PSD frequency domain analysis of the data of FIG. 16A.

As can be noted in FIGS. 16B and 16C, if the SPRT methodology is applied directly to combine with the PSD function of a normal state EBR-II accelerometer signal, a number of false alarms are produced. This likely arises from the non-Gaussian nature of this signal and when specifying a false alarm probability α of 0.001, the resulting empirical α turned out to be about 0.007.

Figure 17A:
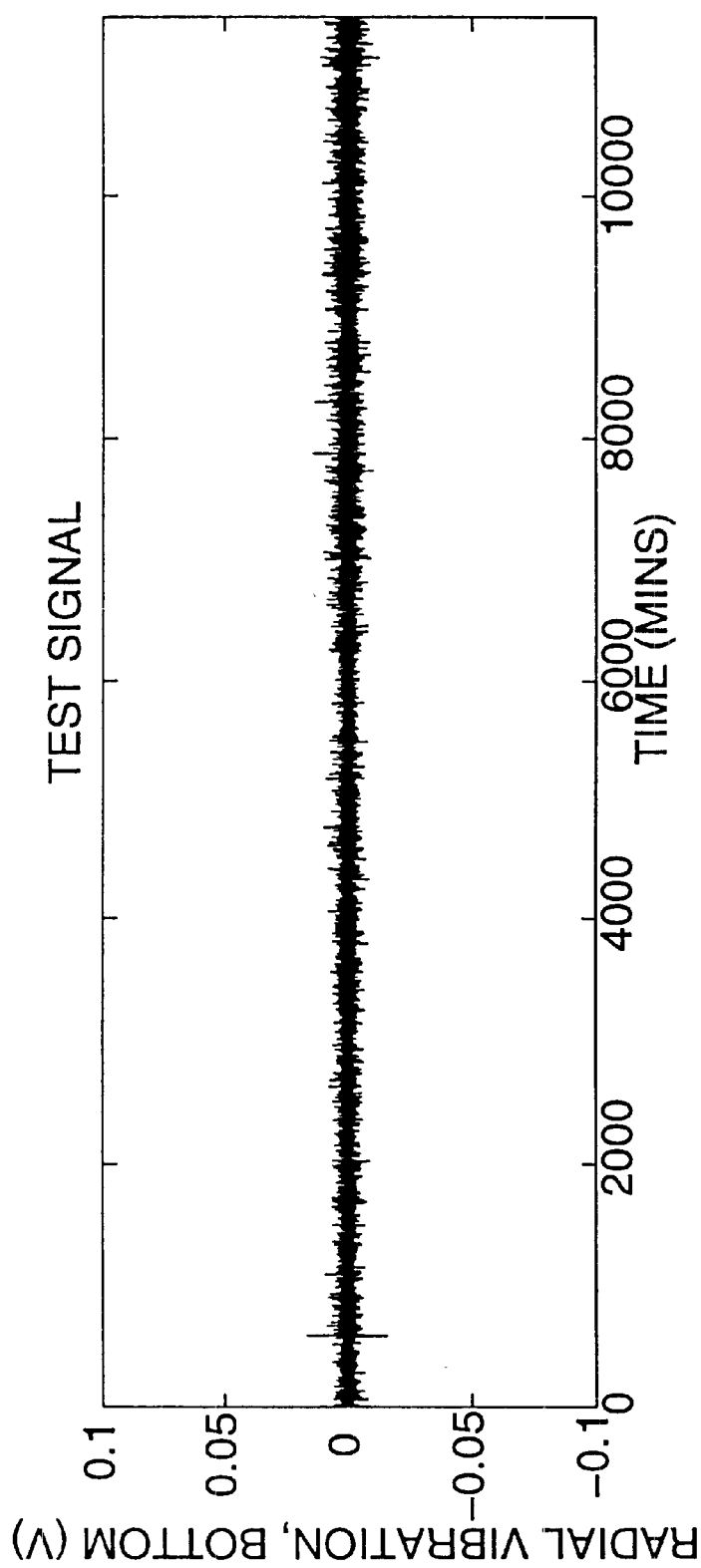
FIG. 17A illustrates the signal of FIG. 16A.
Figure 17B:
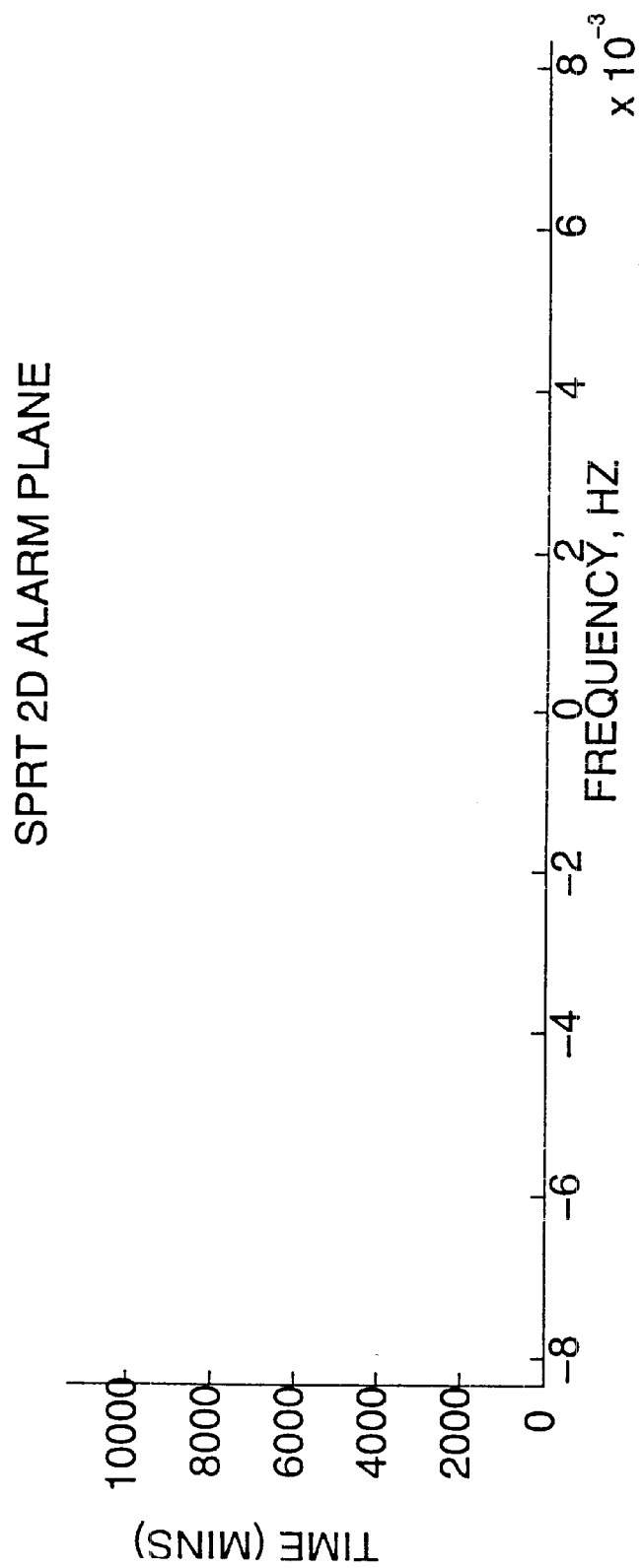
FIG. 17B illustrates the two-dimensional SPRT alarm plane spectrum using only the real part of the PSD spectrum of the Fourier transform of the data of FIG. 17A.
Figure 17C:
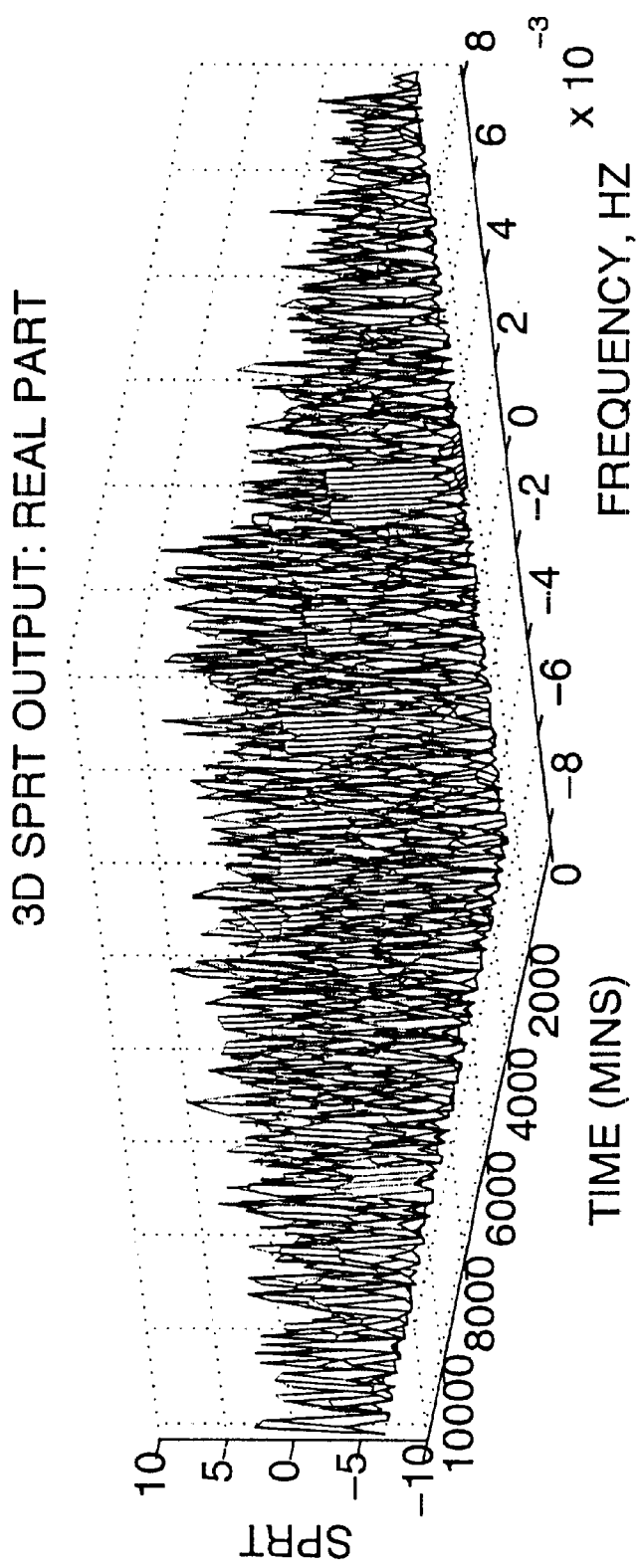
FIG. 17C illustrates a three-dimensional combined probabilistic SPRT time domain and PSD frequency domain analysis of the real part of the Fourier transform of the data of FIG. 17A.

Turning to FIGS. 17B and 17C the SPRT methodology has been applied to only the real part of the accelerometer signal. The achieved α is 0.0 for FIG. 17B which greatly improves upon the method demonstrated in FIGS. 16B and 16C. For the three-dimensional SPRT results of FIG. 17C the α achieved was about 0.0 which is again a greatly improved false alarm probability.

Figure 18A:
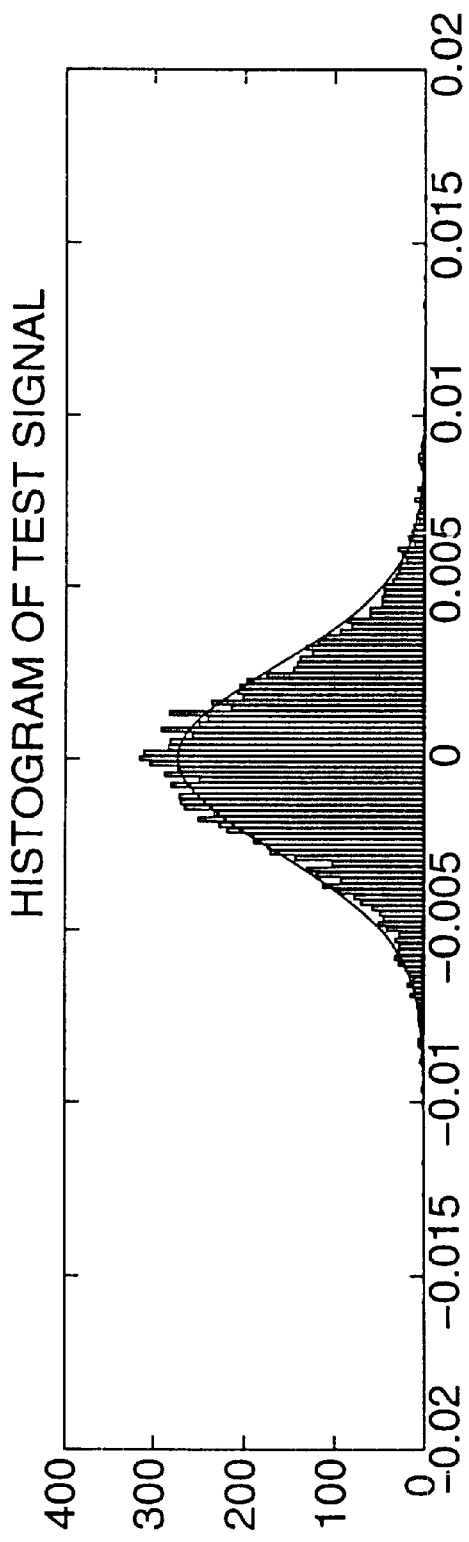
FIG. 18A illustrates a histogram of the deviation from the mean of the test signal of FIG. 16A.
Figure 18B:
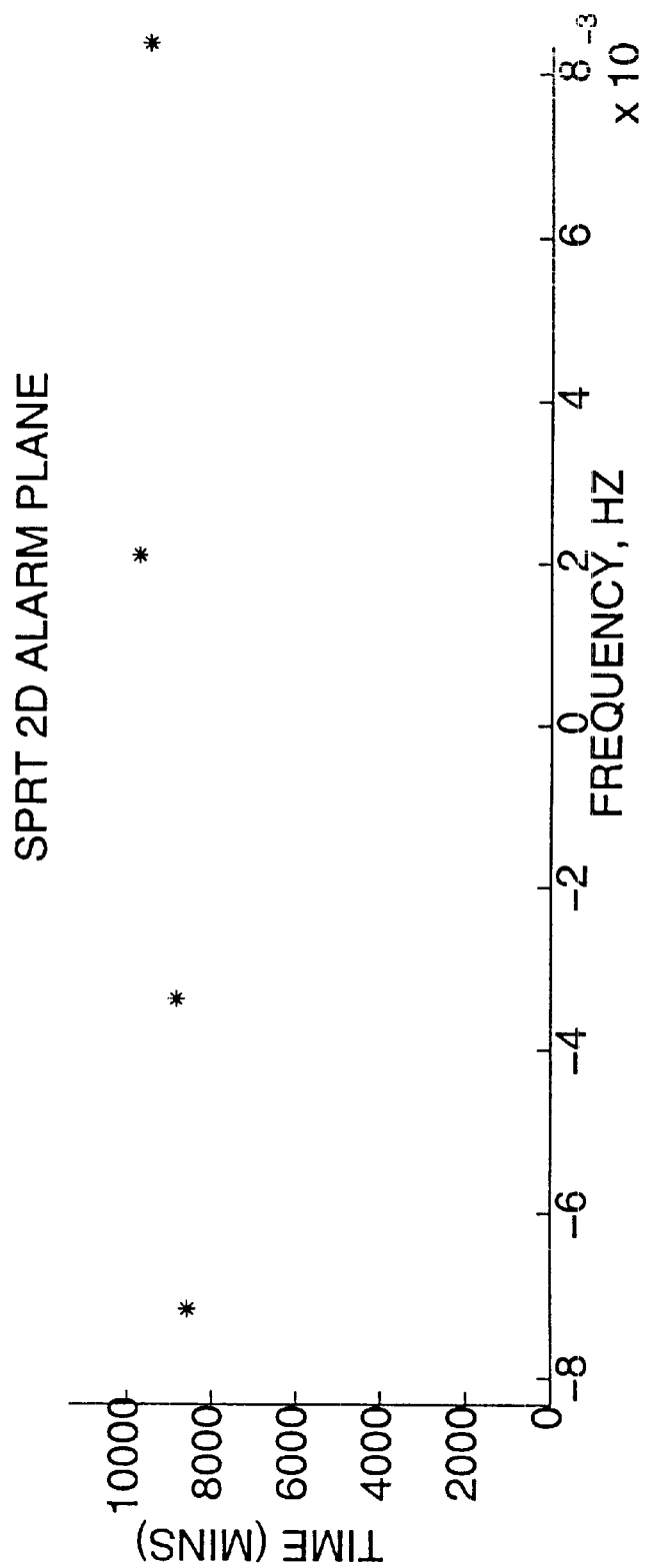
FIG. 18B illustrates the two-dimensional SPRT alarm plane spectrum testing only the imaginary part of the PSD spectrum of the Fourier transform of the data of FIG. 16A.
Figure 18C:
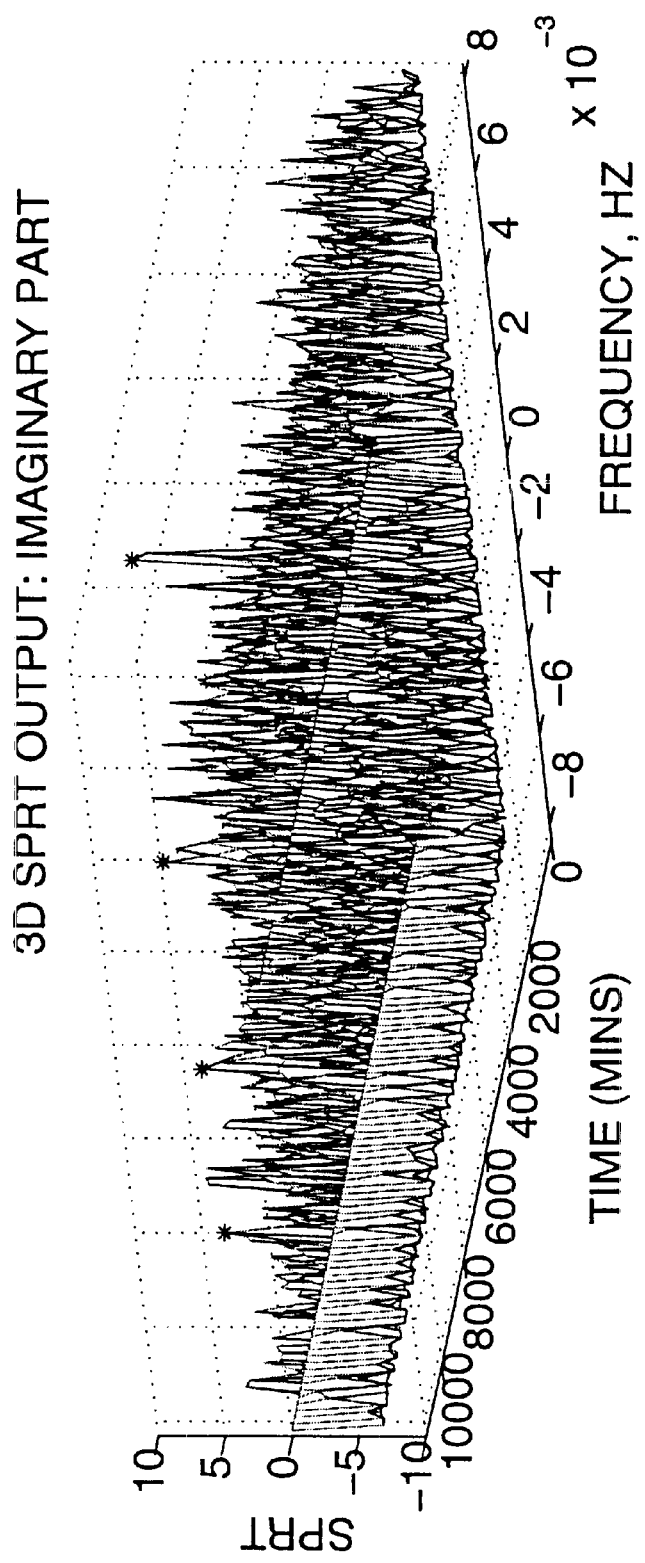
FIG. 18C illustrates a three-dimensional combined probabilistic SPRT time domain and PSD frequency domain analysis of the imaginary part of the Fourier transform of the data of FIG. 16A.

In FIGS. 18A–C are shown further data characteristic of the normal test signal with a histogram in FIG. 18A and FIGS. 18B and 18C showing the two-dimensional alarm plane spectrum and a three-dimensional SPRT spectra for only the imaginary part of the PSD accelerometer signal.

In FIGS. 19A–26C, inclusively, are shown various three-dimensional SPRT results after introducing various types of disturbances into the test accelerometer signal of FIG. 16A. The window size used for calculating the Fourier transforms in each example was one hundred twenty-eight samples, and no overlapping was used. For the accelerometer signal 11456 samples were taken once a minute.

Figure 19A:
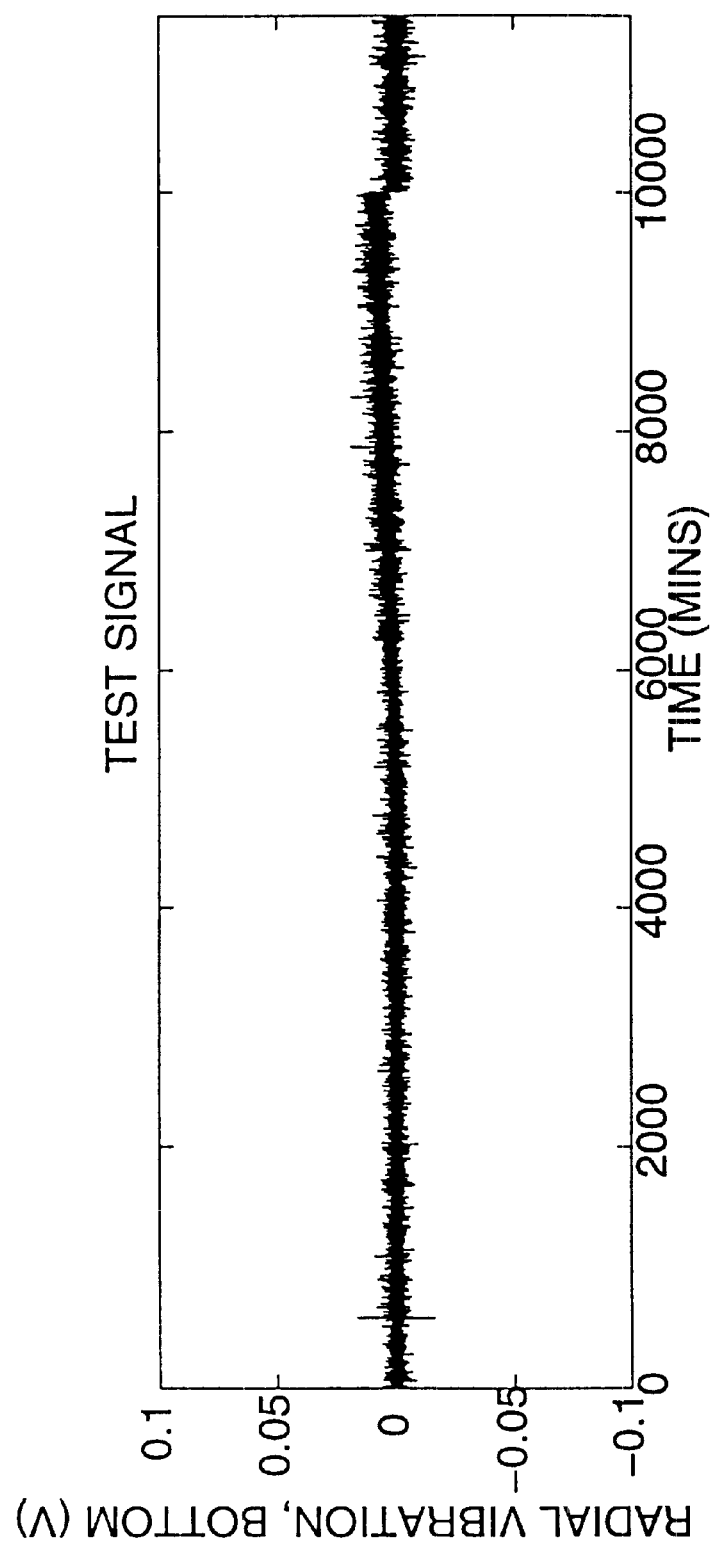
FIG. 19A illustrates imposition of a ramp decalibration bias on the signal of FIG. 16A.
Figure 19B:
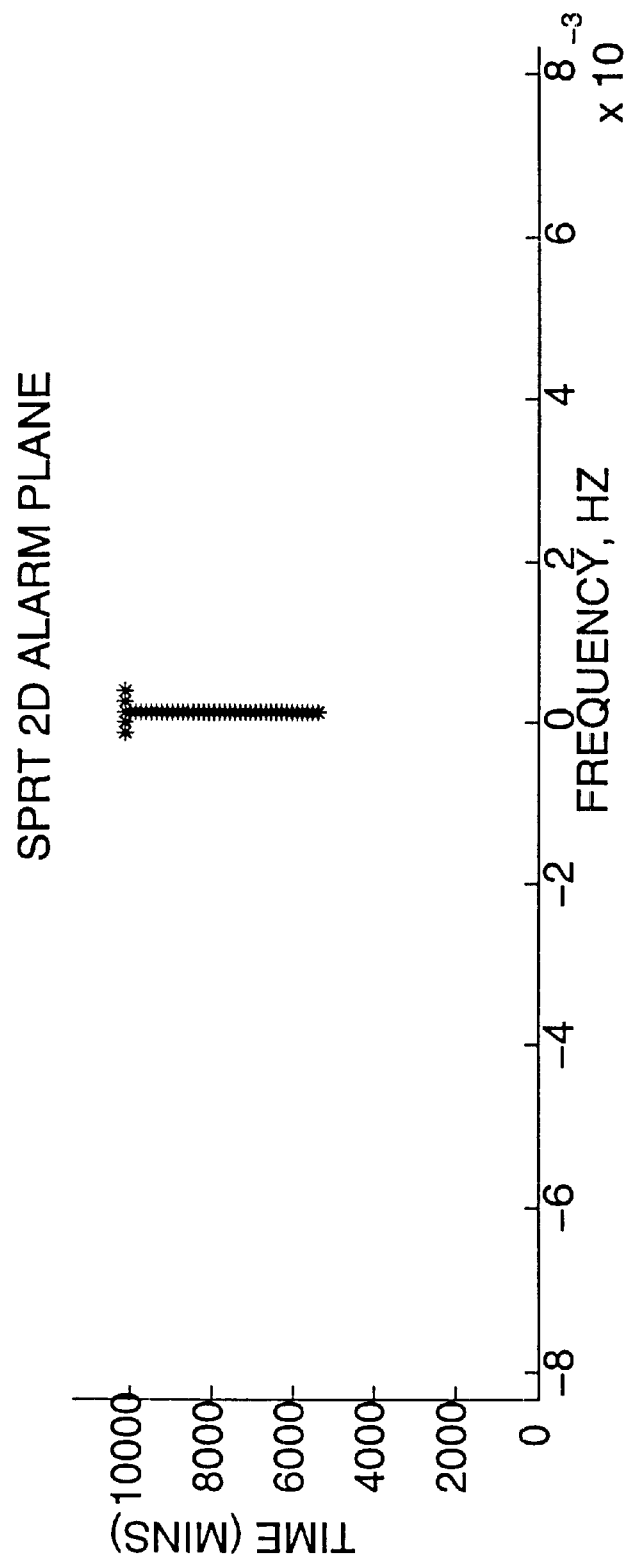
FIG. 19B illustrates the two-dimensional SPRT alarm plane spectrum using only the real part of the PSD spectrum of the Fourier transform of the data of FIG. 19A.
Figure 19C:
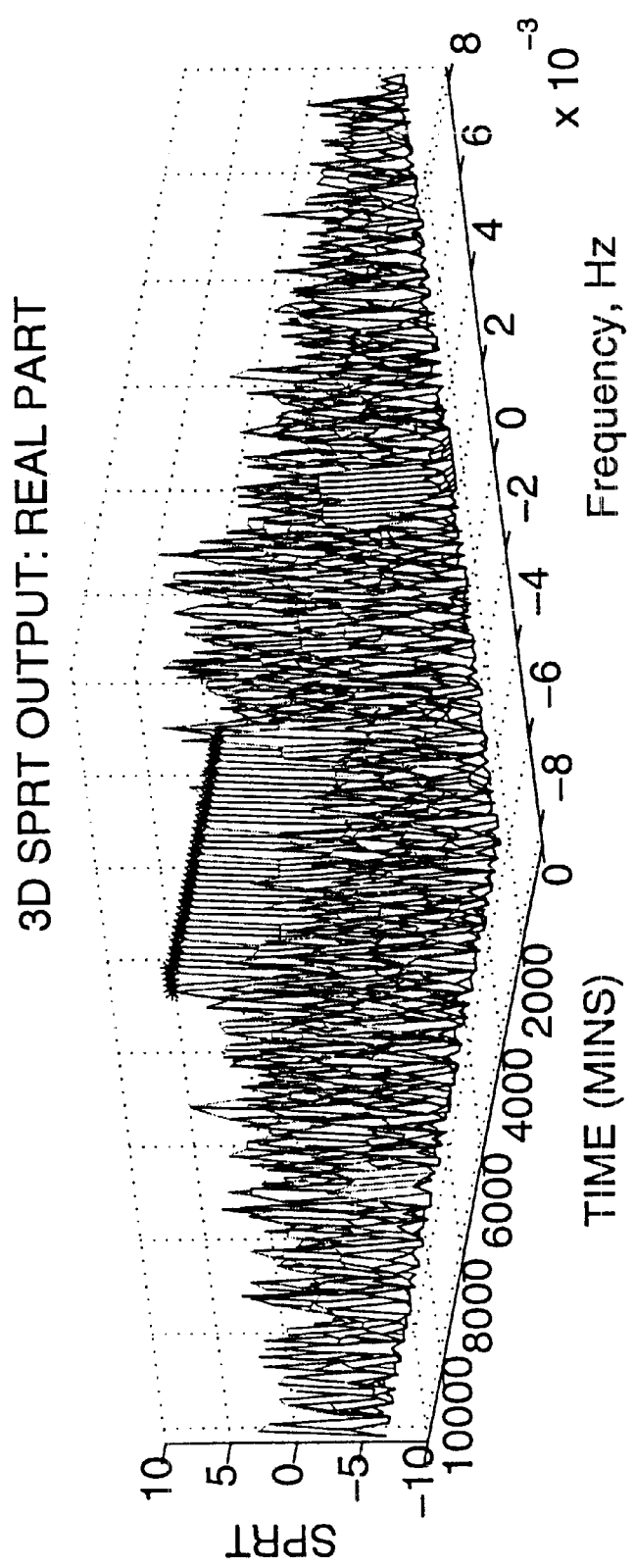
FIG. 19C illustrates a three-dimensional combined probabilistic SPRT time domain and PSD frequency domain analysis of the real part of the Fourier transform of the data of FIG. 19A.
Figure 20A:
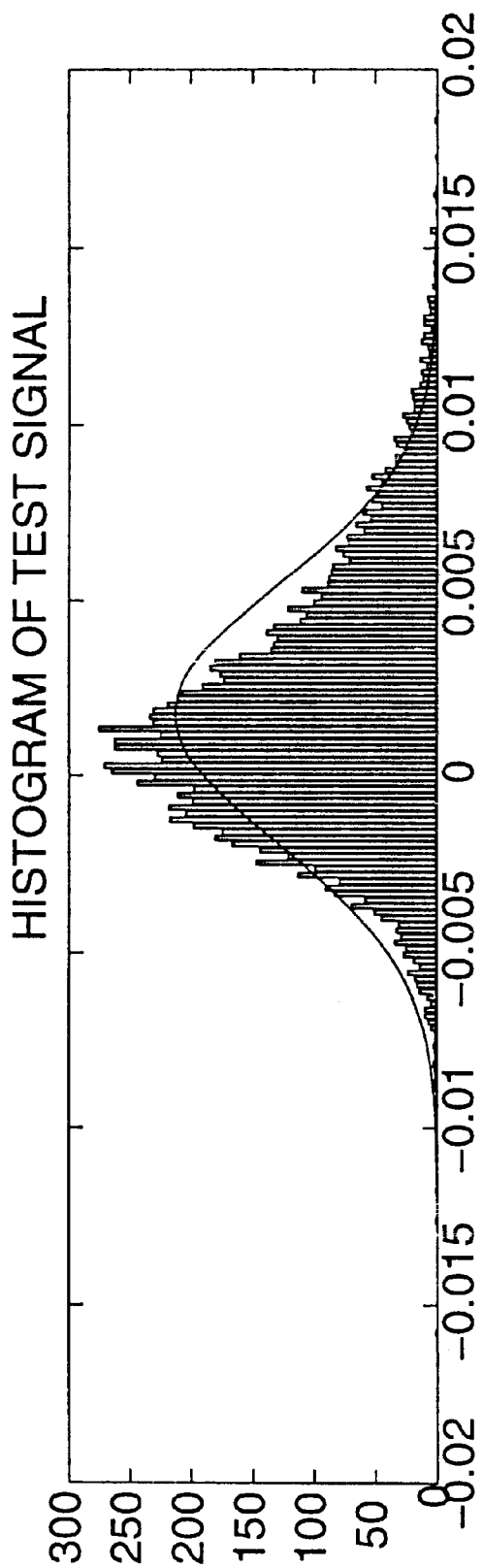
FIG. 20A illustrates a histogram of the deviation from the mean of the signal of FIG. 19A.
Figure 20B:
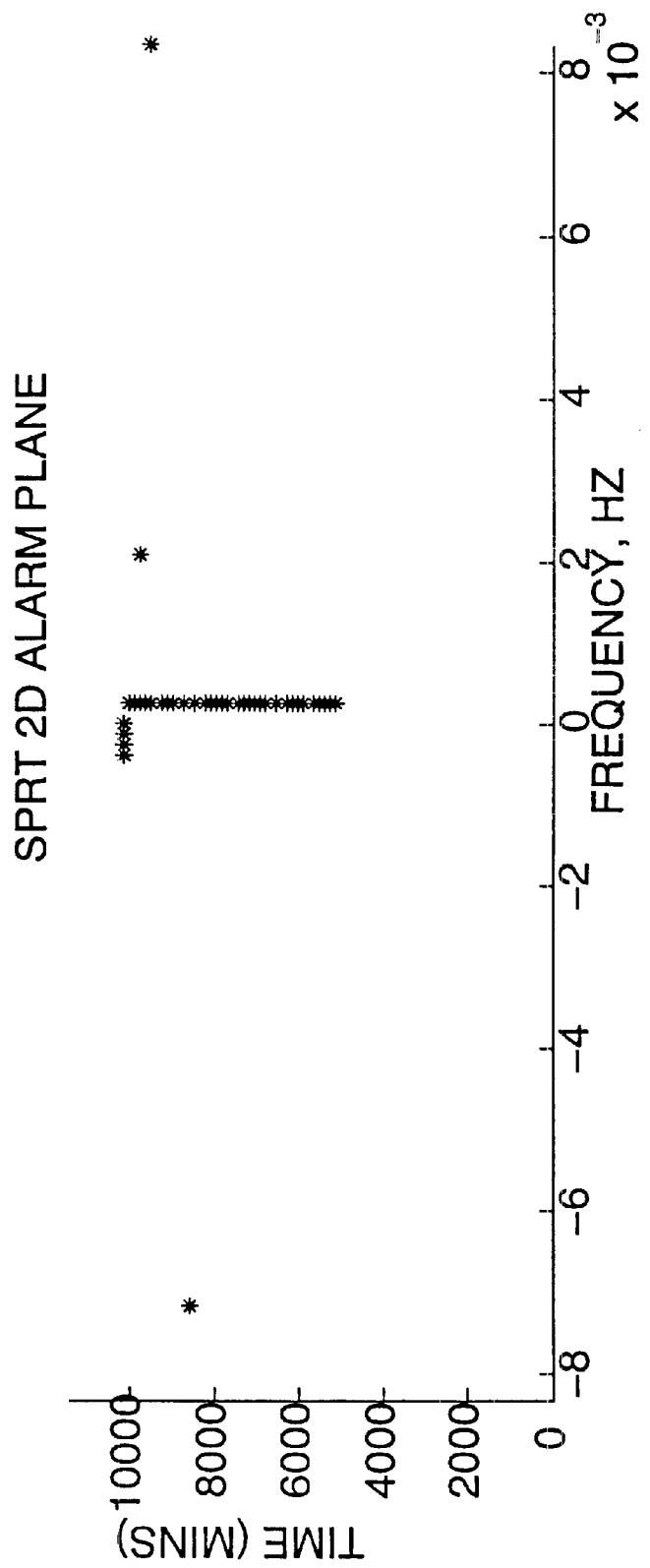
FIG. 20B illustrates the two-dimensional SPRT alarm plane spectrum using only the imaginary part of the PSD spectrum of the Fourier transform of the data of FIG. 19A.
Figure 20C:
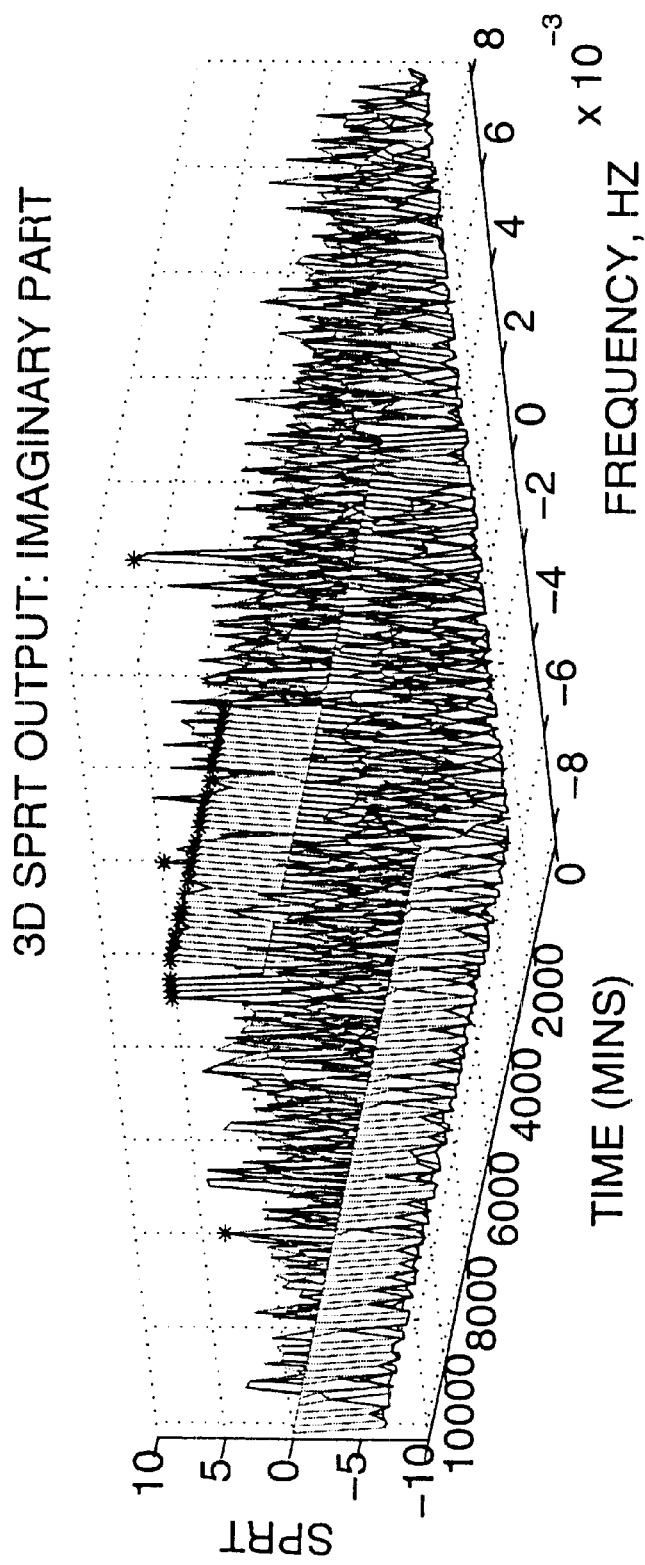
FIG. 20C illustrates a three-dimensional combined probabilistic SPRT time domain and PSD frequency domain analysis of the imaginary part of the Fourier transform of the data of FIG. 19A.

In FIG. 19A a slowly changing calibration bias is introduced into the signal of FIG. 16A. FIG. 19A shows the histogram of the accelerometer signal with the linearly increasing bias, and the histogram is skewed to the positive side due to the increase in the number of positive samples in the accelerometer signal when a bias is added. The bias begins at minute 5000 with a starting value of zero and continues to increase linearly until minute 10,000 to a final value of 0.008. In FIG. 19B is shown the two-dimensional SPRT alarm plane which results when using only the real part of the Fourier transform. In this case the SPRT alarms begin just after the 5000 minute point near the zero frequency component indicating that the mean of the signal is slowly changing over time. FIG. 19C shows the analogous three-dimensional SPRT plot. FIGS. 20B and C show the analogous results using only the imaginary part of the Fourier transform. Again, the alarms start just after minute 5000 near the zero frequency component, indicating the presence of a slowly increasing bias within the accelerometer signal.

Figure 21B:
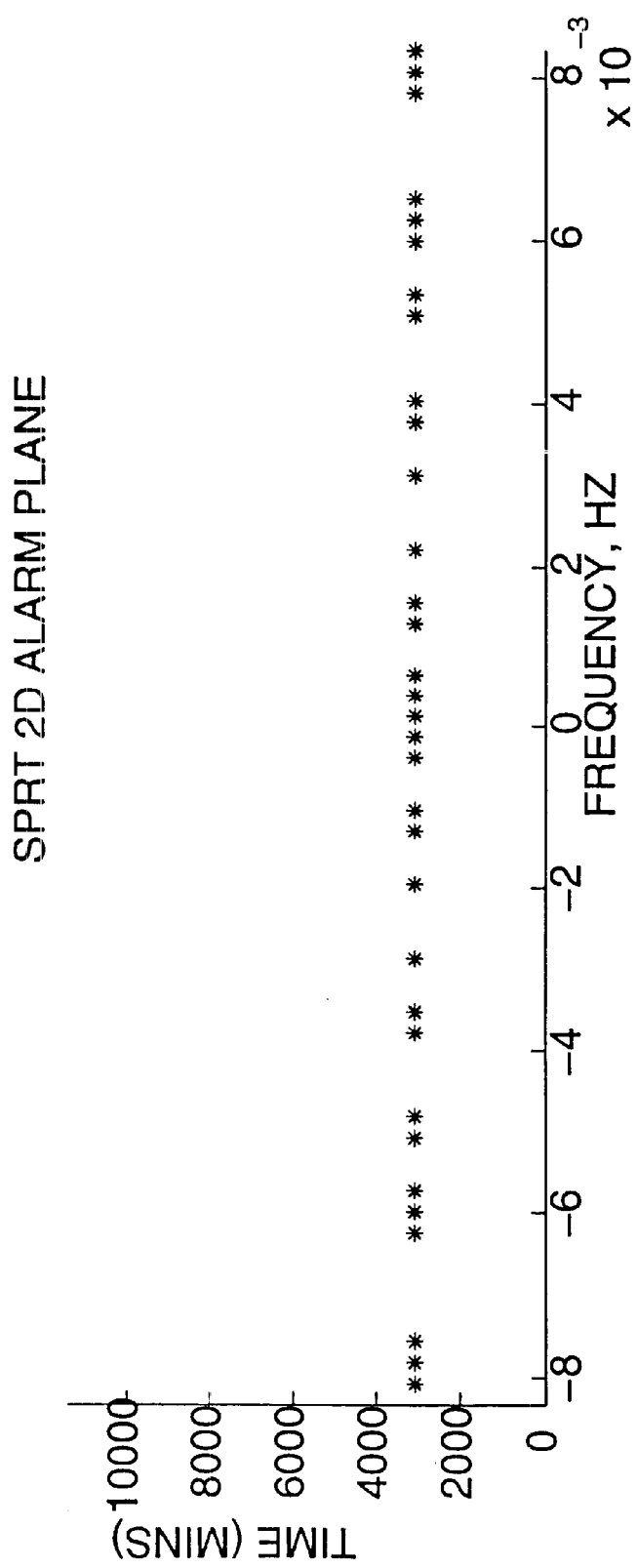
FIG. 21B illustrates the two-dimensional SPRT alarm plane spectrum using only the real part of the PSD spectrum of the Fourier transform of the data of FIG. 21A.
Figure 21C:
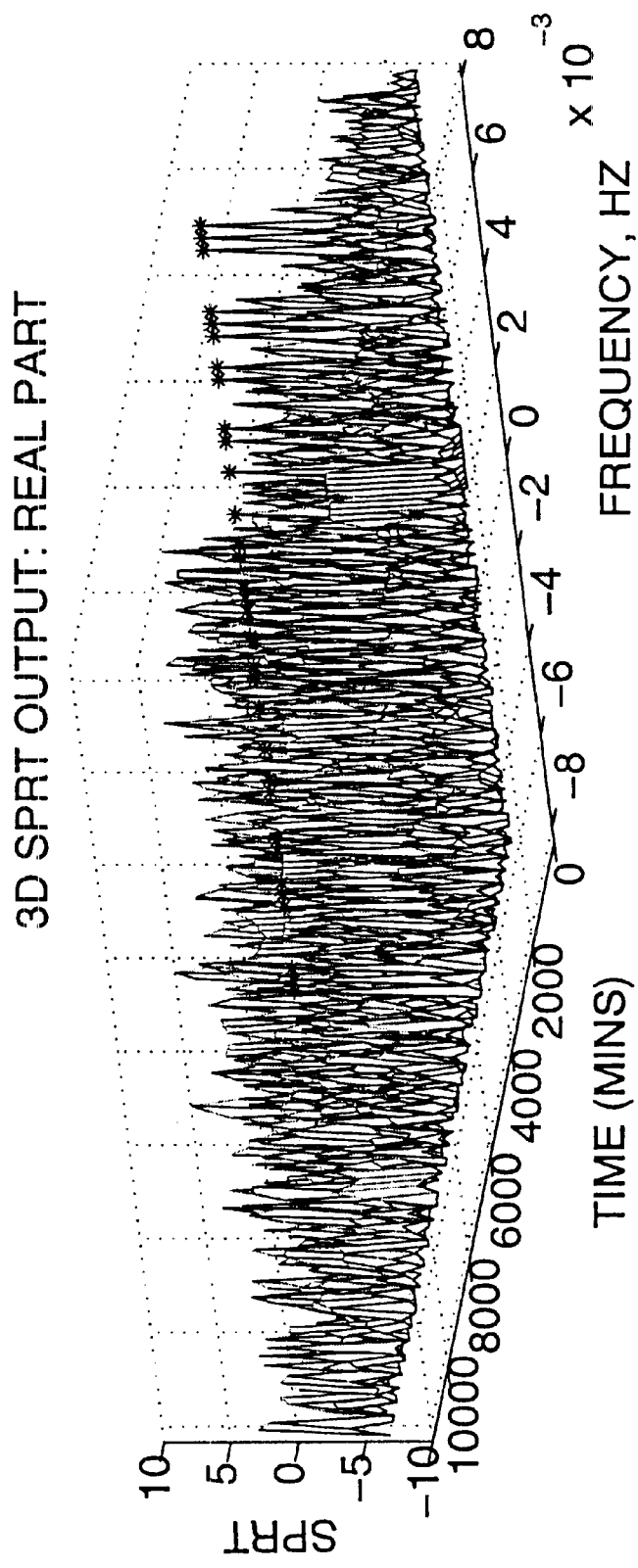
FIG. 21C illustrates a three-dimensional combined probabilistic SPRT time domain and PSD frequency domain analysis of the real part of the Fourier transform of the data of FIG. 21A.
Figure 22A:
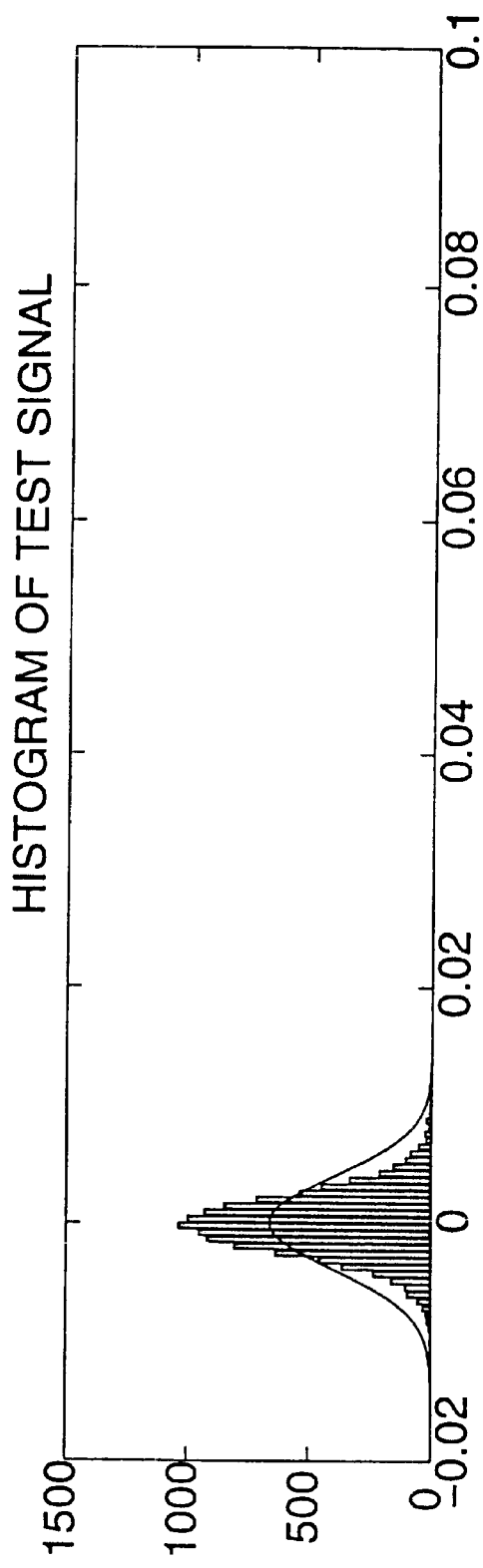
FIG. 22A illustrates a portion of the histogram of the deviation from the mean of the signal of FIG. 21A.
Figure 22B:
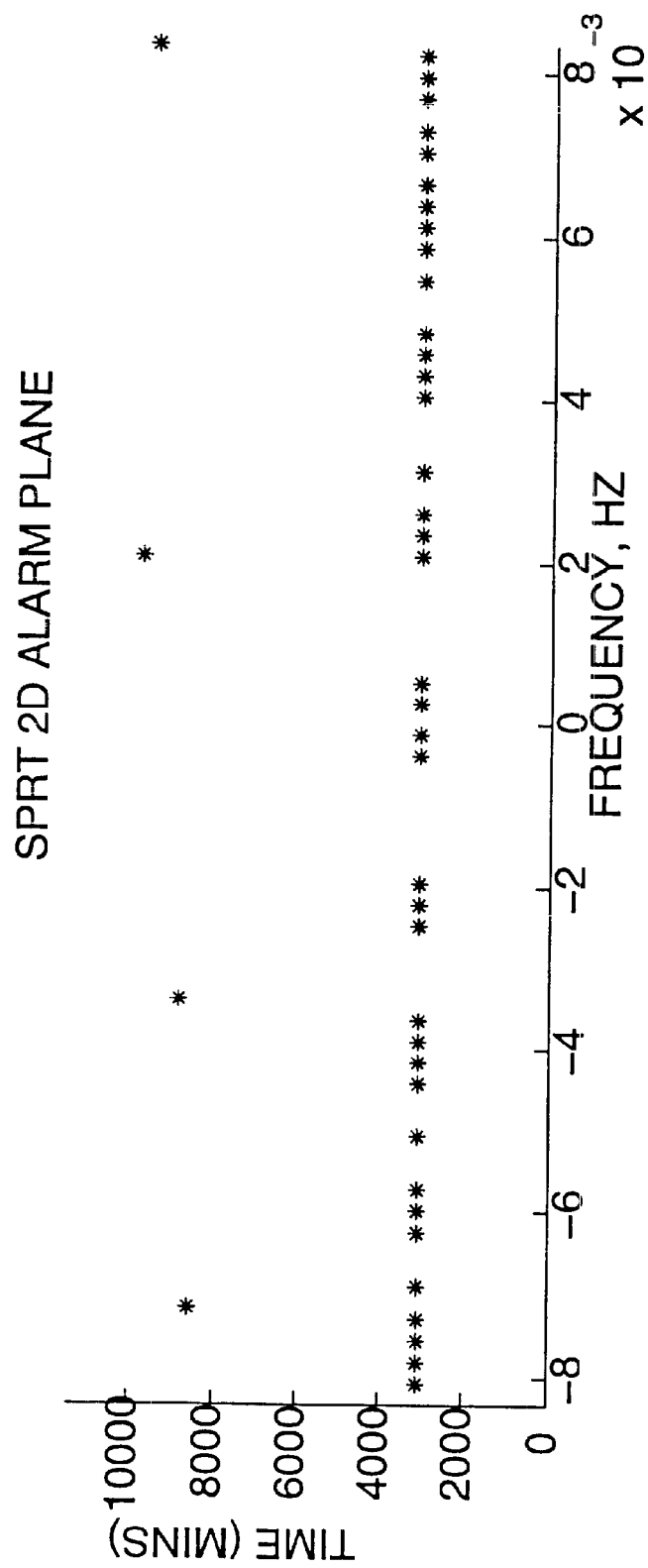
FIG. 22B illustrates the two-dimensional SPRT alarm plane spectrum using only the imaginary part of the PSD spectrum of the Fourier transform of the data of FIG. 22A.
Figure 22C:
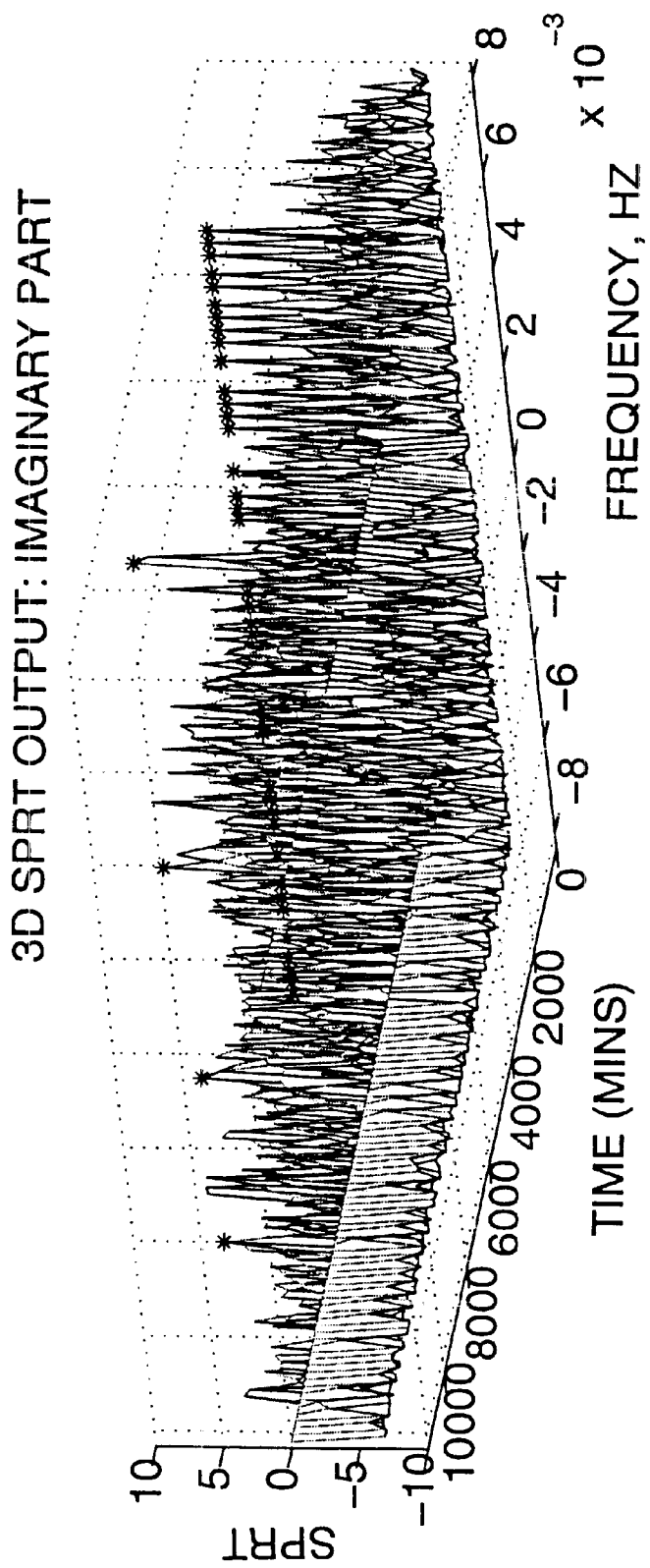
FIG. 22C illustrates a three-dimensional combined probabilistic SPRT time domain and PSD frequency domain analysis of the imaginary part of the Fourier transform of the data of FIG. 21A.

In FIG. 21A an intermittent impulse or spike is applied to the accelerometer signal of FIG. 16A. The spike in the signal has a width of twenty-one samples and occurs at minute 3000. In FIGS. 21B and 21C there are SPRT alarms across most of the frequency components of the real part of the Fourier transform at minute 3000. This implies that the Fourier transform had nonzero contributions from all frequencies at this tine which is consistent with the ideal Fourier transform of a spike. The analogous results for the imaginary part of the Fourier transform shown in the middle and bottom plots of FIGS. 22B and 22C agree with the results for the real part. FIG. 22A is the histogram of the data with the impulse disturbance. When compared to a Gaussian distribution (superimposed) the kurtosis appears much smaller; however, this is an artifact of having outliers in the data in the form of an impulse. If the impulse was ignored, the histogram would fall on top of the Gaussian curve.

Figure 23A:
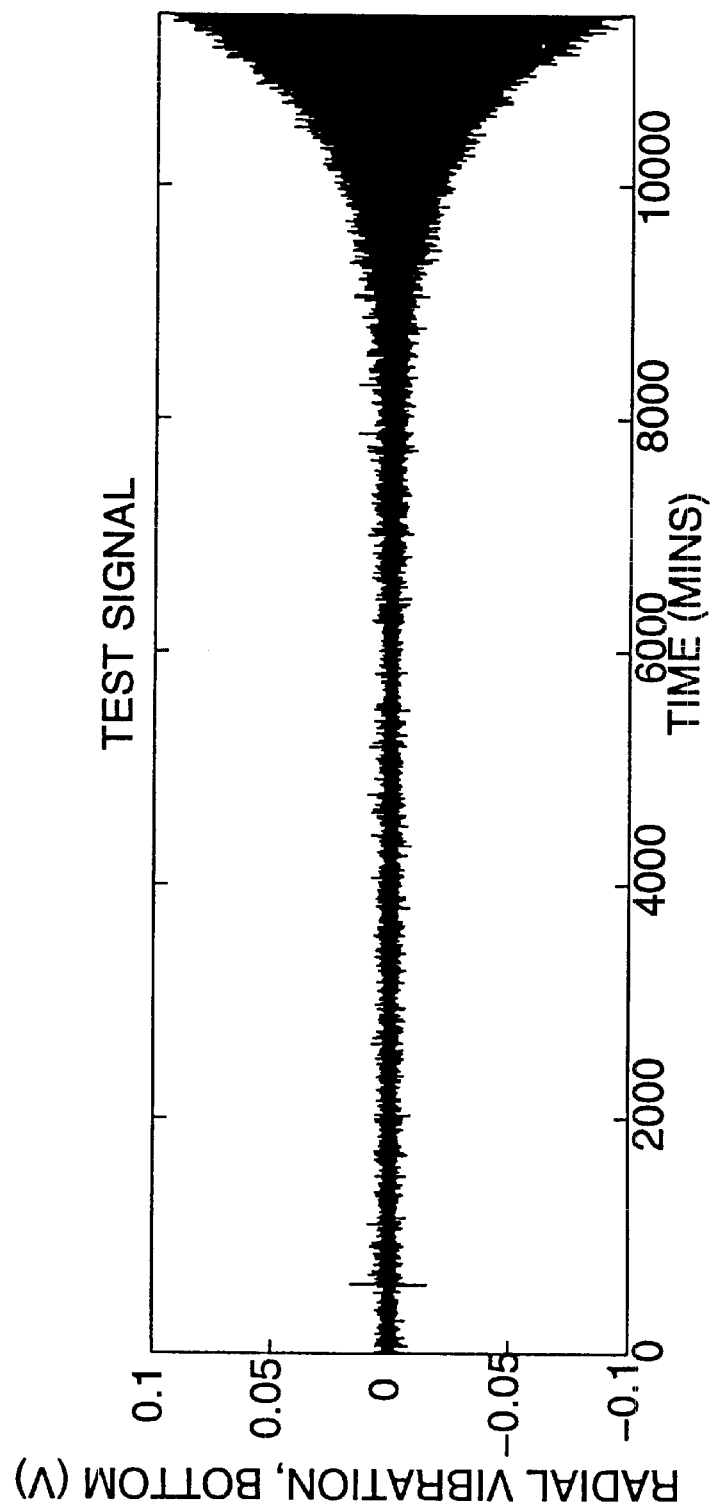
FIG. 23A illustrates a signal with an exponentially increasing harmonic disturbance imposed on the signal of FIG. 16A.
Figure 23B:
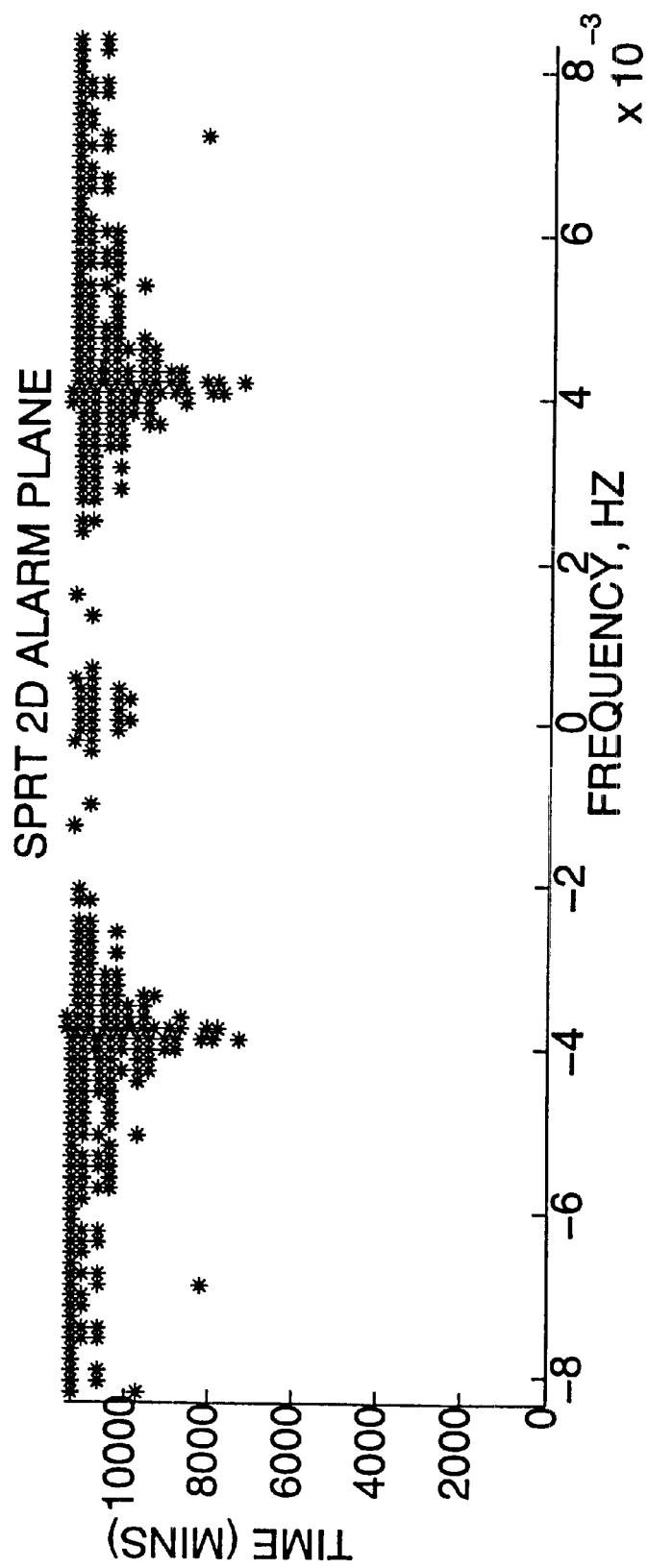
FIG. 23B illustrates the two-dimensional SPRT alarm plane spectrum using only the real part of the PSD spectrum of the Fourier transform of the data of FIG. 23A.
Figure 23C:
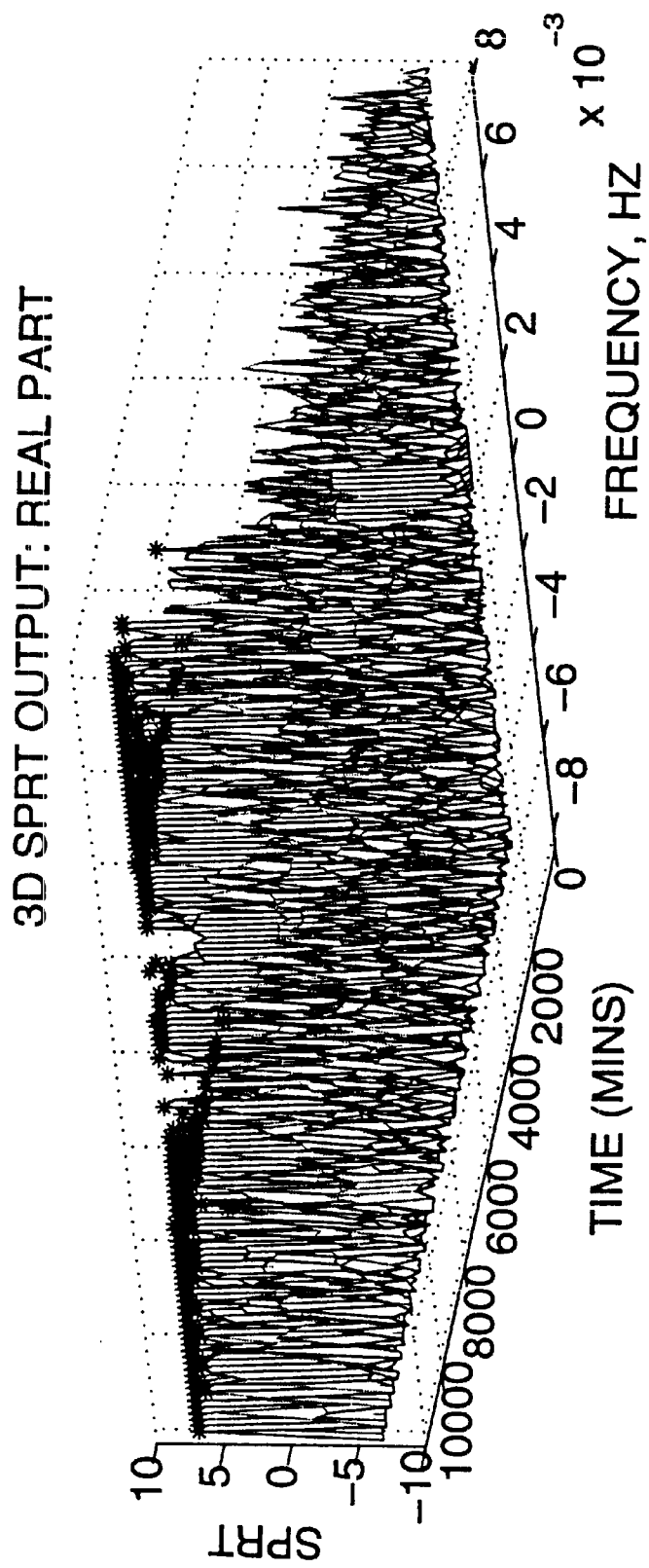
FIG. 23C illustrates a three-dimensional combined probabilistic SPRT time domain and PSD frequency domain analysis of the real part of the Fourier transform of the data of FIG. 23A.
Figure 24A:
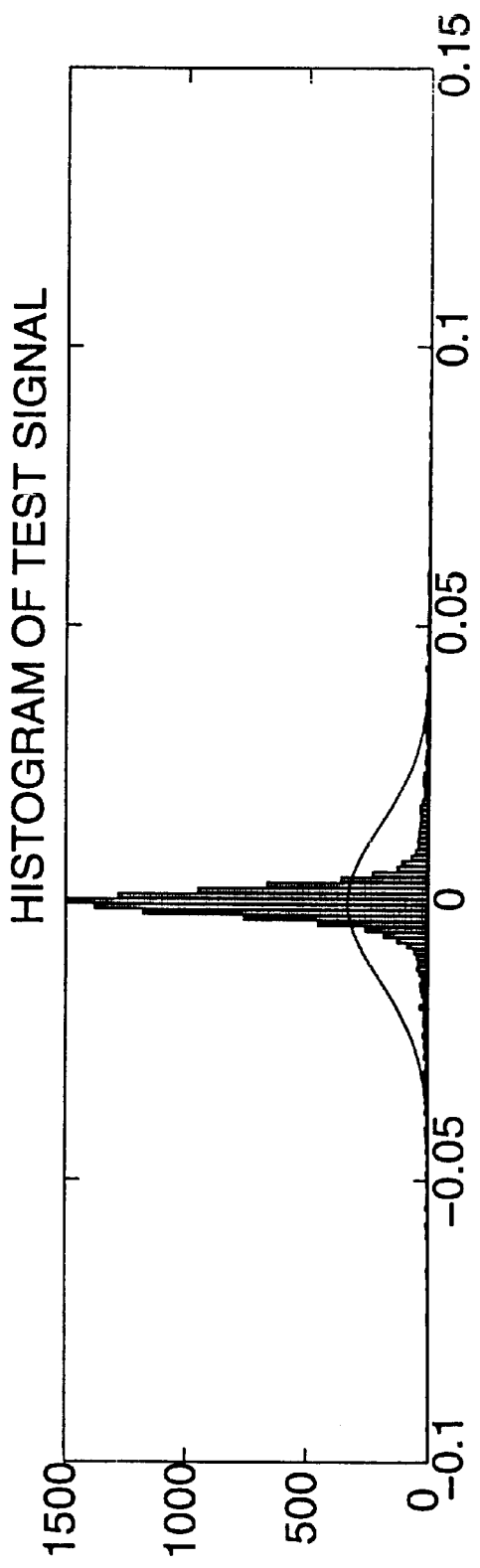
FIG. 24A illustrates a histogram of the deviation from the mean of the signal of FIG. 23A.
Figure 24B:
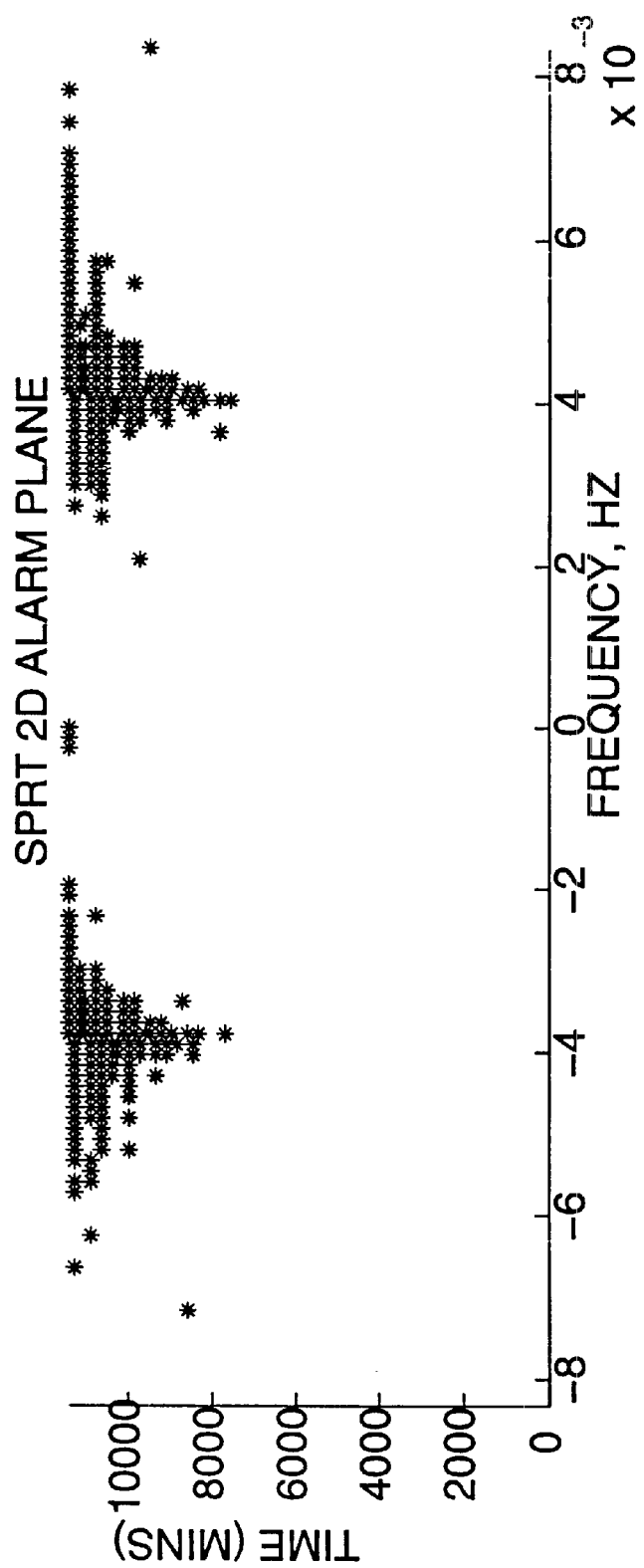
FIG. 24B illustrates the two-dimensional SPRT alarm plane spectrum using only the imaginary part of the PSD spectrum of the Fourier transform of the data of FIG. 23A.
Figure 24C:
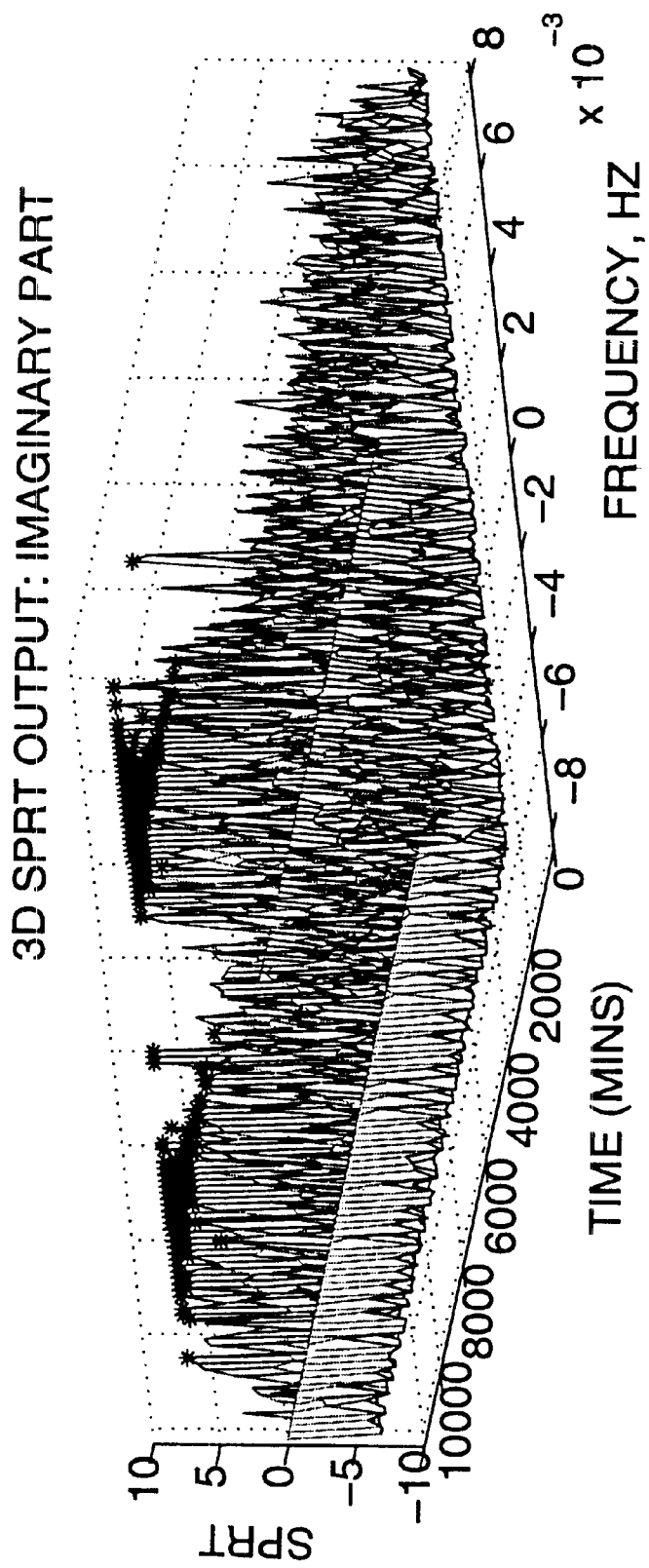
FIG. 24C illustrates a three-dimensional combined probabilistic SPRT time domain and PSD frequency domain analysis of the imaginary part of the Fourier transform of the data of FIG. 23A.

In another aspect of the invention the methodology of combining probabilistic tests with frequency domain spectra can be very useful for showing how a disturbance changes over time. For example, when using SPRT as the example probabilistic test, a unique pattern is produced in the SPRT alarm plane depending on how the frequencies and magnitudes of a disturbance change over time. This makes it possible to exploit the three-dimensional SPRT, not only for sensitive annunciation of the incipience of a disturbance, but also to characterize and categorize disturbances on the bases of features produced in the three-dimensional SPRT index surfaces. Therefore, in FIGS. 23A–C and 24A–C a changing magnitude signal and its effect are illustrated. In FIG. 23A the accelerometer signal has a sinusoidal disturbance introduced into the signal of FIG. 16A that has a magnitude changing exponentially over time. The time constant of the exponent is 0.001. FIG. 23A shows the behavior of the three-dimensional SPRT as the magnitude of the sinusoidal disturbance grows. When the sinusoid is first apparent (approximately 7000 minutes) the three-dimensional SPRT shows alarms in a narrow frequency band implying that a purely sinusoidal component may be present. However, as the exponential component becomes more dominant the alarms occur in wider and wider frequency bands which means that the sinusoidal disturbance is growing very quickly.

Figure 25A:
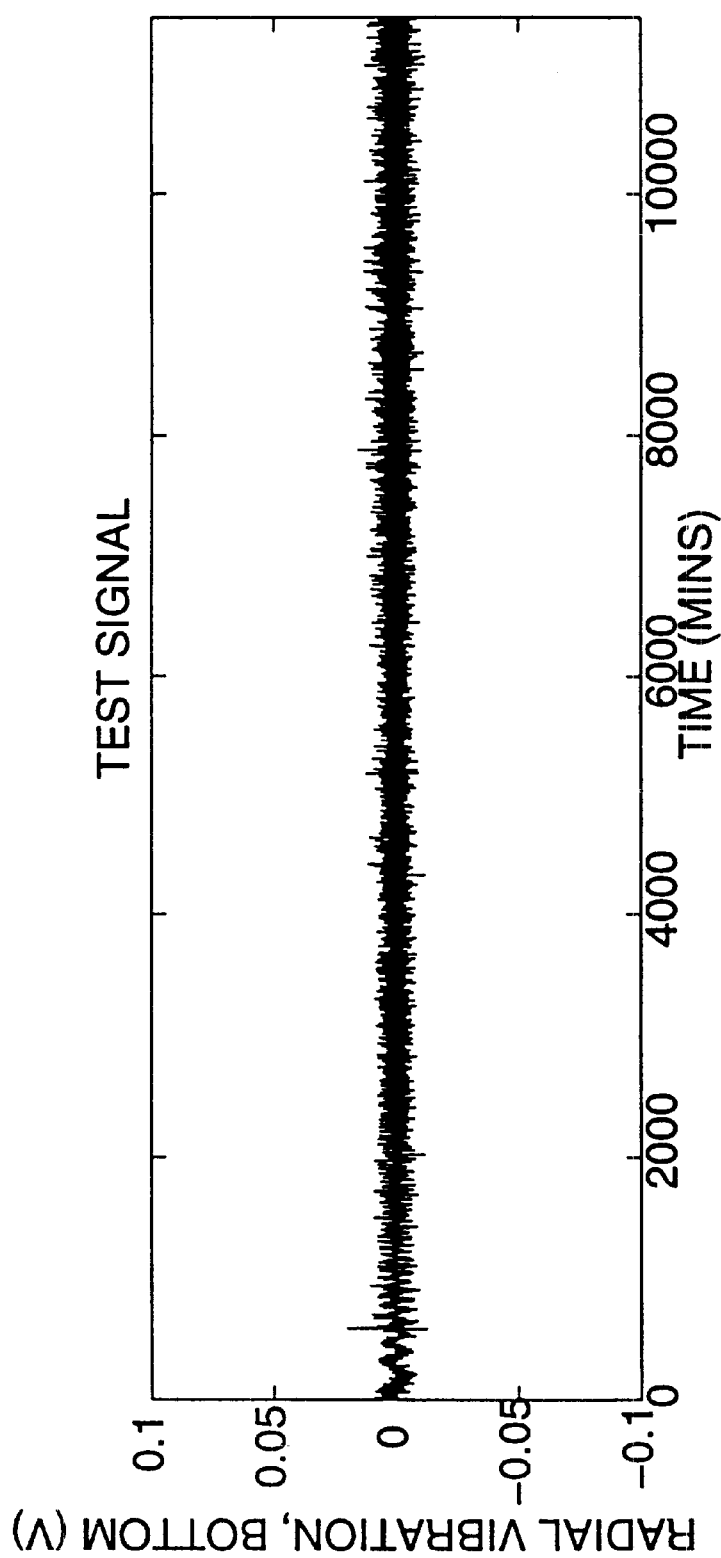
FIG. 25A illustrates a signal with a harmonic disturbance with a linearly changing frequency imposed on the signal of FIG. 16A.
Figure 25B:
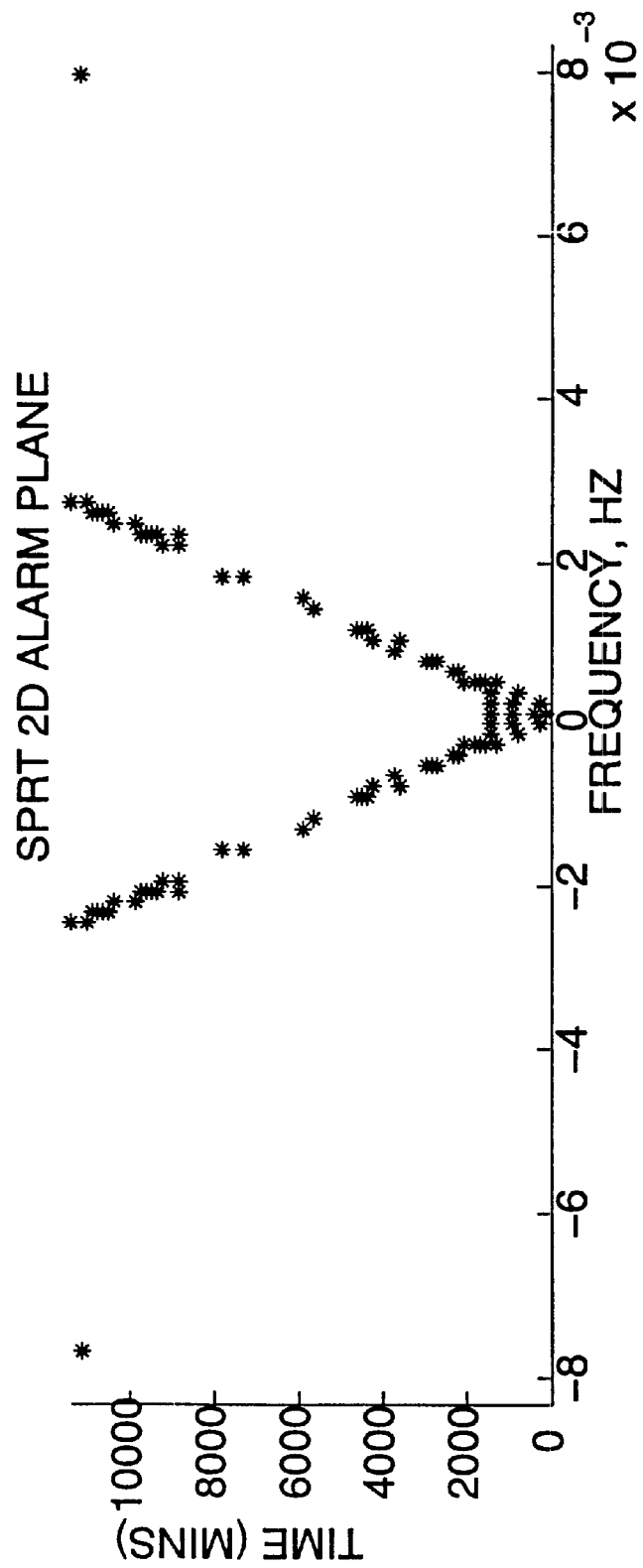
FIG. 25B illustrates the two-dimensional SPRT alarm plane spectrum using only the real part of the PSD spectrum of the Fourier transform of the data of FIG. 25A.
Figure 25C:
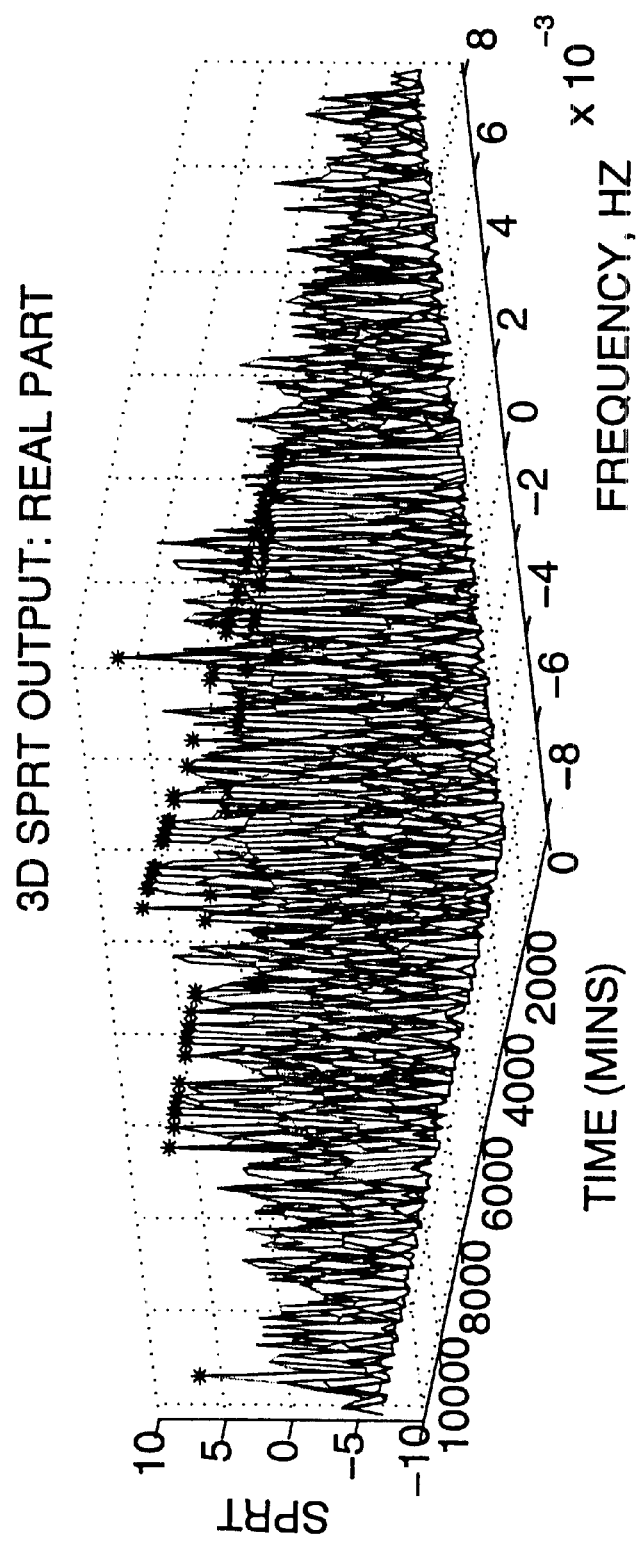
FIG. 25C illustrates a three-dimensional combined probabilistic SPRT time domain and PSD frequency domain analysis of the real part of the Fourier transform of the data of FIG. 25A.
Figure 26A:
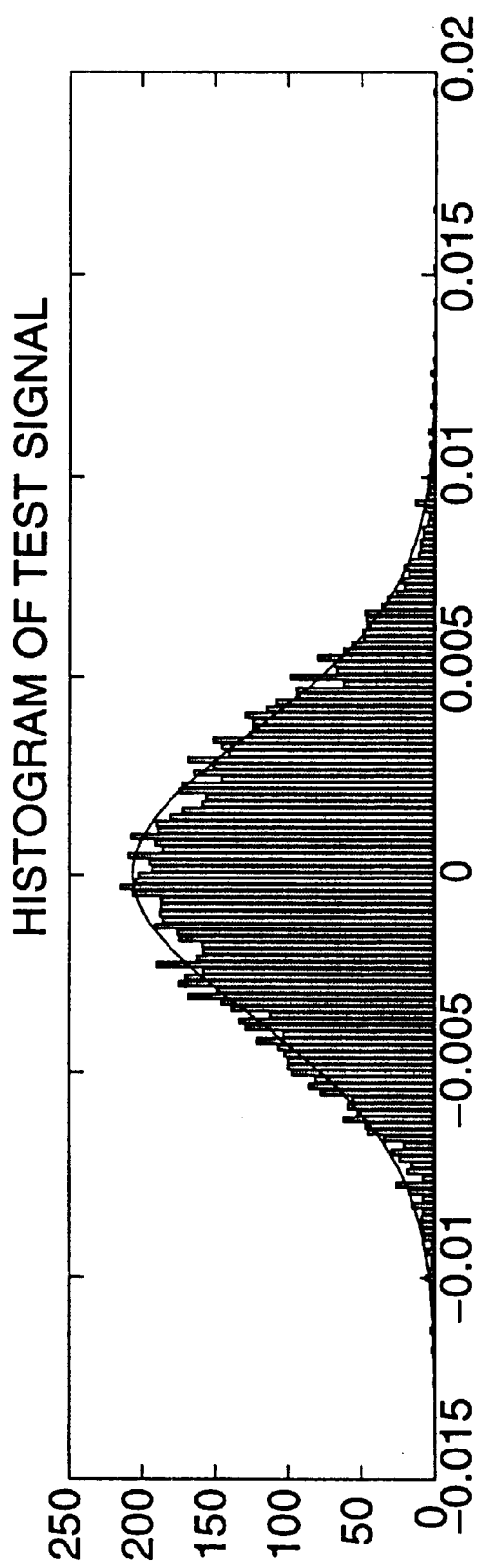
FIG. 26A illustrates a histogram of the deviation from the mean of the signal of FIG. 25A.
Figure 26B:
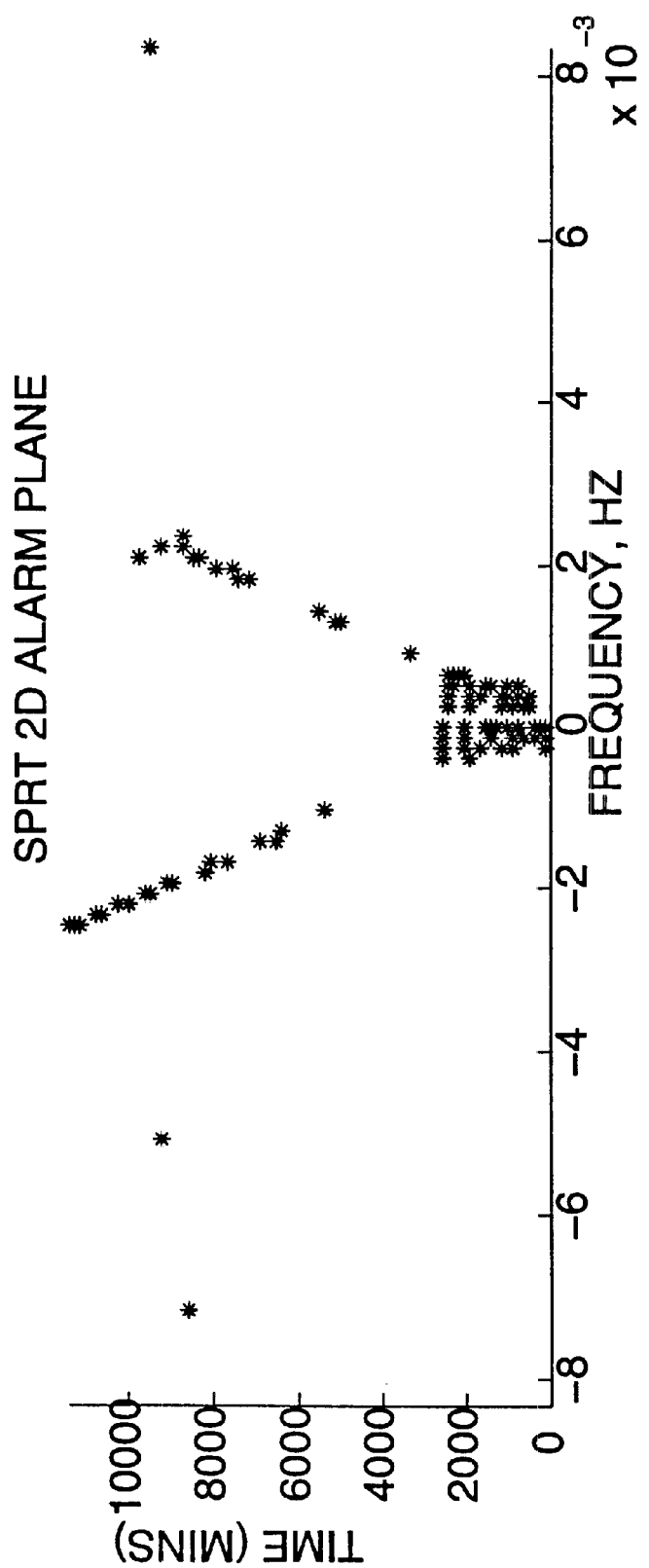
FIG. 26B illustrates the two-dimensional SPRT alarm plane spectrum using only the imaginary part of the PSD spectrum of the Fourier transform of the data of FIG. 25A.
Figure 26C:
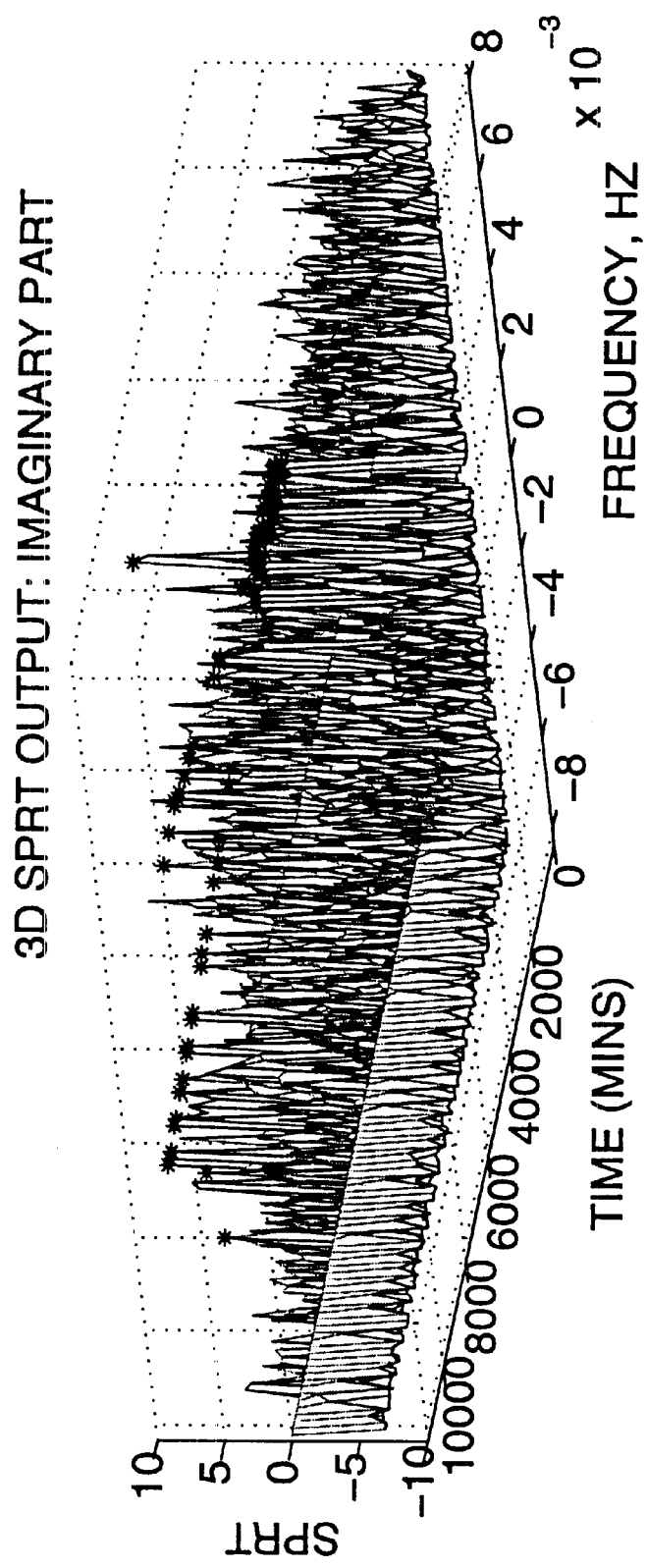
FIG. 26C illustrates a three-dimensional combined probabilistic SPRT time domain and PSD frequency domain analysis of the imaginary part of the Fourier transform of the data of FIG. 25A.

In another example in FIGS. 25A–C and 26A–C a disturbance that changes frequency over time is introduced into the base data of FIG. 16A. This disturbance is introduces into the accelerometer signal of FIG. 16A with a linearly increasing frequency over the length of the signal. FIG. 25A shows the plot of the accelerometer signal with the disturbance included. FIGS. 25B and C show the three-dimensional SPRT results for the real part of the Fourier transform. The increasing frequency is evidenced by the slanted lines in the SPRT alarm plane. In FIGS. 26B and C the same general type of characteristics are shown for the imaginary part of the Fourier transform.

In a broader sense the concepts embodied herein can be applied to any manner of spectral problem, such as infrared, electron paramagnetic, NMR, Raman, ESR, fluorescence, UV, thermogram, absorption, bioluminescence, acoustic resonance and the like. In these applications a human user wants to compare a measured spectrum with a "reference" spectrum that would be (1) produced by a standard reference source, or (2) a so-called background spectrum that is obtained during a time of "normal" operation. In either case (1) or (2) it is of interest to determine with high sensitivity and low false-alarm probability whether the newly measured spectrum differs significantly from the reference spectrum. This has most often been a subjective judgement task for humans. For all known prior art systems, if one seeks to maximize the sensitivity of the system, it is done at the expense of increasing the rate of false alarms. Conversely, if false alarms carry a large economic penalty (i.e. distracting an operator's attention, unnecessarily shutting down a plant or piece of equipment, falsely rejecting manufactured items that should meet quality assurance specifications), and one seeks to minimize the false alarm probability, one does so by sacrificing sensitivity for actual spectral deviations, which can then bring penalties of decreased safety margins, poorer product quality, and the like. The SPRT system and method of the invention accomplishes the above surveillance objectives and maximizes the sensitivity for annunciation of subtle discrepancies between the reference and measured spectra, while simultaneously minimizing the probability for false alarms.

In a method of the invention one of the preferred probabilistic methods of processing frequency spectrum data is by the sequential probability ratio test (SPRT). This SPRT method has been used previously to process database information obtained from industrial process sensors, to accumulate reliable data and also to modify or terminate degrading or anomalous processes. This SPRT method can thus be applied to an incoming data stream to prevalidate the data or applied to an existing database can be analyzed to remove faulty data. The database sensor signals can therefore be used for research purposes as well as to manipulate input data to the SPRT technique. Details of this process and the related inventions therein are disclosed in U.S. Pat. Nos. 5,459,675; 5,410,492, and 5,223,207 which are incorporated by reference herein in their entirety with regard to the SPRT process. The procedures followed in a preferred method are shown generally in FIGS. 8A and 8B. In performing such a preferred analysis of the sensor signals, a dual transformation method is performed, insofar as it entails both a frequency-domain transformation of the original time-series data and a subsequent time-domain transformation of the resultant data. The data stream that passes through the dual frequency-domain, time-domain transformation is then processed with the SPRT procedure, which uses a log-likelihood ratio test.

In the preferred embodiment, successive data observations are performed on a discrete process Y, which represents a comparison of the stochastic components of physical processes monitored by a sensor, and most preferably pairs of sensors. In practice, the Y function is obtained by simply differencing the digitized data signals from two respective sensors. Let yκ represent a data sample from the process Y at time $t_k$. During normal operation with an undergraded physical system and with sensors that are functioning within specifications the $y_k$ should be normally distributed with mean of zero. Note that if the two data signals being compared do not have the same nominal mean values (due, for example, to differences in calibration), then the input signals will be pre-normalized to the same nominal mean values during initial operation.

In performing the monitoring of industrial processes an incoming data stream can be validated or an existing database can be validated. The system's purpose is to declare data from a first system or a second system degraded if the drift in Y is sufficiently large that the sequence of observations appears to be distributed about a mean $+M$ or $-M$, where M is our pre-assigned system-disturbance magnitude. We would like to devise a quantitative framework that enables us to decide between two hypotheses, namely:

$H_1$: Y is drawn from a Gaussian probability distribution function ("PDF") with mean M and variance $\sigma^9$.

$H_2$: Y is drawn from a Gaussian PDF with mean 0 and variance $\sigma^2$

We will suppose that if $H_1$ or $H_2$ is true, we wish to decide for $H_1$ or $H_2$ with probability $(1-\beta)$ or $(1-\alpha)$, respectively, where a and 13 represent the error (misidentification) probabilities. From the conventional, well-known theory of Wald, the test depends on the likelihood ratio b where $$1_n = \frac{\text{The probability of observed sequence } y_1, y_2 \ldots, y_n \text{ given } H_1 \text{ true}}{\text{The probability of observed sequence } y_1, y_2 \ldots, y_n \text{ given } H_2 \text{ true}} \quad (1)$$

After "n" observations have been made, the sequential probability ratio is just the product of the probability ratios for each step:

$$1_n = (PR_1) \cdot (PR_2) \cdot \ldots \cdot (PR_n) \quad (2)$$

or $$1_n = \prod_{i=1}^{l=n} \frac{f(y_1 \mid H_1)}{f(y_1 \mid H_2)} \quad (3)$$

where f(y=H) is the distribution of the random variable y.

Wald's theory operates as follows: Continue sampling as long as $A < 1_n < B$. Stop sampling and decide $H_1$ as soon as $1_n \geq B$ and stop sampling and decide $H_2$ as soon as $1_n \leq A$. The acceptance thresholds are related to the error (misidentification) probabilities by the following expressions:

$$A = \frac{\beta}{1-\alpha}, \text{ and } B = \frac{1-\beta}{\alpha} \quad (4)$$

The (user specified) value of a is the probability of accepting $H_1$ when $H_2$ is true (false alarm probability). $\beta$ is the probability of accepting $H_2$ when $H_1$ is true (missed alarm probability).

If we can assume that the random variable $y_k$ is normally distributed, then the likelihood that Hi is true (i.e., mean M, variance $\sigma^2$) is given by:

$$L(y_1, y_2 \ldots, y_n \mid H_1) = \frac{1}{(2\pi)^{n/2} \sigma^n} \exp\left[-\frac{1}{2\sigma^2}\left(\sum_{k=1}^{n} y_k^2 - 2\sum_{k=1}^{n} y_k M + \sum_{k=1}^{n} M^2\right)\right] \quad (5)$$

Similarly for $H_2$ (mean 0, variance $\sigma^2$):

$$L(y_1, y_2 \ldots, y_n \mid H_2) = \frac{1}{(2\pi)^{n/2} \sigma^n} \exp\left(-\frac{1}{2\sigma^2}\sum_{k=1}^{n} y_k^2\right) \quad (6)$$

The ratio of (5) and (6) gives the likelihood ratio $1_n$ $$1_n = \exp\left[-\frac{1}{2\sigma^2}\sum_{k=1}^{n} M(M - 2y_k)\right] \quad (7)$$

Combining (4) and (7), and taking natural logs gives $$1_n \frac{\beta}{1-\alpha} < \frac{-1}{2\sigma^2} \sum_{k=1}^{n} M(M - 2y_k) < 1_n \frac{(1-\beta)}{\alpha} \quad (8)$$

Our sequential sampling and decision strategy can be concisely represented as:

$$\text{If } 1_n \leq 1_n \frac{\beta}{1-\alpha}, \text{ Accept } H_2 \quad (9)$$

$$\text{If } 1_n \frac{\beta}{1-\alpha} < l_n < 1_n \frac{1-\beta}{\alpha}, \text{ Continue Sampling} \quad (10)$$

$$\text{And if } 1_n \geq 1_n \frac{1-\beta}{\alpha}, \text{ Accept } H_1 \quad (11)$$

Following Wald's sequential analysis, it is conventional that a decision test based on the log likelihood ratio has an optimal property; that is, for given probabilities a and β there is no other procedure with at least as low error probabilities or expected risk and with shorter length average sampling time.

A primary limitation that has heretofore precluded the applicability of Wald-type binary hypothesis tests for sensor and equipment surveillance strategies lies in the primary assumption upon which Wald's theory is predicated; i.e., that the original process Y is strictly "white" noise, independently distributed random data. Such white noise can, for example, include Gaussian noise. It is, however, very rare to find physical process data associated with operating machinery or other industrial processes that are not contaminated with serially-correlated, deterministic noise components. Such serially correlated noise components include for example, auto-correlated and Markov dependent noise. This invention can overcome this limitation to conventional surveillance strategies by integrating the Wald sequential-test approach with a new dual transformation technique. This symbiotic combination of frequency-domain transformations and time-domain transformations produces a tractable solution to a particularly difficult problem that has plagued signal-processing specialists for many years.

Figure 8A:
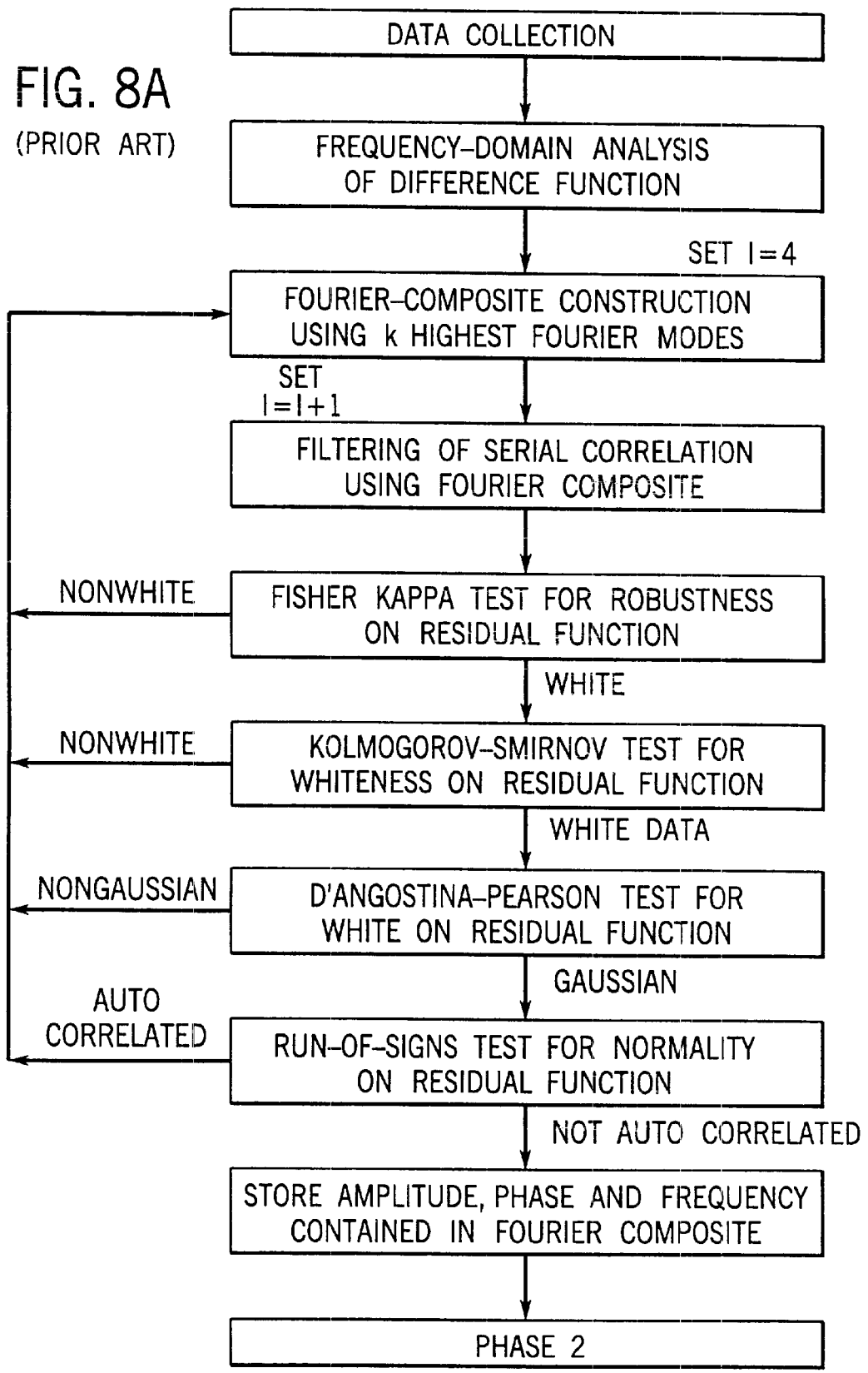
FIGS. 8A and 8B illustrates a schematic functional flow diagram with FIG. 8A showing a prior art illustration of a first phase of the method of SPRT prior art and FIG. 8B shows the application of one aspect of the prior art SPRT portion of the invention.
Figure 8B:
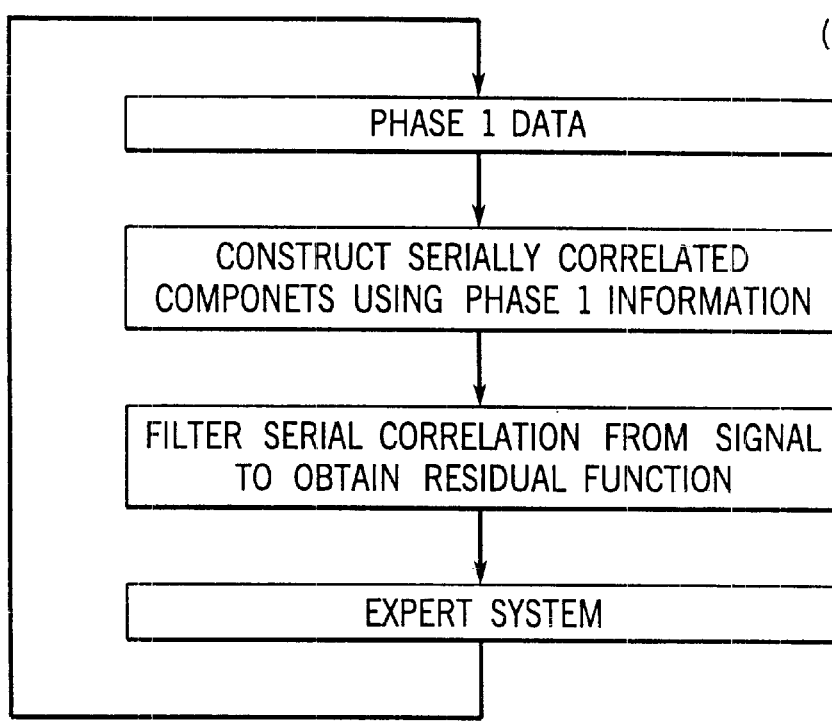

In the preferred method shown in detail in FIGS. 8A and 8B, serially-correlated data signals from an industrial process can be rendered amenable to the SPRT testing methodology described hereinbefore. This is preferably done by performing a frequency-domain transformation of the original difference function Y. A particularly preferred method of such a frequency transformation is accomplished by generating a Fourier series using a set of highest "1" number of modes. Other procedures for rendering the data amenable to SPRT methods includes, for example, auto regressive techniques, which can accomplish substantially similar results described herein for Fourier analysis. In the preferred approach of Fourier analysis to determine the "1" highest modes (see FIG. 8A):

$$Y_t = \frac{a_o}{2} + \sum_{m=1}^{N/2} (a_m \cos\omega_m t + b_m \sin\omega_m t) \quad (12)$$

where $a_o/2$ is the mean value of the series, $a_m$ and $b_m$ are the Fourier coefficients corresponding to the Fourier frequency $\omega_m$, and N is the total number of observations. Using the Fourier coefficients, we next generate a composite function, $X_t$, using the values of the largest harmonics identified in the Fourier transformation of $Y_t$. The following numerical approximation to the Fourier transform is useful in determining the Fourier coefficients $a_m$, and m. Let $x_j$ be the value of $X_t$ at the jth time increment. Then assuming $2\pi$ periodicity and letting $\omega_m = 2\rho m/N$, the approximation to the Fourier transform yields:

$$a_m = \frac{2}{N}\sum_{j=0}^{N-1} x_j \cos\omega_m j \quad b_m = \frac{2}{N}\sum_{j=0}^{N-1} x_j \sin\omega_m j \quad (13)$$

for 0<m<N/2. Furthermore, the power spectral density ("PSD") function for the signal is given by $1_m$ where $$1_m = Na_m^2 + \frac{b_m^2}{2} \quad (14)$$

To keep the signal bandwidth as narrow as possible without distorting the PSD, no spectral windows or smoothing are used in our implementation of the frequency-domain information. In analysis of data from a pumping system of the EBR-II reactor of Argonne National Laboratory (West), the Fourier modes corresponding to the eight highest lm provide the amplitudes and frequencies contained in $X_t$. In our investigations for the particular pumping system data accumulated, the highest eight $1_m$ modes were found to give an accurate reconstruction of $X_t$, while reducing most of the serial correlation for the physical variables studied. In other industrial processes, the analysis could result in more or fewer modes being needed to accurately construct the fractional behavior of a composite curve. Therefore, the number of modes used is a variable which is iterated to minimize the degree of nonwhite noise for any given application. As noted in FIG. 8A a variety of noise tests are applied in order to remove serially correlated noise.

The reconstruction of $X_1$ uses the general form of Eqn. (12), where the coefficients and frequencies employed are those associated with the eight highest PSD values. This yields a Fourier composite curve (see end of flowchart in FIG. 8A) with essentially the same correlation structure and the same mean as $Y_t$. Finally, we generate a discrete residual function $R_t$ by differencing corresponding values of $Y_t$ and $Y_t$. This residual function, which is substantially devoid of serially correlated contamination, is then processed with the SPRT technique described hereinbefore.

In a specific example application of the above referenced methodology, certain data variables were monitored from the Argonne National Laboratory (West) reactor EBR-II. In particular, EBR-II reactor coolant pumps (RGPs) and delayed neutron (DN) monitoring systems were tested continuously to demonstrate the power and utility of the invention. The RGP and DN systems were chosen for initial application of the approach because SPRT-based techniques have already been under development for both the systems. All data used in this investigation were recorded during full-power, steady state operation at EBR-fl. The data have been digitized at a 2-per-second sampling rate using $2^{14}$ (16,384) observations for each signal of interest.

Figure 1:
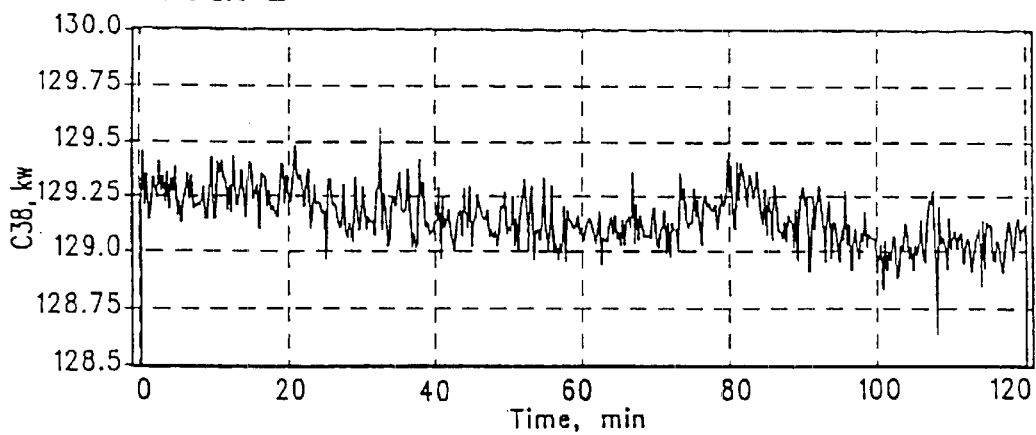
FIG. 1 is a prior art illustration of the specified output of a pump's power output over time.
Figure 2:
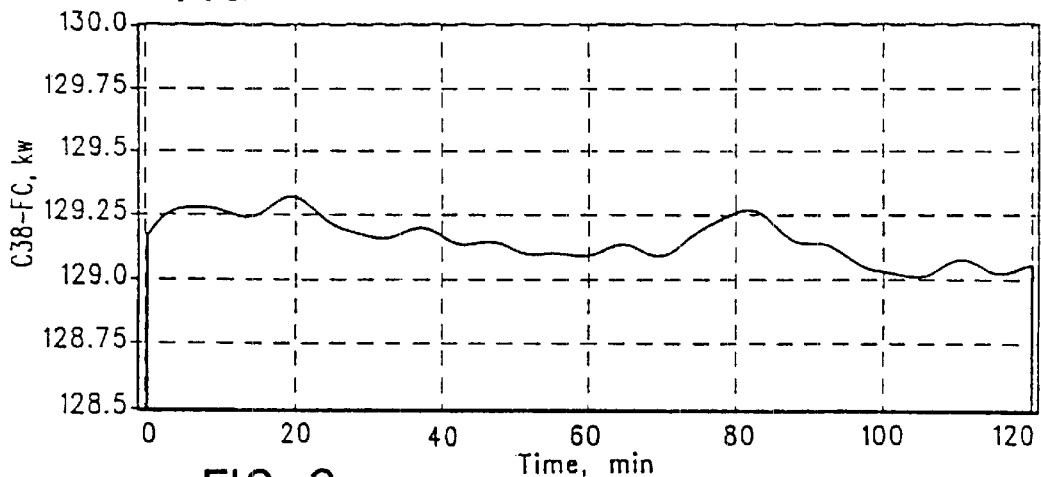
FIG. 2 shows a prior art illustration of a Fourier composite curve fit to the pump spectral output of FIG. 1.
Figure 3:
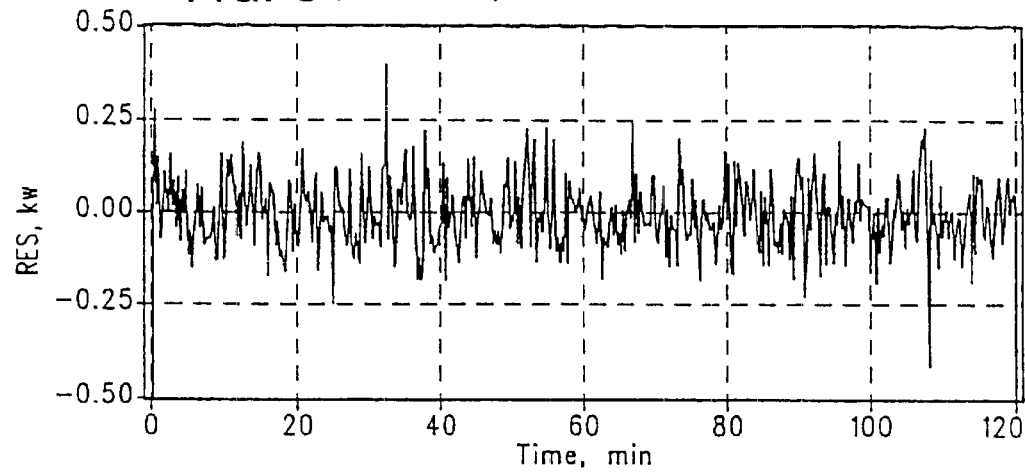
FIG. 3 illustrates a prior art illustration of a residual function characteristic of the difference between FIGS. 1 and 2.
Figure 4A:
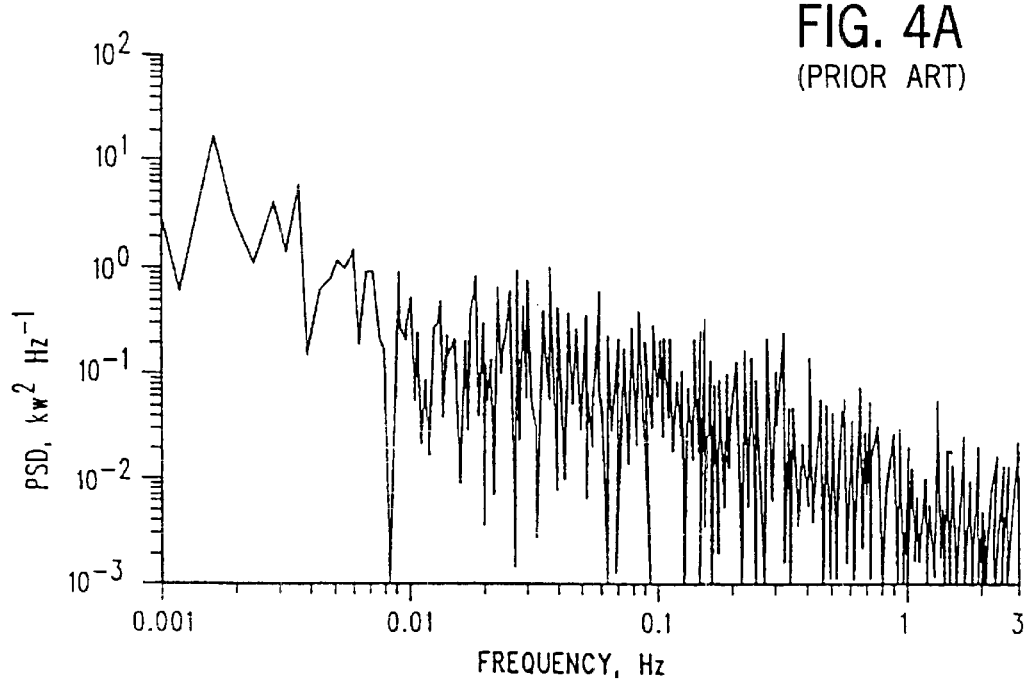
FIG. 4A shows a prior art illustration of a periodogram of the spectral data of FIG. 1
Figure 4B:
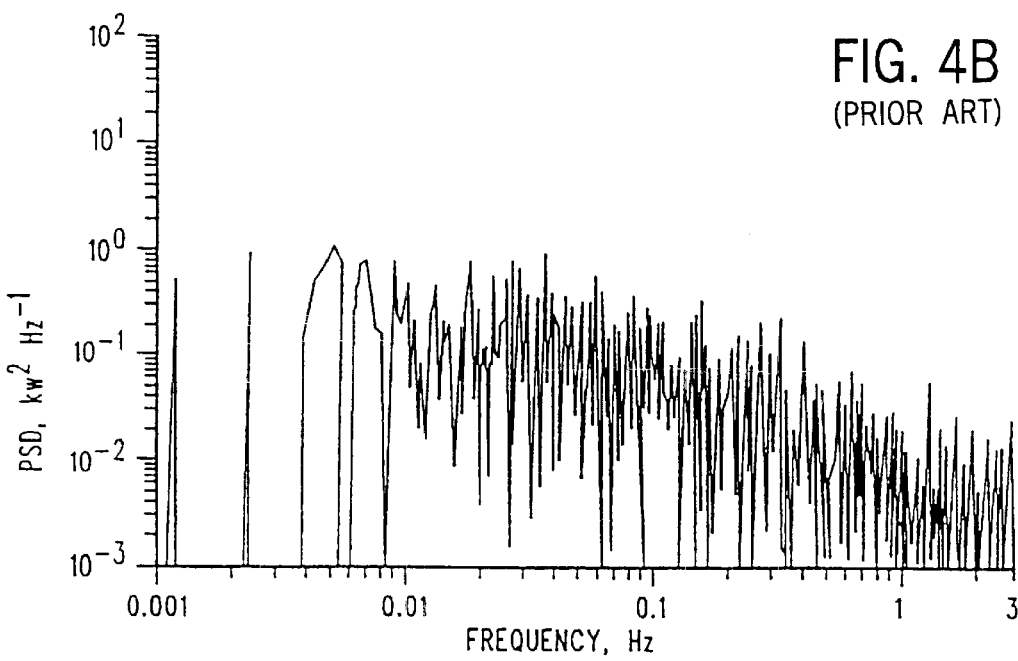
FIG. 4B shows a prior art illustration of a periodogram of the residual function of FIG. 3.
Figure 5A:
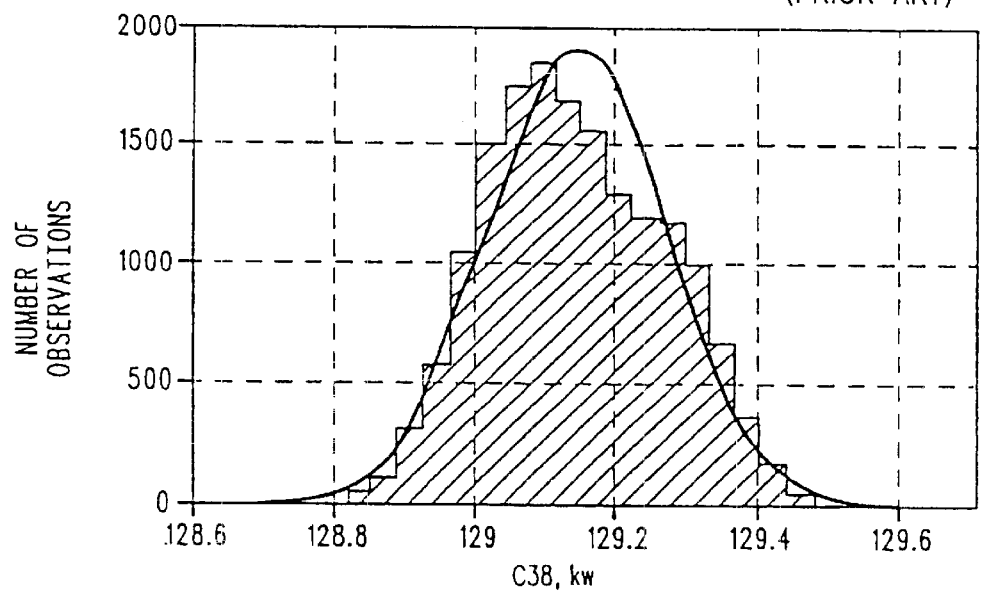
FIG. 5A illustrates a prior art illustration of a noise histogram for the pump power output of FIG. 1
Figure 5B:
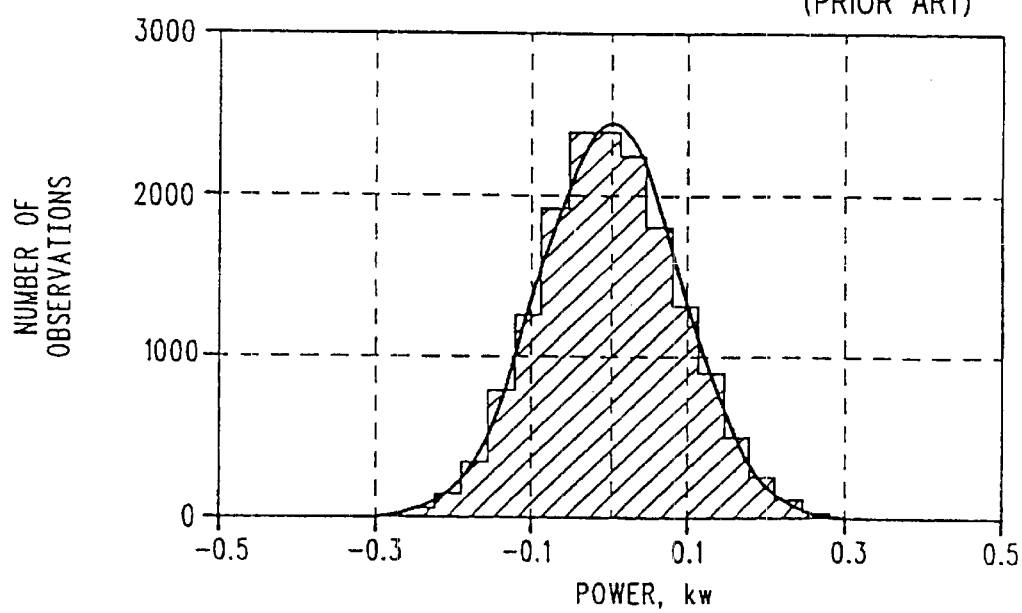
FIG. 5B illustrates a prior art illustration of a noise histogram for the residual function of FIG. 3.

FIGS. 1–3 illustrate data associated with the preferred spectral filtering approach as applied to the EBR-II primary pump power signal which measures the power (in kW) needed to operate the pump. The basic procedure of FIGS. 8A and 8B were then followed in the analysis. FIG. 1 shows 136 minutes of the original signal as it was digitized at the 2-Hz sampling rate. FIG. 2 shows a Fourier composite constructed from the eight most prominent harmonics identified in the original signal. The residual function, obtained by subtracting the Fourier composite curve from the raw data, is shown in FIG. 3. Periodograms of the raw signal and the residual function have been computed and are plotted in FIGS. 4A and 4B. Note the presence of eight depressions in the periodogram of the residual function in FIG. 4B, corresponding to the most prominent periodicities in the original, unfiltered data. Histograms computed from the raw signal and the residual function are plotted in FIGS. 5A and 5B. For each histogram shown we have superimposed a Gaussian curve (solid line) computed from a purely Gaussian distribution having the same mean and variance. Comparison of FIGS. 5A and 5B provide a clear demonstration of the effectiveness of the spectral filtering in reducing asymmetry in the histogram. Quantitatively, this decreased asymmetry is reflected in a decrease in the skewness (or third moment of the noise) from 0.15 (raw signal) to 0.10 (residual function).

It should be noted here that selective spectral filtering, which we have designed to reduce the consequences of serial correlation in our sequential testing scheme, does not require that the degree of normormality in the data will also be reduced. For many of the signals we have investigated at EBR-II, the reduction in serial correlation is, however, accompanied by a reduction in the absolute value of the skewness for the residual function.

To quantitatively evaluate the improvement in whiteness effected by the spectral filtering method, we employ the conventional Fisher Kappa white noise test. For each time series we compute the Fisher Kappa statistic from the defining equation $$\kappa = \left[\frac{1}{N}\sum_{k=1}^{N} 1(\omega_k)\right]^{-1} 1(L) \quad (15)$$

where $1(\omega_k)$ is the PSD function (see Eq. 14) at discrete frequencies $\omega_k$ and $1(L)$ signifies the largest PSD ordinate identified in the stationary time series. The Kappa statistic is the ratio of the largest PSD ordinate for the signal to the average ordinate for a PSD computed from a signal counted with pure white noise. For EBR-II the power signal for the pump used in the present example has a K of 1940 and 68.7 for the raw signal and the residual function, respectively. Thus, we can say that the spectral filtering procedure has reduced the degree of nonwhiteness in the signal by a factor of 28. Strictly speaking, the residual function is still not a pure white noise process. The 95% critical value for Kappa for a time series with $2^{14}$ observations is 12.6. This means that only for computed Kappa statistics lower than 12.6 could we accept the null hypothesis that the signal is contaminated by pure white noise. The fact that our residual function is not purely white is reasonable on a physical basis because the complex interplay of mechanisms that influence the stochastic components of a physical process would not be expected to have a purely white correlation structure. The important point, however, is that the reduction in nonwhiteness effected by the spectral filtering procedure using only the highest eight harmonics in the raw signal has been found to preserve the pre-specified false alarm and missed alarm probabilities in the SPRT sequential testing procedure (see below).

Table I summarizes the computed Fisher Kappa statistics for thirteen EBR-II plant signals that are used in the subject surveillance systems. In every case the table shows a substantial improvement in signal whiteness.

The complete SPRT technique integrates the spectral decomposition and filtering process steps described hereinbefore with the known SPRT binary hypothesis procedure. The process can be illustratively demonstrated by application of the SPRT technique to two redundant delayed neutron detectors (designated DND-A and DND B) whose signals were archived during long-term normal (i.e., undegraded) operation with a steady DN source in EBR-II. For demonstration purposes a SPRT was designed with a false alarm rate, $\alpha$, of 0.01. Although this value is higher than we would designate for a production surveillance system, it gives a reasonable frequency of false alarms so that asymptotic values of a can be obtained with only tens of thousands of discrete observations. According to the theory of the SPRT technique, it can be easily proved that for pure white noise (such as Gaussian), independently distributed processes, a provides an upper bound to the probability (per observation interval) of obtaining a false alarm—i.e., obtaining a "data disturbance" annunciation when, in fact, the signals under surveillance are undegraded.

FIGS. 6A–D and 7A–D illustrate sequences of SPRT results for raw DND signals and for spectrally whitened DND signals, respectively. In FIGS. 6A and 6B, and 7A and 7B, respectively, are shown the DN signals from detectors DND-A and DND-B. The steady-state values of the signals have been normalized to zero.

TABLE I

Effectiveness of Spectral Filtering for Measured Plant Signals
Fisher Kappa Test Satitistic (N = 16,384)

| Plant Variable I.D. | Raw Signal | Residual Function |
| --- | --- | --- |
| Pump 1 Power | 1940 | 68.7 |
| Pump 2 Power | 366 | 52.2 |
| Pump 1 Speed | 181 | 25.6 |
| Pump 2 Speed | 299 | 30.9 |
| Pump 1 Radial Vibr (top) | 123 | 67.7 |
| Pump 2 Radial Vibr (top) | 155 | 65.4 |
| Pump 1 Radial Vibr (bottom) | 1520 | 290.0 |
| Pump 2 Radial Vibr (bottom) | 1694 | 80.1 |
| DN Monitor A | 96 | 39.4 |
| DN Monitor B | 81 | 44.9 |
| DN Detector 1 | 86 | 36.0 |
| DN Detector 2 | 149 | 44.1 |
| DN Detector 3 | 13 | 8.2 |

Figure 6A:
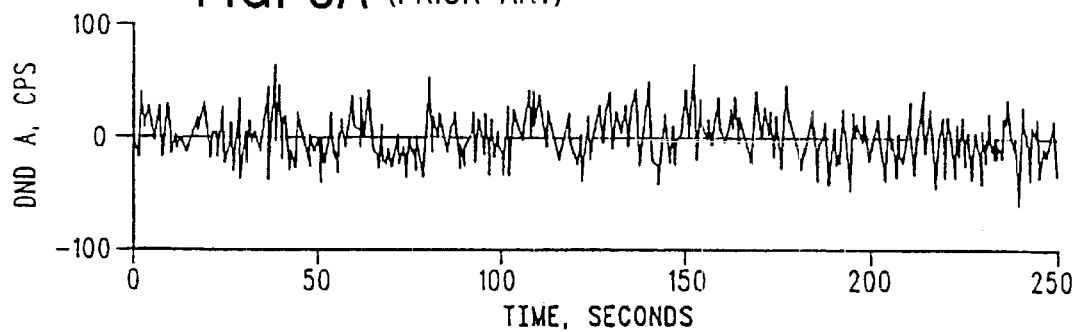
FIG. 6A shows a prior art illustration of an unmodified delayed neutron detector signal from a first sensor and FIG. 6B is a prior art illustration of for a second neutron sensor.
Figure 6B:
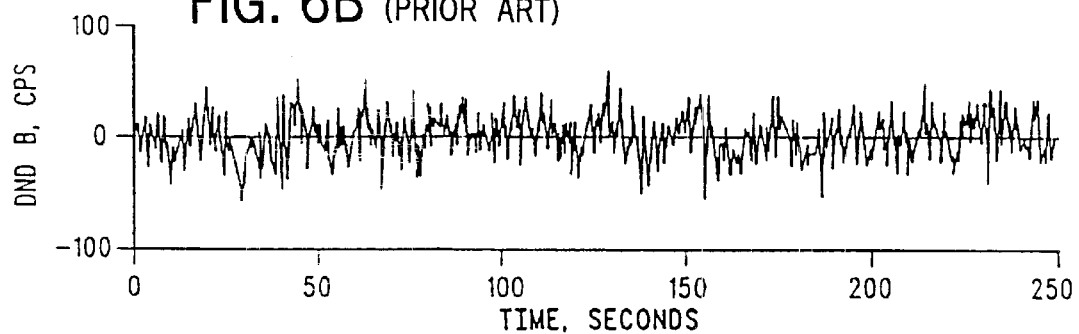
Figure 6C:
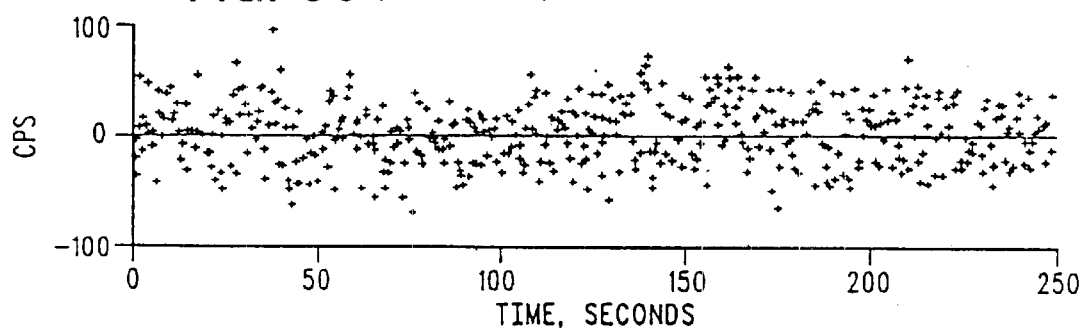
FIG. 6C shows a prior art illustration of a difference function characteristic of the difference between data in FIGS. 6A and 6B and FIG. 6D shows the data output from SPRT analysis with alarm conditions indicated by the diamond symbols.

Normalization to adjust for differences in calibration factor or viewing geometry for redundant sensors does not affect the operability of the SPRT. FIGS. 6C and 7C in each figure show pointwise differences of signals DND-A and DND-B. It is this difference function that is input to the SPRT technique. Output from the SPRT method is shown for a 250-second segment in FIGS. 6D and 7D.

Figure 6D:
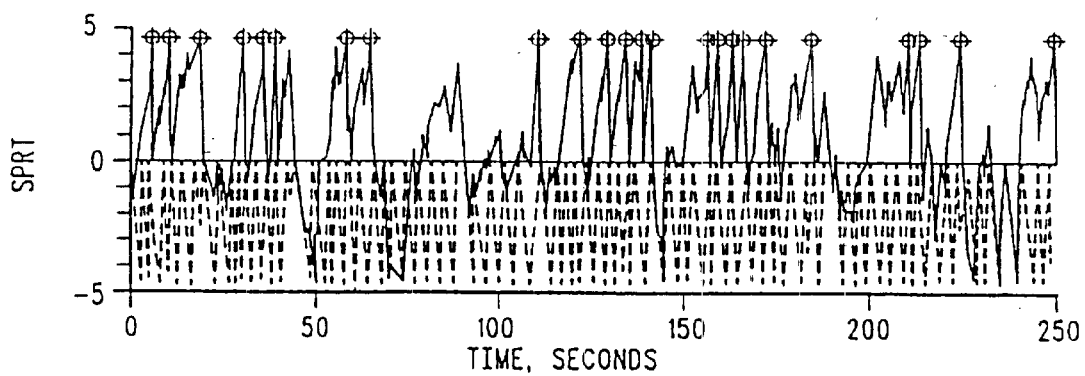
Figure 7A:
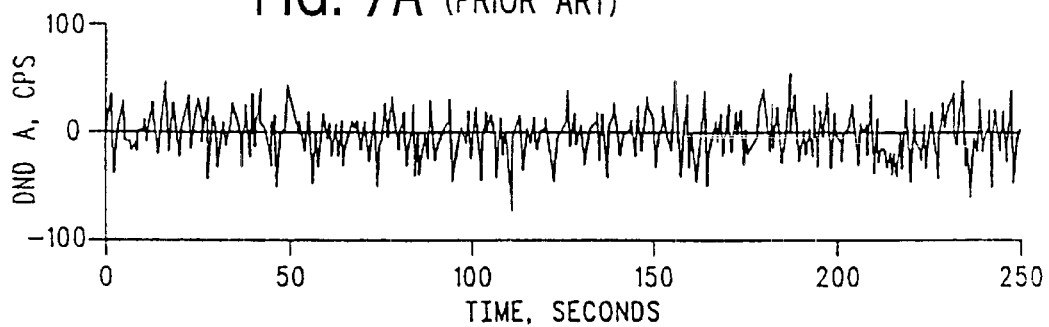
FIG. 7A illustrates a prior art illustration of a unmodified delayed neutron detector signal from a first sensor and FIG. 7B is a prior art illustration for a second neutron sensor.
Figure 7B:
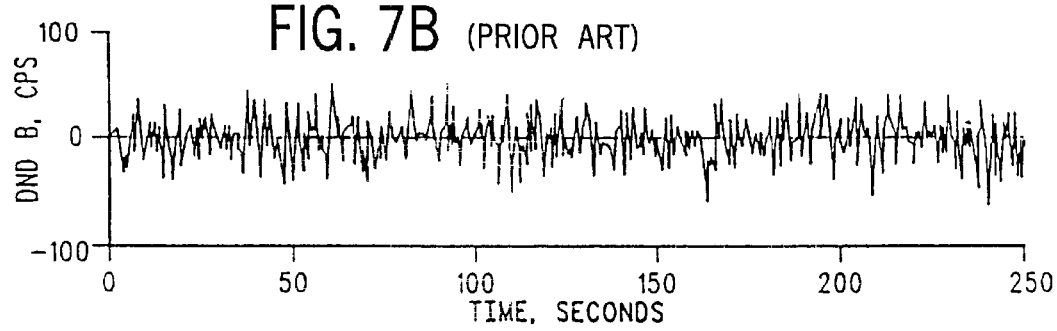
Figure 7C:
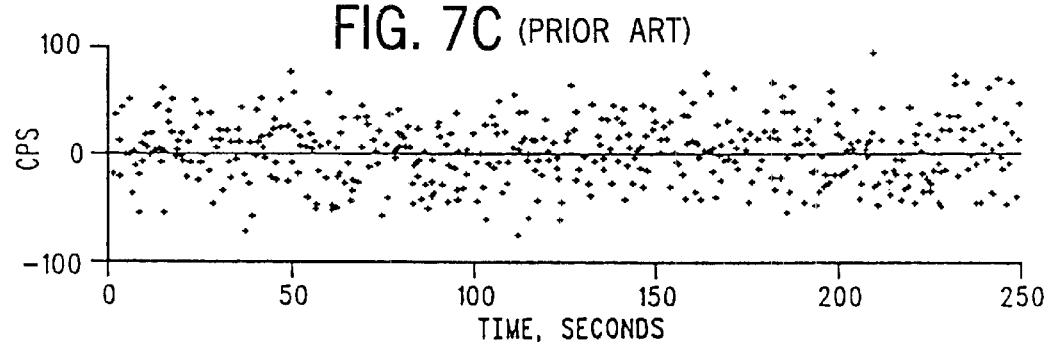
FIG. 7C shows a prior art illustration of a difference function for the difference between the data of FIGS. 7A and 7B and FIG. 7D shows the result of modifying the difference function to provide data free of serially correlated noise to the SPRT analysis to generate alarm information and with alarm conditions indicated by the diamond signals.
Figure 7D:
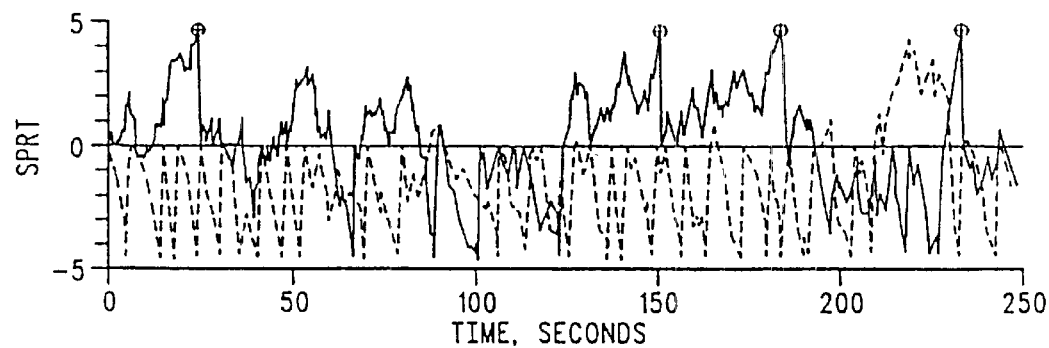

Interpretation of the SPRT output in FIGS. 6D and 7D is as follows: When the SPRT index reaches a lower threshold, A, one can conclude with a 99% confidence factor that there is no degradation in the sensors. For this demonstration A is equal to 4.60, which corresponds to false-alarm and missed-alarm probabilities of 0.01. As FIGS. 6D and 7D illustrate, each time the SPRT output data reaches A, it is reset to zero and the surveillance continues.

If the SPRT index drifts in the positive direction and exceeds a positive threshold, B, of +4.60, then it can be concluded with a 99% confidence factor that there is degradation in at least one of the sensors. Any triggers of the positive threshold are signified with diamond symbols in FIGS. 6D and 7D. In this case, since we can certify that the detectors were functioning properly during the time period our signals were being archived, any triggers of the positive threshold are false alarms.

If we extend sufficiently the surveillance experiment illustrated in FIG. 6D, we can get an asymptotic estimate of the false alarm probability a. We have performed this exercise using 1000-observation windows, tracking the frequency of false alarm trips in each window, then repeating the procedure for a total of sixteen independent windows to get an estimate of the variance on this procedure for evaluating a. The resulting false-alarm frequency for the raw, unfiltered, signals is $\alpha=0.07330$ with a variance of 0.000075. The very small variance shows that there would be only a negligible improvement in our estimate by extending the experiment to longer data streams. This value of a is significantly higher than the design value of $\alpha=0.01$, and illustrates the danger of blindly applying a SPRT test technique to signals that may be contaminated by excessive serial correlation.

The data output shown in FIG. 7D employs the complete SPRT technique shown schematically in FIGS. 8A and 8B. When we repeat the foregoing exercise using 16 independent 1000-observation windows, we obtain an asymptotic cumulative false-alarm frequency of 0.009142 with a variance of 0.000036. This is less than (i.e., more conservative than) the design value of $\alpha=0.01$, as desired.

It will be recalled from the description hereinbefore regarding one preferred approach, we have used the eight most prominent harmonics in the spectral filtration stage of the SPRT technique. By repeating the foregoing empirical procedure for evaluating the asymptotic values of a, we have found that eight modes are sufficient for the input variables shown in Table I. Furthermore, by simulating subtle degradation in individual signals, we have found that the presence of serial correlation in raw signals gives rise to excessive missed-alarm probabilities as well. In this case spectral whitening is equally effective in ensuring that pre-specified missed-alarm probabilities are not exceeded using the SPRT technique.

Fourier techniques in general are very effective in achieving a whitened signal for analysis, but there are other means to achieve substantially the same results using a different analytical methodology. For example, filtration of serial correlation can be accomplished by using the autoregressive moving average (ARMA) method. This ARMA technique estimates the specific correlation structure existing between sensor points of an industrial process and utilizes this correlation estimate to effectively filter the data sample being evaluated.

A technique has therefore been devised to produce reliable databases free from false alarm information which integrates frequency-domain filtering with sequential testing methodology. This method provides a solution to a problem that is endemic to industrial signal evaluation surveillance. For example, it is not uncommon for sensors to become degraded during service, and faulty signals will be generated. Such faulty signals can give rise to false alarms and result in accumulation of a faulted database intended for use in the future as a reliable source of information. The subject invention particularly allows identification of valid or corrupted data and consequent use of reliable database information in analyzing industrial systems. For example, this invention would be particularly useful in meteorological systems, aeronautical design systems, automotive simulation systems or any system wherein experimental data can be used for modeling or design projects. Further, one can evaluate ongoing slow degradation that evolves over a long time period (gradual decalibration bias in a sensor, appearance of a new radiation source in the presence of a noisy background signal, wear out or buildup of a radial rub in rotating machinery, etc.). The system thus can alert a researcher or operator of the incipience or onset of a disturbance long before it would be apparent to visual inspection of strip chart or CRT signal traces, and well before conventional threshold limit checks would be tripped. This permits the researcher to either have a reliable database for research use or to actively use the database to terminate, modify or avoid events that might otherwise lie outside technical specification guidelines or availability goals. Thus, in many cases a user of such a database can anticipate or schedule corrective actions (sensor replacement or recalibration, component adjustment alignment or rebalancing, etc.) to be performed during a scheduled system outage.

Another important feature of the technique is the built-in quantitative false alarm and missed-alarm probabilities. This is quite important in the context of high-risk industrial processes and applications. This makes it possible to apply formal reliability analysis methods to an overall system comprising, a network of interacting SPRT modules that are simultaneously monitoring a variety of plant variables. This amenability to formal reliability analysis methodology will, for example, greatly enhance the process of granting approval for nuclear-plant applications of the method, a system that can potentially save a utility millions of dollars per year per reactor.

While preferred embodiments of the invention have been shown and described, it will be clear to those skilled in the art that various changes and modifications can be made without departing from the invention in its broader aspects as set forth in the claims provided hereinafter.

What is claimed:

1. A method of testing at least one of a process and/or a data set and/or a data source for determining a particular condition thereof, comprising the steps of:

collecting data from at least a first source of data and a second source of data to redundantly detect at least one variable of the process and/or the data set and/or the data source to provide a first signal from said at least first source of data and a second signal from said at least a second source of data, each of said first and second signals being characteristic of the at least one variable;

providing frequency domain transformation data for each of said first and second signals at a given time;

obtaining a frequency domain difference function characteristic of the difference pairwise for the given time between said frequency domain transformed first signal data and said frequency domain transformed second signal data;

operating on the frequency domain difference function using computer means for applying a statistical analysis technique to determine a combined statistical frequency spectrum data set for at least one of the process and/or the data source and/or the data set;

repeating for a new incremental time the steps of providing frequency domain transformation data, obtaining a frequency domain difference function and operating on the frequency domain difference function by applying the statistical analysis technique until generation of a three-dimensional surface characteristic of a combined frequency and time domain function for a particular condition of the process and/or the data set and/or the data source; and correlating the characteristic three dimensional surface with previously stored reference state information indicative of a particular alarm state.

2. The method as defined in claim 1 wherein said statistical analysis technique comprises a pattern recognition methodology.

3. The method as defined in claim 1 wherein said statistical analysis technique comprises a sequential probability ratio test technique.

4. The method as defined in claim 1 wherein the process comprises one or more of a chemical process, a mechanical process, an electrical operational process, a biological process, a manufacturing process and a financial process.

5. The method as defined in claim 4 further including the step of generating an output alarm upon detecting the particular alarm state upon deviating from a desired condition of the process.

6. The method as defined in claims 5 wherein the step of collecting data from said first source of data is comprised of detecting light spectra having interacted with a product being manufactured and rejecting the product upon detecting the particular alarm state.

7. The method as defined in claim 1 further including at least one of the steps of modifying the process and modifying the data source and modifying the data set responsive to sensing the particular alarm state.

8. The method as defined in claim 7 wherein the step of modifying the process comprises at least one of ceasing operation of the process, and modifying the data source and modifying the data set.

9. A method for testing a process and/or a data set of a system for determining the condition thereof, comprising:

collecting a first signal from at least a first source of data over a monitoring time period from at least one variable of the process and/or the data set;

collecting a second signal from at least a second source of data from the process and/or the data set over the monitoring time period for comparison with said first signal from said at least first source of data;

providing a parametric transformation at a given time for said signals from said at least a first source of data and said at least a second source of data to generate transformed signals for each said first source of data and said at least a second source of data;

obtaining a difference function characteristic of the difference pairwise at the given time between said parametric transformed signals from said at least a first source of data and said at least a second source of data for the given time in the monitoring time period;

continuing said parametric transformation for a time increment for a next time in the monitoring time period to provide a three-dimensional surface of data over time and parametric space; and applying a pattern recognition methodology to determine a three-dimensional spectrum data set characteristic of an operating condition of the at least a first data source and at least a second data source.

10. The method as defined in claim 9 wherein said parametric transformation comprises a frequency domain transformation.

11. The method as defined in claim 9 wherein said first signal is derived from said process and/or said data set and said second signal is derived from a characteristic model system.

12. A method for testing a process and/or a data set of a system for determining the condition thereof, comprising:

providing a first signal data from a first source of data over a monitoring time period from at least one variable of the process and/or the data set;

providing a second signal data from a second source of data from the process and/or the data set over the monitoring time period for comparison with said first signal data from said first source of data;

providing a frequency domain transformation at a given time for said signal data from said first source of data and said second source of data;

obtaining a frequency domain difference function characteristic of the difference pairwise at the given time between said frequency domain transformed signals from said first source of data and said second source of data for the given time in the monitoring time period;

continuing said frequency domain transformation for a time increment for a next time in the monitoring time period to provide a three-dimensional surface of power spectrum data over time and frequency space; and applying a pattern recognition methodology to determine a three-dimensional spectrum data set characteristic of an operating condition of the first data source and the second data source.

* * * * *